United States Patent
Koyama et al.

(10) Patent No.: US 8,373,443 B2
(45) Date of Patent: *Feb. 12, 2013

(54) LOGIC CIRCUIT

(75) Inventors: Jun Koyama, Sagamihara (JP); Kengo Akimoto, Atsugi (JP); Masashi Tsubuku, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/116,372

(22) Filed: May 26, 2011

(65) Prior Publication Data

US 2011/0221475 A1 Sep. 15, 2011

Related U.S. Application Data

(63) Continuation of application No. 12/605,607, filed on Oct. 26, 2009, now Pat. No. 7,952,392.

(30) Foreign Application Priority Data

Oct. 31, 2008 (JP) .................. 2008-281647

(51) Int. Cl.
 *H03K 19/20* (2006.01)
 *H03K 19/094* (2006.01)
(52) U.S. Cl. ........ 326/120; 326/121; 326/117; 326/103; 257/268; 257/348; 257/369
(58) Field of Classification Search .................. 257/268, 257/348

See application file for complete search history.

(56) References Cited

U.S. PATENT DOCUMENTS

| 4,615,102 A | 10/1986 | Suzuki et al. |
| 5,731,856 A | 3/1998 | Kim et al. |
| 5,744,823 A | 4/1998 | Harkin et al. |
| 5,744,864 A | 4/1998 | Cillessen et al. |
| 5,847,410 A | 12/1998 | Nakajima |
| 6,294,274 B1 | 9/2001 | Kawazoe et al. |
| 6,563,174 B2 | 5/2003 | Kawasaki et al. |
| 6,586,346 B1 | 7/2003 | Yamazaki et al. |

(Continued)

FOREIGN PATENT DOCUMENTS

| EP | 1 737 044 A | 12/2006 |
| EP | 2 226 847 A | 9/2010 |

(Continued)

OTHER PUBLICATIONS

Dembo et al., "RFCPUS on Glass and Plastic Substrates Fabricated by TFT Transfer Technology," IEDM 05: Technical Digest of International Electron Devices Meeting, Dec. 5, 2005, pp. 1067-1069.

(Continued)

*Primary Examiner* — Shawki Ismail
*Assistant Examiner* — Jany Tran
(74) *Attorney, Agent, or Firm* — Eric J. Robinson; Robinson Intellectual Property Law Office, P.C.

(57) ABSTRACT

An object is to apply a transistor using an oxide semiconductor to a logic circuit including an enhancement transistor. The logic circuit includes a depletion transistor 101 and an enhancement transistor 102. The transistors 101 and 102 each include a gate electrode, a gate insulating layer, a first oxide semiconductor layer, a second oxide semiconductor layer, a source electrode, and a drain electrode. The transistor 102 includes a reduction prevention layer provided over a region in the first oxide semiconductor layer between the source electrode and the drain electrode.

36 Claims, 33 Drawing Sheets

U.S. PATENT DOCUMENTS

| | | | |
|---|---|---|---|
| 6,727,522 B1 | 4/2004 | Kawasaki et al. | |
| 6,788,567 B2 * | 9/2004 | Fujimori | 365/154 |
| 6,960,812 B2 | 11/2005 | Yamazaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,067,843 B2 | 6/2006 | Carcia et al. | |
| 7,105,868 B2 | 9/2006 | Nause et al. | |
| 7,145,174 B2 | 12/2006 | Chiang et al. | |
| 7,211,825 B2 | 5/2007 | Shih et al | |
| 7,262,463 B2 | 8/2007 | Hoffman | |
| 7,282,782 B2 | 10/2007 | Hoffman et al. | |
| 7,297,977 B2 | 11/2007 | Hoffman et al. | |
| 7,298,084 B2 | 11/2007 | Baude et al. | |
| 7,301,211 B2 | 11/2007 | Yamazaki et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,470,607 B2 | 12/2008 | Carcia et al. | |
| 7,501,293 B2 | 3/2009 | Ito et al. | |
| 7,507,618 B2 | 3/2009 | Dunbar | |
| 7,544,967 B2 | 6/2009 | Kim et al. | |
| 7,566,904 B2 | 7/2009 | Ishii | |
| 7,575,966 B2 | 8/2009 | Lai et al. | |
| 7,576,394 B2 | 8/2009 | Furuta et al. | |
| 7,601,984 B2 | 10/2009 | Sano et al. | |
| 7,608,531 B2 | 10/2009 | Isa et al. | |
| 7,622,371 B2 | 11/2009 | Pan et al. | |
| 7,635,889 B2 | 12/2009 | Isa et al. | |
| 7,645,478 B2 | 1/2010 | Thelss et al. | |
| 7,663,302 B2 | 2/2010 | Shin et al. | |
| 7,674,650 B2 | 3/2010 | Akimoto et al. | |
| 7,687,807 B2 | 3/2010 | Koo | |
| 7,691,666 B2 | 4/2010 | Levy et al. | |
| 7,732,251 B2 | 6/2010 | Hoffman et al. | |
| 7,732,819 B2 | 6/2010 | Akimoto et al. | |
| 7,733,015 B2 | 6/2010 | Saito | |
| 7,767,106 B2 | 8/2010 | Chang | |
| 7,772,021 B2 | 8/2010 | Lee et al. | |
| 7,791,072 B2 | 9/2010 | Kumomi et al. | |
| 7,791,082 B2 | 9/2010 | Iwasaki | |
| 7,795,613 B2 | 9/2010 | Ito et al. | |
| 7,829,444 B2 | 11/2010 | Yabuta et al. | |
| 7,863,611 B2 | 1/2011 | Abe et al. | |
| 7,867,636 B2 | 1/2011 | Nakagawara et al. | |
| 7,868,326 B2 | 1/2011 | Sano et al. | |
| 7,872,259 B2 | 1/2011 | Den et al. | |
| 7,884,360 B2 | 2/2011 | Takechi et al. | |
| 7,923,722 B2 | 4/2011 | Ryu et al. | |
| 7,932,521 B2 | 4/2011 | Akimoto et al. | |
| 7,935,641 B2 | 5/2011 | Kim et al. | |
| 7,939,822 B2 | 5/2011 | Maekawa et al. | |
| 8,067,775 B2 | 11/2011 | Miyairi et al. | |
| 8,106,400 B2 * | 1/2012 | Miyairi et al. | 257/72 |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager et al. | |
| 2006/0197092 A1 | 9/2006 | Hoffman et al. | |
| 2006/0208977 A1 | 9/2006 | Kimura | |
| 2006/0238135 A1 | 10/2006 | Kimura | |
| 2006/0244107 A1 | 11/2006 | Sugihara et al. | |
| 2007/0052025 A1 | 3/2007 | Yabuta | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0106191 A1 | 5/2008 | Kawase | |
| 2008/0129195 A1 | 6/2008 | Ishizaki et al. | |
| 2008/0182358 A1 | 7/2008 | Cowdery-Corvan et al. | |
| 2008/0203387 A1 | 8/2008 | Kang et al. | |
| 2008/0224133 A1 | 9/2008 | Park et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0308796 A1 | 12/2008 | Akimoto et al. | |
| 2008/0308805 A1 | 12/2008 | Akimoto et al. | |
| 2008/0308806 A1 | 12/2008 | Akimoto et al. | |
| 2009/0008639 A1 | 1/2009 | Akimoto et al. | |
| 2009/0065771 A1 | 3/2009 | Iwasaki et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0278122 A1 | 11/2009 | Hosono et al. | |
| 2009/0280600 A1 | 11/2009 | Hosono et al. | |
| 2010/0025678 A1 | 2/2010 | Yamazaki et al. | |
| 2010/0065844 A1 | 3/2010 | Tokunaga | |
| 2010/0085081 A1 * | 4/2010 | Ofuji et al. | 326/102 |
| 2010/0092800 A1 | 4/2010 | Itagaki et al. | |
| 2010/0109002 A1 | 5/2010 | Itagaki et al. | |

FOREIGN PATENT DOCUMENTS

| | | |
|---|---|---|
| JP | 60-198861 | 10/1985 |
| JP | 63-210022 | 8/1988 |
| JP | 63-210023 | 8/1988 |
| JP | 63-210024 | 8/1988 |
| JP | 63-215519 | 9/1988 |
| JP | 63-239117 A | 10/1988 |
| JP | 63-265818 A | 11/1988 |
| JP | 03-231472 A | 10/1991 |
| JP | 05-251705 A | 9/1993 |
| JP | 08-264794 | 10/1996 |
| JP | 08-264794 A | 10/1996 |
| JP | 11-505377 | 5/1999 |
| JP | 2000-044236 | 2/2000 |
| JP | 2000-150900 A | 5/2000 |
| JP | 2002-076356 | 3/2002 |
| JP | 2002-289859 | 10/2002 |
| JP | 2003-086000 | 3/2003 |
| JP | 2003-086000 A | 3/2003 |
| JP | 2003-086808 A | 3/2003 |
| JP | 2004-103957 A | 4/2004 |
| JP | 2004-273614 | 9/2004 |
| JP | 2004-273732 | 9/2004 |
| JP | 2005-051228 | 2/2005 |
| JP | 2007-096055 | 4/2007 |
| JP | 2007-123861 | 5/2007 |
| JP | 2007-250983 A | 9/2007 |
| JP | 2008-218495 | 9/2008 |
| JP | 2009-004733 | 1/2009 |
| WO | WO 2004/114391 | 12/2004 |
| WO | WO 2007/119386 | 10/2007 |
| WO | WO 2008/105250 | 9/2008 |
| WO | WO 2008/143304 | 11/2008 |

OTHER PUBLICATIONS

Ikeda et al., "Full-Functional System Liquid Crystal Display Using CG-Silicon Technology," SID Digest '04: SID International Symposium Digest of Technical Papers, 2004, vol. 35, pp. 860-863.

Nomura et al., "Room-Temperature Fabrication of Transparent Flexible Thin-Film Transistors Using Amorphous Oxide Semiconductors," Nature, Nov. 25, 2004, vol. 432, pp. 488-492.

Takahashi et al., "Theoretical Analysis of IGZO Transparent Amorphous Oxide Semiconductor," IDW '08: Proceedings of the 15th International Display Workshops, Dec. 3, 2008, pp. 1637-1640.

Prins et al., "A Ferroelectric Transparent Thin-Film Transistor," Appl. Phys. Lett. (Applied Physics Letters), Jun. 17, 1996, vol. 68, No. 25, pp. 3650-3652.

Nakamura et al., "The Phase Relations in the $In_2O_3$-$Ga_2ZnO_4$-ZnO System at 1350° C," Journal of Solid State Chemistry, Aug. 1, 1991, vol. 93, No. 2, pp. 298-315.

Kimizuka et al., "Syntheses and Single-Crystal Data of Homologous Compounds, $In_2O_3(ZnO)m$ (m=3, 4, and 5), $InGaO_3(ZnO)_3$, and Ga$_2$O$_3$(ZnO)$m$ ($m$ =7, 8, 9, and 16) in the In$_2$O$_3$-ZnGa$_2$O$_4$-ZnO System," Journal of Solid State Chemistry, Apr. 1, 1995, vol. 116, No. 1, pp. 170-178.

Nomura et al., "Thin-Film Transistor Fabricated in Single-Crystalline Transparent Oxide Semiconductor," Science, May 23, 2003, vol. 300, No. 5623, pp. 1269-1272.

Osada et al., "15.2: Development of Driver-Integrated Panel using Amorphous In-Ga-Zn-Oxide TFT," SID Digest '09: SID International Symposium Digest of Technical Papers, May 31, 2009, pp. 184-187.

Li et al., "Modulated Structures of Homologous Compounds $InMO_3(ZnO)_m$ (M=In,Ga; m=Integer) Described by Four-Dimensional Superspace Group," Journal of Solid State Chemistry, 1998, vol. 139, pp. 347-355.

Lee et al., "World's Largest (15-inch) XGA AMLCD Panel Using IGZO Oxide TFT," SID Digest '08: SID International Symposium Digest of Technical Papers, May 20, 2008, vol. 39, pp. 625-628.

Nowatari et al., "60.2: Intermediate Connector with Suppressed Voltage Loss for White Tandem OLEDs," SID Digest '09: SID International Symposium Digest of Technical Papers, May 31, 2009, vol. 40, pp. 899-902.

Kanno et al., "White Stacked Electrophosphorecent Organic Light-Emitting Devices Employing MoO$_3$ as a Charge-Generation Layer," Adv. Mater. (Advanced Materials), 2006, vol. 18, No. 3, pp. 339-342.

Tsuda et al., "Ultra Low Power Consumption Technologies for Mobile TFT-LCDs," IDW '02: Proceedings of the 9$^{th}$ International Display Workshops, Dec. 4, 2002, pp. 295-298.

Jeong et al., "3.1: Distinguished Paper: 12.1-Inch WXGA AMOLED Display Driven by Indium-Gallium-Zinc Oxide TFTs Array," SID Digest '08: SID International Symposium Digest of Technical Papers, May 20, 2008, vol. 39, No. 1, pp. 1-4.

Kurokawa et al., "UHF RFCPUS on Flexible and Glass Substrates for Secure RFID Systems," Journal of Solid-State Circuits, 2008, vol. 43, No. 1, pp. 292-299.

Ohara et al., "Amorphous In-Ga-Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Coates et al., "Optical Studies of the Amorphous Liquid-Cholesteric Liquid Crystal Transition: the "Blue Phase"," Physics Letters, Sep. 10, 1973, vol. 45A, No. 2, pp. 115-116.

Cho et al., "21.2: Al and Sn-Doped Zinc Indium Oxide Thin Film Transistors for AMOLED Back-Plane," SID Digest '09: SID International Symposium Digest of Technical Papers, May 31, 2009, pp. 280-283.

Lee et al., "15.4: Excellent Performance of Indium-Oxide-Based Thin-Film Transistors by DC Sputtering," SID Digest '09: SID International Symposium Digest of Technical Papers, May 31, 2009, pp. 191-193.

Jin et al., "65.2: Distinguished Paper: World-Largest (6.5") Flexible Full Color Top Emission AMOLED Display on Plastic Film and Its Bending Properties," SID Digest '09: SID International Symposium Digest of Technical Papers, May 31, 2009, pp. 983-985.

Sakata et al., "Development of 4.0-In. AMOLED Display With Driver Circuit Using Amorphous In-Ga-Zn-Oxide TFTS," IDW '09: Proceedings of the 16$^{th}$ International Display Workshops, 2009, pp. 689-692.

Park et al., "Amorphous Indium-Gallium-Zinc Oxide TFTS and Their Application for Large Size AMOLED," AM-FPD '08 Digest of Technical Papers, Jul. 2, 2008, pp. 275-278.

Park et al., "Challenge to Future Displays: Transparent AM-OLED Driven by PEALD Grown ZnO TFT," IMID '07 Digest, 2007, pp. 1249-1252.

Godo et al., "Temperature Dependence of Characteristics and Electronic Structure for Amorphous In-Ga-Zn-Oxide TFT," AM-FPD '09 Digest of Technical Papers, Jul. 1, 2009, pp. 41-44.

Osada et al., "Development of Driver-Integrated Panel using Amorphous In-Ga- Zn-Oxide TFT," AM-FPD '09 Digest of Technical Papers, Jul. 1, 2009, pp. 33-36.

Hirao et al., "Novel Top-Gate Zinc Oxide thin-Film Transistors (ZnO TFTs) for AMLCDS," Journal of the SID, 2007, vol. 15, No. 1, pp. 17-22.

Hosono, "68.3: Invited Paper: Transparent Amorphous Oxide Semiconductors for High Performance TFT," SID Digest '07: SID International Symposium Digest of Technical Papers, 2007, vol. 38, pp. 1830-1833.

Godo et al., "P-9: Numerical Analysis on Temperature Dependence of Characteristics of Amorphous In-Ga-Zn-Oxide TFT," SID Digest '09: SID International Symposium Digest of Technical Papers, May 31, 2009, pp. 1110-1112.

Ohara et al., "21.3: 4.0 In. QVGA AMOLED Display Using In-Ga-Zn-Oxide TFTS with a Novel Passivation Layer," SID Digest '09: SID International Symposium Digest of Technical Papers, May 31, 2009, pp. 284-287.

Miyasaka, "58.2 Invited Paper: SUFTLA Flexible Microelectronics on Their Way to Business," SID Digest '07: SID International Symposium Digest of Technical Papers, 2007, vol. 38, pp. 1673-1676.

Chern et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Kikuchi et al., "39.1: Invited Paper: Optically Isotropic Nano-Structured Liquid Crystal Composites for Display Applications" SID Digest '09: SID International Symposium Digest of Technical Papers, May 31, 2009, pp. 578-581.

Asaoka et al., "29.1: Polarizer-Free Reflective LCD Combined With Ultra Low-Power Driving Technology," SID Digest '09: SID International Symposium Digest of Technical Papers, 2009, pp. 395-398.

Lee et at, "Current Status of, Challenges to, and Perspective View of AM-OLED," IDW '06: Proceedings of the 13$^{th}$ International Display Workshops, Dec. 7, 2006, pp. 663-666.

Kikuchi et al., "62.2: Invited Paper: Fast Electro-Optical Switching in Polymer-Stabilized Liquid Crystalline Blue Phases for Display Application," SID Digest '07: SID International Symposium Digest of Technical Papers, 2007, vol. 38, pp. 1737-1740.

Kikuchi et al., "Polymer-Stabilized Liquid Crystal Blue Phases," Nature Materials, Sep. 2, 2002, vol. 1, pp. 64-68.

Kimizuka et al., "Spinel, YbFe$_2$O$_4$, and Yb$_2$Fe$_3$O$_7$ Types of Structures for Compounds in the In$_2$O$_3$ and Sc$_2$O$_3$-A$_2$O$_3$-BO Systems [A: Fe, Ga, or Al; B: Mg, Mn, Fe, Ni, Cu, or Zn] at Temperatures Over 1000° C" Journal of Solid State Chemistry, 1985, vol. 60, pp. 382-384.

Kitzerow et al., "Observation of Blue Phases in Chiral Networks," Liquid Crystals, 1993, vol. 14, No. 3, pp. 911-916.

Costello et al., "Electron Microscopy of a Cholesteric Liquid Crystal and Its Blue Phase," Phys. Rev. A (Physical Review. A), May 1, 1984, vol. 29, No. 5, pp. 2957-2959.

Meiboom et al., "Theory of the Blue Phase of Cholesteric Liquid Crystals," Phys. Rev. Lett. (Physical Review Letters), May 4, 1981, vol. 46, No. 18, pp. 1216-1219.

Fortunato et al., "Wide-Bandgap High-Mobility Zno Thin-Film Transistors Produced At Room Temperature," Appl. Phys. Lett. (Applied Physics Letters), Sep. 27, 2004, vol. 85, No. 13, pp. 2541-2543.

Park et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Hayashi et al., "42.1: Invited Paper: Improved Amorphous In-Ga-Zn-O TFTs," SID Digest '08: SID International Symposium Digest of Technical Papers, May 20, 2008, vol. 39, pp. 621-624.

Masuda et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Asakuma et al., "Crystallization and Reduction of Sol-Gel-Derived Zinc Oxide Films by Irradiation with Ultraviolet Lamp," Journal of Sol-Gel Science and Technology, 2003, vol. 26, pp. 181-184.

Nomura et al., "Carrier transport in transparent oxide semiconductor with intrinsic structural randomness probed using single-crystalline InGaO$_3$(ZnO)$_5$ films," Appl. Phys. Lett. (Applied Physics Letters), Sep. 13, 2004, vol. 85, No. 11, pp. 1993-1995.

Son et al., "42.4L: Late-News Paper: 4 Inch QVGA AMOLED Driven by the Threshold Voltage Controlled Amorphous GIZO (Ga$_2$O$_3$-In$_2$O$_3$-ZnO) TFT," SID Digest '08: SID International Symposium Digest of Technical Papers, May 20, 2008, vol. 39, pp. 633-636.

Van de Walle, "Hydrogen as a Cause of Doping in Zinc Oxide," Phys. Rev. Lett. (Physical Review Letters), Jul. 31, 2000, vol. 85, No. 5, pp. 1012-1015.

Fung et al., "2-D Numerical Simulation of High Performance Amorphous In-Ga-Zn-O TFTs for Flat Panel Displays," AM-FPD '08 Digest of Technical Papers, Jul. 2, 2008, pp. 251-252, The Japan Society of Applied Physics.

Nakamura, "Synthesis of Homologous Compound with New Long-Period Structure," NIRIM Newsletter, Mar. 1, 1995, vol. 150, pp. 1-4.

Park et al., "42.3: Transparent ZnO Thin Film Transistor for the Application of High Aperture Ratio Bottom Emission AM-OLED Display," SID Digest '08: SID International Symposium Digest of Technical Papers, May 20, 2008, vol. 39, pp. 629-632.

Orita et al., "Mechanism of Electrical Conductivity of Transparent InGaZnO$_4$," Phys. Rev. B (Physical Review. B), Jan. 15, 2000, vol. 61, No. 3, pp. 1811-1816.

Nomura et al., "Amorphous Oxide Semiconductors for High-Performance Flexible Thin-Film Transistors," Jpn. J. Appl. Phys. (Japanese Journal of Applied Physics), 2006, vol. 45, No. 5B, pp. 4303-4308.

Janotti et al., "Native Point Defects in ZnO," Phys. Rev. B (Physical Review. B), 2007, vol. 76, pp. 165202-1-165202-22.

Park et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Hsieh et al., "P-29: Modeling of Amorphous Oxide Semiconductor Thin Film Transistors and Subgap Density of States," SID Digest '08: SID International Symposium Digest of Technical Papers, 2008, vol. 39, pp. 1277-1280.

Janotti et al., "Oxygen Vacancies in ZnO," Appl. Phys. Lett. (Applied Physics Letters), 2005, vol. 87, pp. 122102-1-122102-3.

Oba et al., "Defect energetics in ZnO: A hybrid Hartree-Fock density functional study," Phys. Rev. B (Physical Review. B), 2008, vol. 77, pp. 245202-1245202-6.

Orita et al., "Amorphous transparent conductive oxide InGaO$_3$(ZnO)$_m$ (m<4): a Zn 4s conductor," Philosophical Magazine, 2001, vol. 81, No. 5, pp. 501-515.

Hosono et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Mo et al., "Amorphous Oxide TFT Backplanes for Large Size AMOLED Displays," IDW '08: Proceedings of the 6th International Display Workshops, Dec. 3, 2008, pp. 581-584.

Kim et al., "High-Performance oxide thin film transistors passivated by various gas plasmas," 214th ECS Meeting, 2008, No. 2317.

Clark et al., "First Principles Methods Using CASTEP," Zeitschrift fur Kristallographie, 2005, vol. 220, pp. 567-570.

Lany et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Park et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Oh et al., "Improving the Gate Stability of ZnO Thin-Film Transistors with Aluminum Oxide Dielectric Layers," J. Electrochem. Soc. (Journal of the Electrochemical Society), 2008, vol. 155, No. 12, pp. H1009-H1014.

Ueno et al., "Field-Effect Transistor on SrTiO$_3$ with Sputtered Al$_2$O$_3$ Gate Insulator," Appl. Phys. Lett. (Applied Physics Letters), Sep. 1, 2003, vol. 83, No. 9, pp. 1755-1757.

Park.J et al., "High performance amorphous oxide thin film transistors with self-aligned top-gate structure,", IEDM 09: Technical Digest of International Electron Devices Meeting, Dec. 7, 2009, pp. 191-194.

* cited by examiner

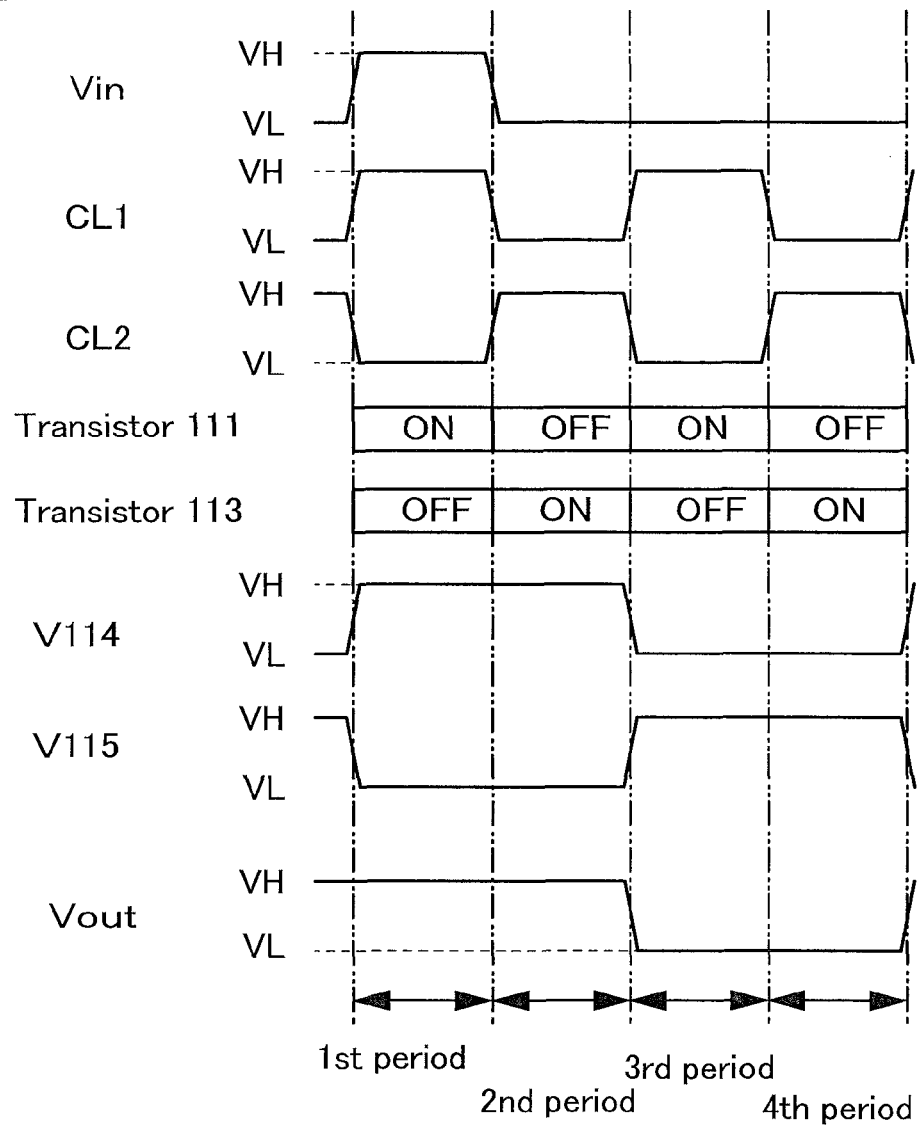

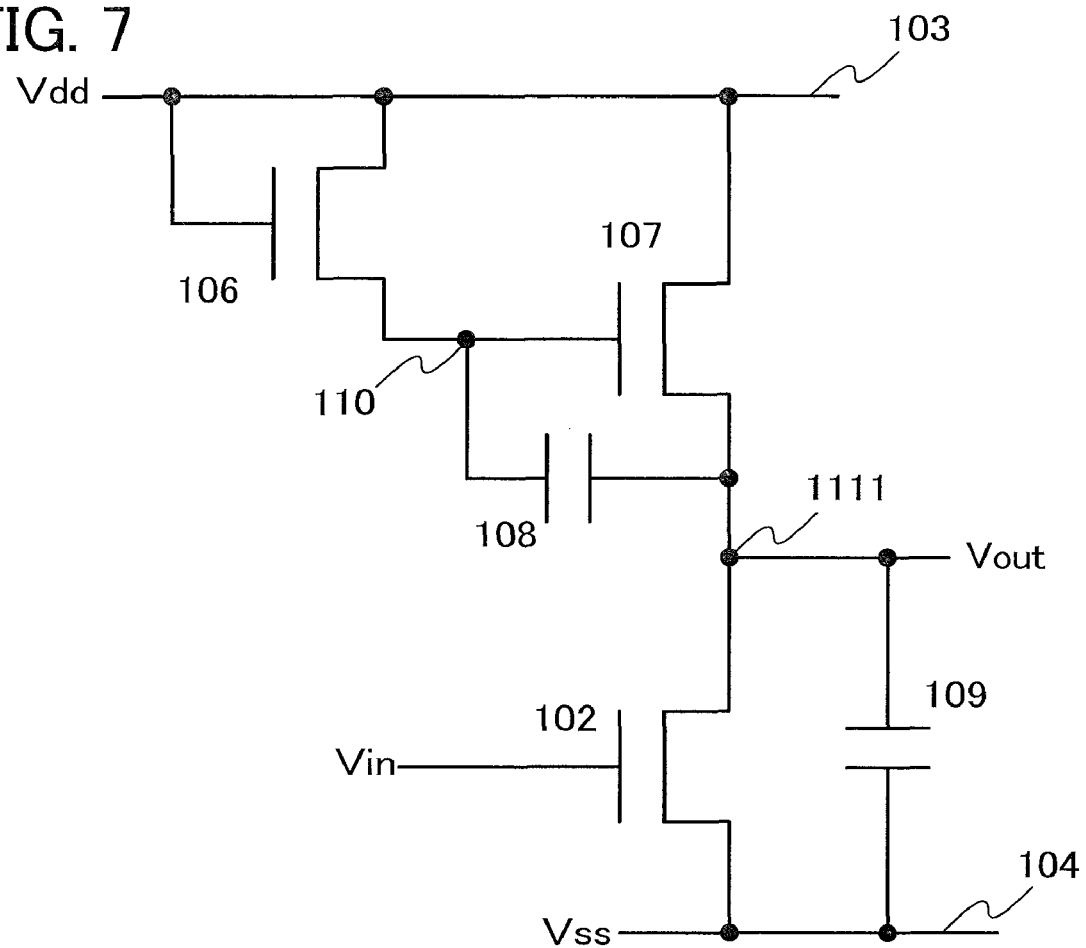

LOGIC CIRCUIT

BACKGROUND OF THE INVENTION

1. Field of the Invention

The present invention relates to a circuit including a thin film transistor using an oxide semiconductor. Specifically, the present invention relates to a logic circuit.

2. Description of the Related Art

A thin film transistor (TFT) formed over a flat plate such as a glass substrate, which is typically used in a liquid crystal display device, is generally formed using a semiconductor material such as amorphous silicon or polycrystalline silicon. TFTs using amorphous silicon have a low electric field mobility but can respond to increase in size of glass substrates. On the other hand, TFTs using polycrystalline silicon have a high electric field mobility, but need a crystallization step such as laser annealing and are not always adaptable to increase in size of glass substrates.

Thus, a technique in which a TFT is formed using an oxide semiconductor as a semiconductor material and applied to an electronic device or an optical device has attracted attention. For example, Patent Documents 1 and 2 each disclose a technique in which a TFT is formed using zinc oxide or an In—Ga—Zn—O-based oxide semiconductor as a semiconductor material and used for a switching element or the like in an image display device.

A TFT in which a channel formation region (also referred to as a channel region) is provided in an oxide semiconductor can have a higher electric field mobility than a TFT using amorphous silicon. An oxide semiconductor film can be formed at a temperature of 300° C. or lower by a sputtering method or the like, and a manufacturing process of the TFT using an oxide semiconductor is simpler than that of the TFT using polycrystalline silicon.

TFTs which are formed using such an oxide semiconductor over a glass substrate, a plastic substrate, or the like are expected to be applied to display devices such as a liquid crystal display, an electroluminescent display (also referred to as an EL display), and electronic paper.

REFERENCE

Patent Document 1: Japanese Published Patent Application No. 2007-123861

Patent Document 2: Japanese Published Patent Application No. 2007-096055

SUMMARY OF THE INVENTION

However, a conventional TFT using an oxide semiconductor tends to be a depletion-type TFT, which is normally on, and the threshold voltage of the TFT shifts over time. Accordingly, it has been difficult to apply the conventional TFT using the oxide semiconductor to a logic circuit constituted by a transistor having a desired threshold voltage, for example, an enhancement-type transistor, which is normally off.

In view of the forgoing problems, an object is to obtain a desired threshold voltage of a thin film transistor using an oxide semiconductor, and specifically, an object is to apply the thin film transistor to a logic circuit constituted by a transistor having a desired threshold voltage.

One embodiment of the invention disclosed in this specification is a logic circuit including an enhancement transistor which includes a layer for preventing reduction over a back channel so that the threshold voltage is controlled.

One embodiment is a specific structure of a logic circuit described as follows. The logic circuit includes a depletion transistor in which a high power supply voltage is applied to one of a source and a drain, and a gate is electrically connected to the other of the source and the drain; and an enhancement transistor in which a first signal is input to a gate, one of a source and a drain is electrically connected to the other of the source and the drain of the depletion transistor, and a low power supply voltage is applied to the other of the source and the drain. The enhancement transistor outputs as a second signal a voltage of a portion where the enhancement transistor is connected to the depletion transistor. Each of the depletion transistor and the enhancement transistor includes a gate electrode; a gate insulating layer provided over the gate electrode; a first oxide semiconductor layer provided over the gate insulating layer; a pair of second oxide semiconductor layers in contact with part of the first oxide semiconductor layer, serving as a source region and a drain region; a source electrode in contact with one of the second oxide semiconductor layers, which is the source region; and a drain electrode in contact with the other of the second oxide semiconductor layers, which is the drain region. The enhancement transistor includes a reduction prevention layer over a region in the first oxide semiconductor layer between the source electrode and the drain electrode.

One embodiment is another specific structure of a logic circuit described as follows. The logic circuit includes first transistor in which a first clock signal is input to a gate, and an input signal is input to the one of a source and a drain; a first inverter whose input terminal is electrically connected to the other of the source and the drain of the first transistor; a second inverter whose input terminal is electrically connected to an output terminal of the first inverter; a third inverter having an input terminal electrically connected to the output terminal of the first inverter, and an output terminal outputting an output signal; and a second transistor in which a second clock signal is input to a gate, one of a source and a drain is electrically connected to the other of the source and the drain of the first transistor, and the other of the source and the drain is electrically connected to an output terminal of the second inverter. Each of the first inverter and the second inverter includes a depletion transistor in which a high power supply voltage is applied to one of a source and a drain, and a gate is electrically connected to the other of the source and the drain; and an enhancement transistor in which a first signal is input to a gate, one of a source and a drain is electrically connected to the other of the source and the drain of the depletion transistor, and a low power supply voltage is applied to the other of the source and the drain. The enhancement transistor outputs as a second signal a voltage of a portion where the enhancement transistor is connected to the depletion transistor. Each of the depletion transistor and the enhancement transistor includes a gate electrode; a gate insulating layer provided over the gate electrode; a first oxide semiconductor layer provided over the gate insulating layer; a pair of second oxide semiconductor layers in contact with part of the first oxide semiconductor layer, serving as a source region and a drain region; a source electrode in contact with one of the second oxide semiconductor layers, which is the source region; and a drain electrode in contact with the other of the second oxide semiconductor layers, which is the drain region. The enhancement transistor includes a reduction prevention layer over a region in the first oxide semiconductor layer between the source electrode and the drain electrode.

The enhancement transistor can include an oxygen vacancy control region between the source electrode and the drain electrode over a surface of the first oxide semiconductor layer, which is opposite to a surface in contact with the gate insulating layer.

Each of the first oxide semiconductor layer and the second oxide semiconductor layers can contain indium, gallium, and zinc.

One embodiment is another specific structure of a logic circuit described as follows. The logic circuit includes a depletion transistor in which a high power supply voltage is applied to one of a source and a drain, and a gate is electrically connected to the other of the source and the drain; and an enhancement transistor in which a first signal is input to a gate, one of a source and a drain is electrically connected to the other of the source and the drain of the depletion transistor, and a low power supply voltage is applied to the other of the source and the drain. The enhancement transistor outputs as a second signal a voltage of a portion where the enhancement transistor is connected to the depletion transistor. Each of the depletion transistor and the enhancement transistor includes a gate electrode; a gate insulating layer provided over the gate electrode; an oxide semiconductor layer provided over the gate insulating layer; and a source electrode and a drain electrode in contact with part of the oxide semiconductor layer. The enhancement transistor includes a reduction prevention layer over a region in the oxide semiconductor layer between the source electrode and the drain electrode.

One embodiment is another specific structure of a logic circuit described as follows. The logic circuit includes a first transistor in which a first clock signal is input to a gate, and an input signal is input to the one of a source and a drain; a first inverter whose input terminal is electrically connected to the other of the source and the drain of the first transistor; a second inverter whose input terminal is electrically connected to the output terminal of the first inverter; a third inverter having an input terminal electrically connected to the output terminal of the first inverter, and an output terminal outputting an output signal; and a second transistor in which a second clock signal is input to a gate, one of a source and a drain is electrically connected to the other of the source and the drain of the first transistor, and the other of the source and the drain is electrically connected to the output terminal of the second inverter. Each of the first inverter and the second inverter includes a depletion transistor in which a high power supply voltage is applied to one of a source and a drain, and a gate is electrically connected to the other of the source and the drain; and an enhancement transistor in which a first signal is input to a gate, one of a source and a drain is electrically connected to the other of the source and the drain of the depletion transistor, and a low power supply voltage is applied to the other of the source and the drain. The enhancement transistor outputs as a second signal a voltage of a portion where the enhancement transistor is connected to the depletion transistor. Each of the depletion transistor and the enhancement transistor includes a gate electrode; a gate insulating layer provided over the gate electrode; an oxide semiconductor layer provided over the gate insulating layer; and a source electrode and a drain electrode in contact with part of the oxide semiconductor layer. The enhancement transistor includes a reduction prevention layer over a region in the oxide semiconductor layer between the source electrode and the drain electrode.

The enhancement transistor can include an oxygen vacancy control region between the source electrode and the drain electrode over a surface of the first oxide semiconductor layer, which is opposite to a surface in contact with the gate insulating layer.

The oxide semiconductor layer can contain indium, gallium, and zinc.

The depletion transistor and the enhancement transistor can have the same conductivity type.

The source electrode or the drain electrode of the depletion transistor can be in contact with the gate electrode of the enhancement transistor through an opening portion provided in the gate insulating layer.

An oxide semiconductor used in this specification is represented by $InMO_3(ZnO)_m$ (m>0). Note that M represents one or more of metal elements selected from gallium (Ga), iron (Fe), nickel (Ni), manganese (Mn), or cobalt (Co). As an example, M may be Ga or may include the above metal element in addition to Ga, for example, M may be Ga and Ni or Ga and Fe. Moreover, the oxide semiconductor may contain a transition metal element such as Fe or Ni or oxide of the transition metal element as an impurity element in addition to the metal element contained as M. Note that in this specification, an oxide semiconductor film containing indium, gallium, and zinc is also referred to as an In—Ga—Zn—O-based non-single-crystal film.

Since the In—Ga—Zn—O-based non-single-crystal film is formed by a sputtering method and subjected to heat treatment at a temperature of 200° C. to 500° C., specifically 300° C. to 400° C. for 10 to 100 minutes, the amorphous structure is observed by X-ray diffraction (XRD) analysis as a crystal structure. Moreover, as for electric characteristics, a TFT with an on/off ratio of $10^9$ or more and a mobility of 10 or more in the case where the gate voltage is ±20 V can be manufactured.

Note that in this document (the specification, the scope of claims, the drawings, and the like), a logic circuit performs logic operation based on a signal input thereto and outputs a signal in accordance with the result of the operation. For example, the logic circuit includes a combinational logic circuit (e.g., a NOT circuit and a NAND circuit) and a sequential logic circuit (e.g., a flip flop circuit and a shift register) in its category.

An enhancement thin film transistor using an oxide semiconductor, in which the shift of the threshold voltage over time is suppressed, can be provided, whereby the transistor using the oxide semiconductor can be applied to a logic circuit including an enhancement transistor.

BRIEF DESCRIPTION OF THE DRAWINGS

In the accompanying drawings:

FIG. 6 is a timing chart illustrating operation of a logic circuit in Embodiment 1;

FIG. 7 is a circuit diagram illustrating a circuit configuration of a logic circuit in Embodiment 1;

DETAILED DESCRIPTION OF THE INVENTION

Embodiments will be described below with reference to the accompanying drawings. Note that the invention disclosed in this specification is not limited to the following description, and it is easily understood by those skilled in the art that modes and details can be variously changed without departing from the spirit and the scope of the invention. Therefore, the invention disclosed in this specification is not construed as being limited to the description of the following embodiments.

(Embodiment 1)

In this embodiment, one embodiment of a logic circuit will be described.

Figure 1:
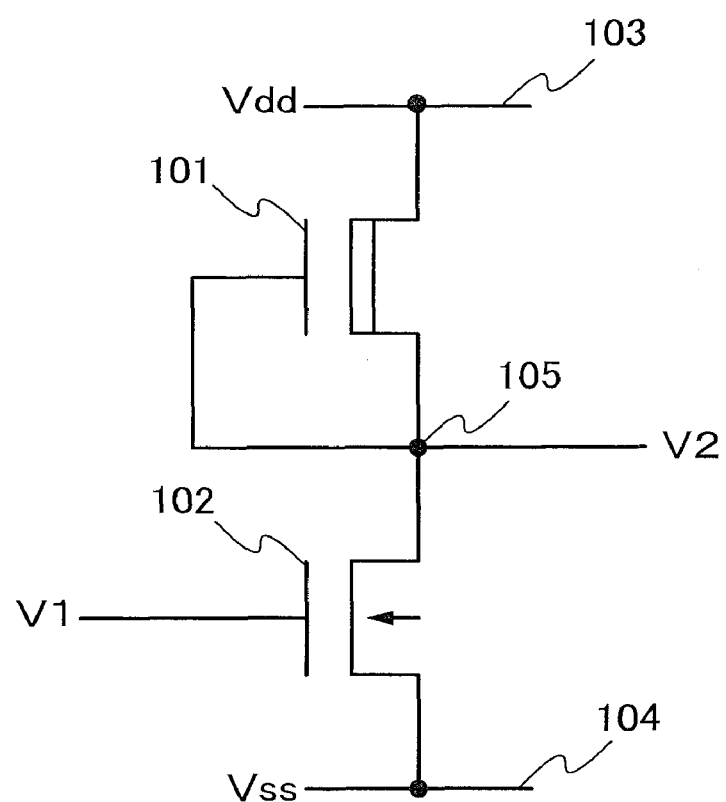
FIG. 1 is a circuit diagram illustrating a circuit configuration of a logic circuit in Embodiment 1.

First, a circuit configuration of a logic circuit in this embodiment will be described with reference to FIG. 1. FIG. 1 is a circuit diagram illustrating a circuit configuration of a logic circuit in this embodiment.

The logic circuit illustrated in FIG. 1 is a combinational logic circuit including a transistor 101 and a transistor 102.

Note that in this document (the specification, the scope of claims, the drawings, and the like), a transistor has at least three terminals of a gate, a source, and a drain.

The gate is the entire gate electrode and gate wiring or part thereof. The gate wiring is a wiring for electrically connecting a gate electrode of at least one transistor to another electrode or another wiring, and includes a scan line in a display device in its category, for example.

The source is the entire source region, source electrode, and source wiring or part thereof. The source region indicates a region in a semiconductor layer, where the resistivity is equal to or less than a given value. The source electrode indicates part of a conductive layer, which is connected to the source region. The source wiring is a wiring for electrically connecting a source electrode of at least one transistor to another electrode or another wiring. For example, in the case where a signal line in a display device is electrically connected to a source electrode, the source wiring includes the signal line in its category.

The drain is the entire drain region, drain electrode, and drain wiring or part thereof. The drain region indicates a region in a semiconductor layer, where the resistivity is equal to or less than a given value. The drain electrode indicates part of a conductive layer, which is connected to the drain region. The drain wiring is a wiring for electrically connecting a drain electrode of at least one transistor to another electrode or another wiring. For example, in the case where a signal line in a display device is electrically connected to a drain electrode, the drain wiring includes the signal line in its category.

In addition, in this document (the specification, the scope of claims, the drawings, and the like), a source and a drain of a transistor change depending on the structure, the operating conditions, or the like of the transistor; therefore, it is difficult to determine which is the source and which is the drain. Accordingly, in this document (the specification, the scope of claims, the drawings, and the like), one terminal which is freely selected from the source and the drain is referred to as one of the source and the drain, whereas the other terminal is referred to as the other of the source and the drain.

The transistor 101 is a depletion-type transistor (also referred to as a depletion transistor). One of a source and a drain of the transistor 101 is electrically connected to a power supply line 103, and a high power supply voltage (Vdd) is applied to one of the source and the drain through the power supply line 103. Moreover, a gate and the other of the source and the drain of the transistor 101 are electrically connected to each other (i.e., the transistor 101 is diode-connected). Note that an example of a depletion transistor is a transistor whose threshold voltage is negative in the case of an n-channel transistor.

Note that in general, a voltage refers to the difference between potentials of two points (also referred to as the potential difference), and a potential refers to electrostatic energy (electric potential energy) that a unit charge in an electrostatic field at one point has. However, in an electric circuit, the potential difference between a potential at one point and a potential serving as a reference (also referred to as a reference potential) is sometimes used as a value, for example. Moreover, both the value of a voltage and the value of a potential are represented by volts (V); therefore, in the document (the specification and the scope of claims) of the present application, a voltage at one point is sometimes used as a value unless otherwise specified.

The transistor 102 is an enhancement-type transistor (also referred to as an enhancement transistor). One of a source and a drain of the transistor 102 is electrically connected to the other of the source and the drain of the transistor 101. The other of the source and the drain of the transistor 102 is electrically connected to a power supply line 104, and a low power supply voltage (Vss) is applied to the other of the source and the drain of the transistor 102 through the power supply line 104. The low power supply voltage is a ground potential (VGND) or a given voltage, for example. Note that an example of an enhancement transistor is a transistor whose threshold voltage is positive in the case of an n-channel transistor.

The high power supply voltage is relatively higher than the low power supply voltage, and the low power supply voltage is relatively lower than the high power supply voltage. Each value is set as appropriate based on specifications of a circuit or the like, and thus there is no particular limitation on the value. For example, when Vdd>Vss, |Vdd|>|Vss| is not always satisfied. Moreover, when Vdd>Vss, VGND≧Vss is not always satisfied.

Further, transistors of the same conductivity type can be used for the transistors 101 and 102. In this embodiment, the case where the transistors 101 and 102 are n-channel transistors is described as an example.

Next, operation of the logic circuit illustrated in FIG. 1 will be described. In the logic circuit in this embodiment, a first signal is input to a gate of the transistor 102, and a voltage at a portion (also referred to as a node) 105 where the transistors 101 and 102 are connected to each other is output as a second signal. Specific operation of the logic circuit will be described below.

Figure 2A:
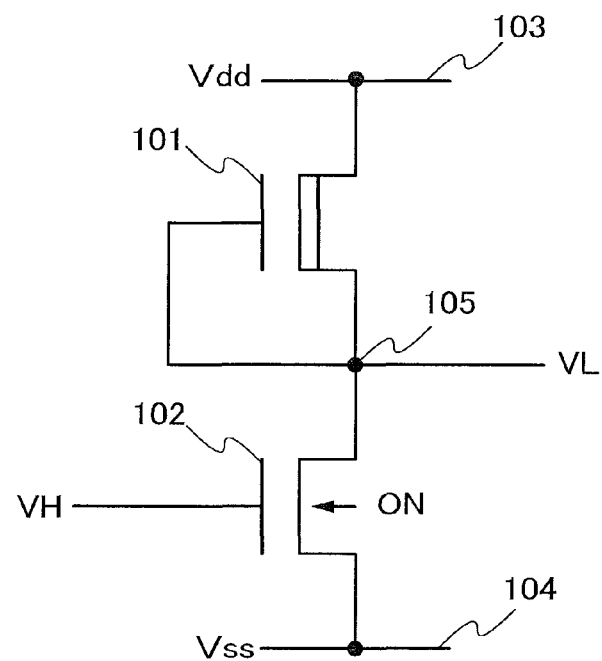
FIGS. 2A and 2B are circuit diagrams for illustrating operation of a logic circuit in Embodiment 1.
Figure 2B:
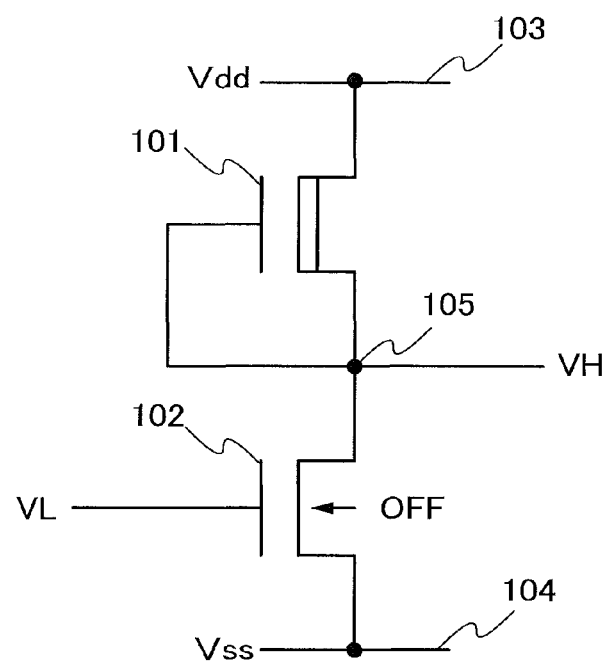

The operation of the logic circuit in this embodiment can be classified into two categories depending on whether the first signal is in a low state or a high state. A low state is a state where a voltage is relatively low as compared to a high state, and a high state is a state where a voltage is relatively high as compared to a low state. Both cases will be described with reference to FIGS. 2A and 2B. FIGS. 2A and 2B illustrate operation of the logic circuit in this embodiment. Note that in this embodiment, the case where data is 0 in a low state and data is 1 in a high state is described as an example; however, one embodiment of the invention is not limited thereto, and data can be 1 in a low state and can be 0 in a high state. Note that a voltage in a low state is referred to a low voltage (VL), and a voltage in a high state is referred to a high voltage (VH). Values of the low voltage and the high voltage are not limited to specific values, and the low voltage should be equal to or lower than a given value and the high voltage should be equal to or higher than the given value.

FIG. 2A illustrates the operation in the case where a voltage (V1) of the first signal is high (i.e., V1=VH). As illustrated in FIG. 2A, in the case where V1=VH, the transistor 102 is turned on. When the transistor 102 is on, the resistance (R102) of the transistor 102 is lower than the resistance (R101) of the transistor 101 (i.e., R102<R101); accordingly, a voltage (V105) of the node 105 is VL and a voltage (V2) of the second signal is VL.

FIG. 2B illustrates the operation in the case where V1=VL. As illustrated in FIG. 2B, in the case where V1=VL, the transistor 102 is turned off. When the transistor 102 is off, R102 is higher than R101, so that V105 is VH and V2 is VH. At this time, the value of VH, which is the voltage of the second signal, is (Vdd−Vth101) (Vth101 represents the threshold voltage of the transistor 101). The above is the operation of the logic circuit illustrated in FIG. 1.

Figure 3:
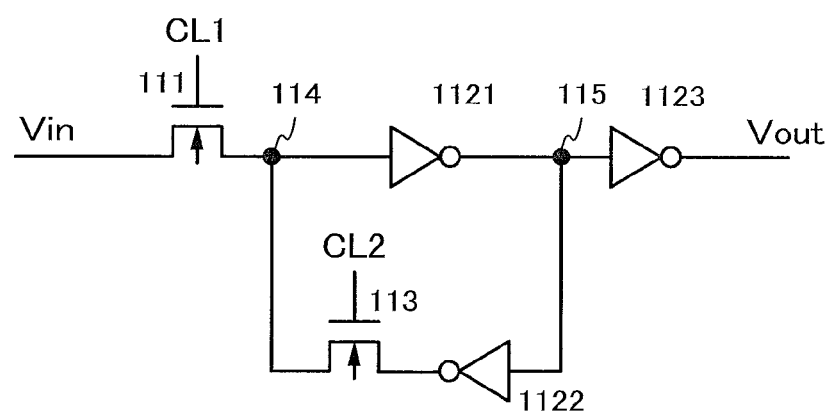
FIG. 3 is a circuit diagram illustrating a circuit configuration of a logic circuit in Embodiment 1.

Further, a sequential logic circuit can be constituted by the combinational logic circuit illustrated in FIG. 1. A circuit configuration of a logic circuit using a combinational circuit will be described with reference to FIG. 3. FIG. 3 is a circuit diagram illustrating a circuit configuration of a logic circuit in this embodiment.

A logic circuit illustrated in FIG. 3 includes a transistor 111, an inverter 1121, an inverter 1122, an inverter 1123, and a transistor 113.

A first clock signal (CL1) is input to a gate of the transistor 111, and a signal is input to one of a source and a drain of the transistor 111. The signal input to one of the source and the drain is referred to as an input signal.

An input terminal of the inverter 1121 is electrically connected to the other of the source and the drain of the transistor 111.

An input terminal of the inverter 1122 is electrically connected to an output terminal of the inverter 1121.

An input terminal of the inverter 1123 is electrically connected to the output terminal of the inverter 1121. A second signal is output from an output terminal of the inverter 1123.

The logic circuit illustrated in FIG. 1 can be applied to each of the inverters 1121 to 1123.

A second clock signal (CL2) is input to a gate of the transistor 113. One of a source and a drain of the transistor 113 is electrically connected to the other of the source and the drain of the transistor 111. The other of the source and the drain of the transistor 113 is electrically connected to an output terminal of the inverter 1122.

The first clock signal and the second clock signal each have two states of a high state and a low state. A voltage in a high state is a high voltage, and a voltage in a low state is a low voltage.

Moreover, the first clock signal and the second clock signal have opposite phases. For example, in a predetermined period, the second clock signal is low when the first clock signal is high, whereas the second clock signal is high when the first clock signal is low.

Note that in this embodiment, the case is described in which the first clock signal is input to the gate of the transistor 111 and the second clock signal is input to the gate of the transistor 113; however, one embodiment of the invention is not limited thereto, and a structure can be employed in which the second clock signal is input to the gate of the transistor 111 and the first clock signal is input to the gate of the transistor 113.

Next, operation of the logic circuit illustrated in FIG. 3 will be described with reference to FIGS. 4A and 4B, FIGS. 5C and 5D, and FIG. 6. FIGS. 4A and 4B and FIGS. 5C and 5D illustrate the operation of the logic circuit in FIG. 3. FIG. 6 is a timing chart illustrating the operation of the logic circuit in FIG. 3.

The operation of the logic circuit illustrated in FIG. 3 is mainly classified into four periods. Each period will be described below.

Figure 4A:
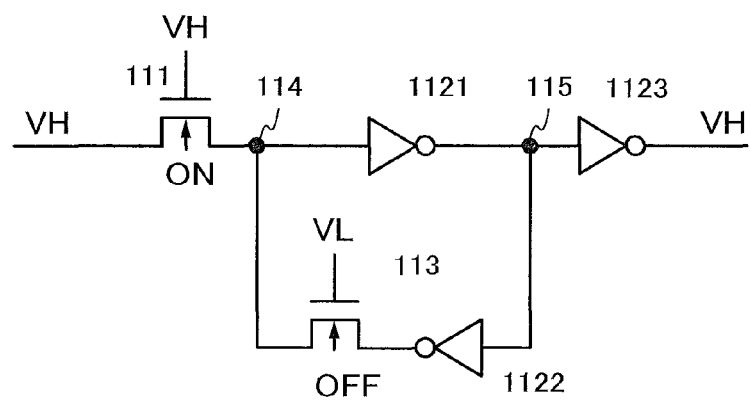
FIGS. 4A and 4B are circuit diagrams for illustrating operation of a logic circuit in Embodiment 1.

First, in a first period, as illustrated in FIG. 6, the first clock signal is high, that is, CL1 is VH and the second clock signal is low, that is, CL2 is VL. Accordingly, the transistor 111 is turned on and the transistor 113 is turned off as illustrated in FIG. 4A. Moreover, a voltage (Vin) of the input signal is a high voltage, that is, Vin is VH.

At this time, since the transistor 111 is on, a voltage (V114) of the node 114 is VH. Since the voltage of the node 114 is applied to the input terminal of the inverter 1121, a signal of VL is output from the inverter 1121, and a voltage (V115) of a node 115 is VL. Further, since the voltage of the node 115 is applied to the input terminal of the inverter 1122, a signal of VH is output from the inverter 1122. However, the voltage of the output signal from the inverter 1122 is not applied to the node 114 because the transistor 113 is off. Moreover, the voltage of the node 115 is also applied to the input terminal of the inverter 1123, so that a signal of VH is output from the inverter 1123 as illustrated in FIG. 4A. The above is the operation in the first period.

Figure 4B:
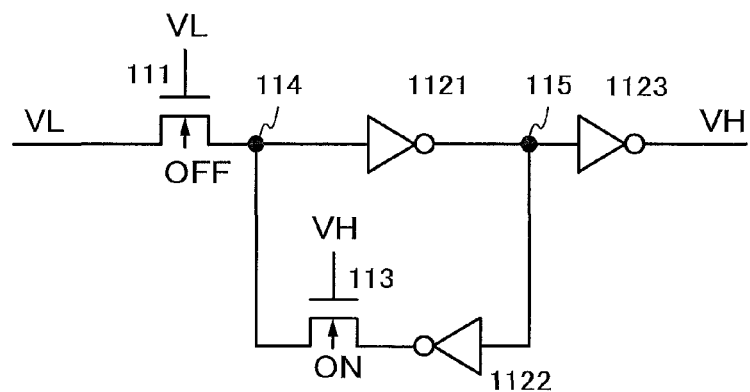

Next, in a second period, as illustrated in FIG. 6, CL1 is VL and CL2 is VH; accordingly, the transistor 111 is turned off and the transistor 113 is turned on as illustrated in FIG. 4B. Moreover, Vin is VL.

At this time, since the transistor 111 is off, V114 remains VH even when Vin is VL. Since the voltage of the node 114 is applied to the input terminal of the inverter 1121, a signal of VL is output from the inverter 1121, and V115 remains VL. Further, the voltage of the node 115 is applied to the input terminal of the inverter 1122, and a signal of VH is output from the inverter 1122. Moreover, since the transistor 113 is off, the voltage of the signal from the inverter 1122 is applied to the node 114. The voltage of the node 115 is also applied to the input terminal of the inverter 1123, so that a signal of VH is output from the inverter 1123 as illustrated in FIG. 4B. The above is the operation in the second period.

Figure 5C:
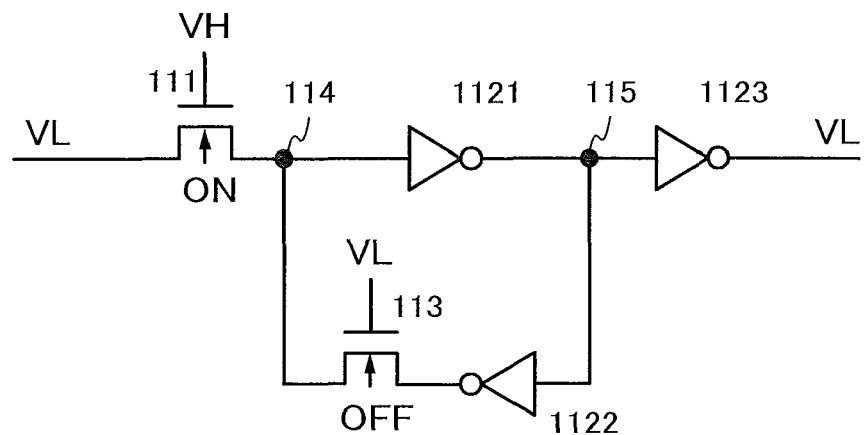
FIGS. 5C and 5D are circuit diagrams for illustrating operation of a logic circuit in Embodiment 1.

Next, in a third period, as illustrated in FIG. 6, CL1 is VH and CL2 is VL; accordingly, the transistor 111 is turned on and the transistor 113 is turned off as illustrated in FIG. 5C. Moreover, Vin remains VL.

At this time, since the transistor 111 is on, V114 is VH. Since the voltage of the node 114 is applied to the input terminal of the inverter 1121, a signal of VH is output from the inverter 1121, and V115 is VH. Further, since the voltage of the node 115 is applied to the input terminal of the inverter 1122, a signal of VL is output from the inverter 1122. However, the voltage of the output signal from the inverter 1122 is not applied to the node 114 because the transistor 113 is off. Moreover, the voltage of the node 115 is also applied to the input terminal of the inverter 1123, so that a signal of VL is output from the inverter 1123 as illustrated in FIG. 5C. The above is the operation in the third period.

Figure 5D:
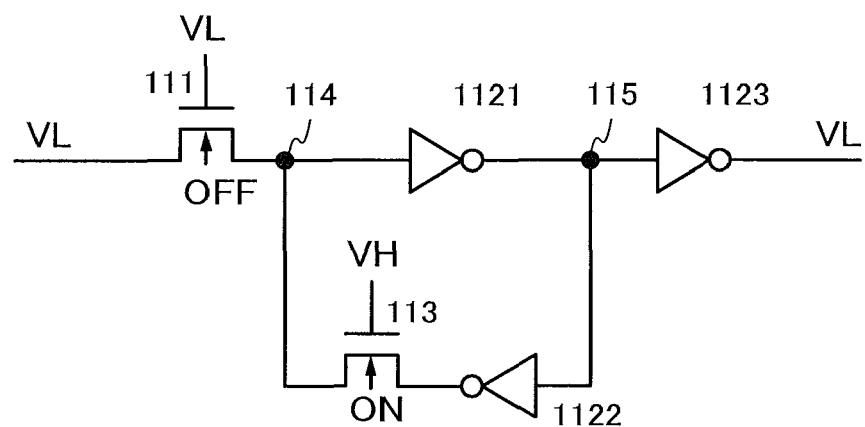

Next, in a fourth period, as illustrated in FIG. 6, CL1 is VL and CL2 is VH; accordingly, the transistor 111 is turned off and the transistor 113 is turned on as illustrated in FIG. 5D. Moreover, Vin remains VL.

At this time, since the transistor 111 is off, V114 remains VL. Since V114 is VL, a signal of VH is output from the inverter 1121, and V115 remains VH. Further, since V115 is VH, a signal of VL is output from the inverter 1122, and since the transistor 113 is on, the voltage of the signal from the inverter 1122 is applied to the node 114. Moreover, the voltage of the node 115 is also applied to the input terminal of the inverter 1123, so that a signal of VL is output from the inverter 1123 as illustrated in FIG. 5D. The above is the operation in the fourth period.

Through the above operation, the logic circuit illustrated in FIG. 3 can generate an output signal based on a state of a signal input thereto.

Note that in the logic circuit illustrated in FIG. 3, a combinational logic circuit using a bootstrap method can be applied to the inverter 1123. A logic circuit using a bootstrap method will be described with reference to FIG. 7. FIG. 7 is a circuit diagram illustrating a circuit configuration of a logic circuit using a bootstrap method in this embodiment.

The logic circuit illustrated in FIG. 7 includes a transistor 106, a capacitor 108, and a capacitor 109 in addition to the circuit configuration of the logic circuit illustrated in FIG. 1, and also includes a transistor 107 instead of the transistor 101. In the logic circuit in FIG. 7, the description of the logic circuit in FIG. 1 is employed as appropriate for the same portion as the logic circuit in FIG. 1.

A gate and one of a source and a drain of the transistor 106 are electrically connected to the power supply line 103, and the high power supply voltage is applied to the gate and one of the source and the drain. The other of the source and the drain of the transistor 106 is electrically connected to a gate of the transistor 107.

The gate of the transistor 107 is electrically connected to the other of the source and the drain of the transistor 106. One of a source and a drain the transistor 107 is electrically connected to the power supply line 103, and the high power supply voltage is applied to one of the source and the drain.

The capacitor 108 has a first terminal and a second terminal. The first terminal is electrically connected to the other of the source and the drain of the transistor 106, and the second terminal is electrically connected to the other of the source and the drain of the transistor 107.

The capacitor 109 has a first terminal and a second terminal. The first terminal is electrically connected to the other of the source and the drain of the transistor 107. The second terminal is electrically connected to the power supply line 104, and the low power supply voltage is applied to the second terminal.

Next, operation of the logic circuit illustrated in FIG. 7 will be described.

In the logic circuit in FIG. 7, as in the logic circuit in FIG. 1, the first signal is input to the gate of the transistor 102, and a voltage of a node 1111 between the transistors 107 and 102 is output as the second signal.

Figure 8A:
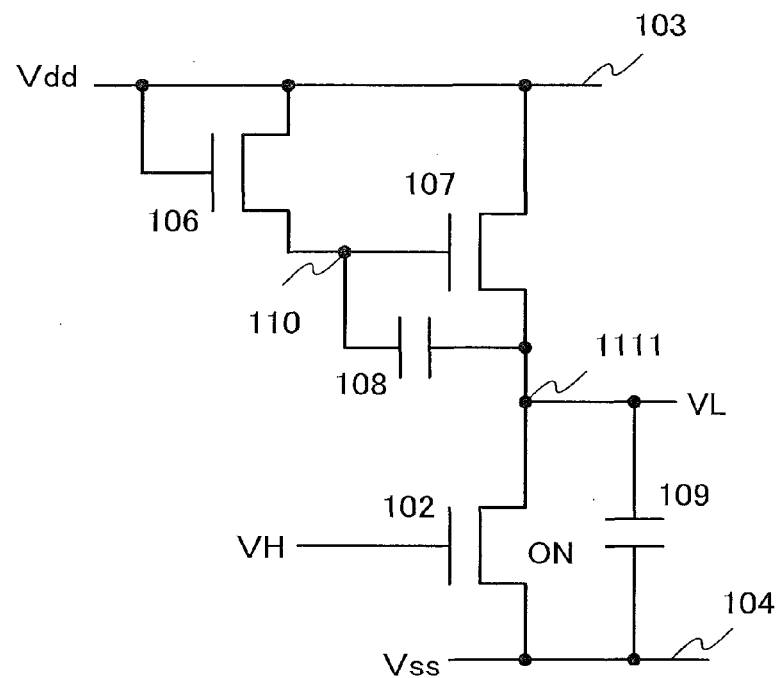
FIGS. 8A and 8B are circuit diagrams for illustrating operation of a logic circuit in Embodiment 1.
Figure 8B:
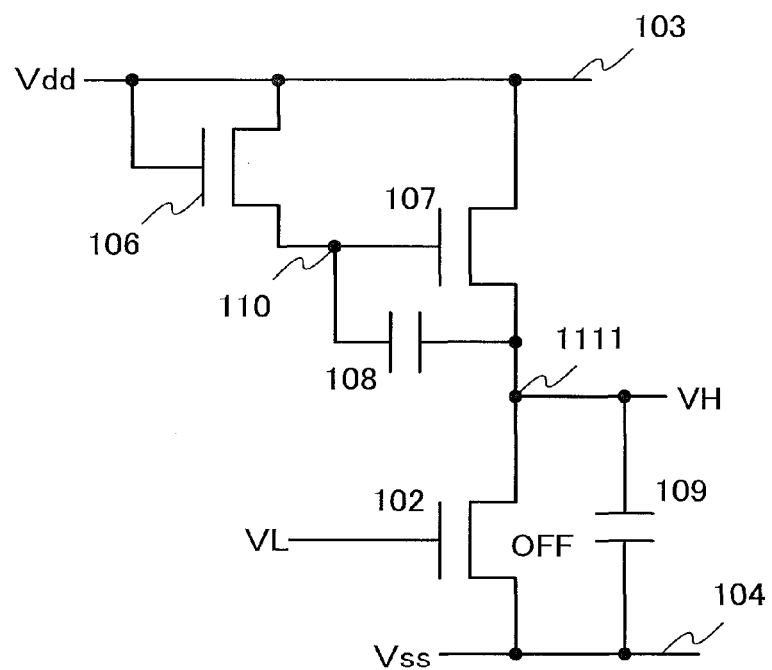

The operation of the logic circuit illustrated in FIG. 7 can be classified into two categories depending on whether the voltage of the first signal is low or high. Both cases will be described with reference to FIGS. 8A and 8B. FIGS. 8A and 8B illustrate operation of the logic circuit in this embodiment. Note that in this embodiment, the case where data is 0 in a low state and data is 1 in a high state is described as an example; however, one embodiment of the invention is not limited thereto, and data can be 1 in a low state and can be 0 in a high state.

FIG. 8A illustrates the operation in the case where V1=VH. As illustrated in FIG. 8A, in the case where V1=VH, the transistor 102 is turned on. When the transistor 102 is on, the resistance of the transistor 102 is lower than the resistance (R107) of the transistor 107 (i.e., R102<R107), and a voltage (V1111) of the node 1111 is VL; thus, V2 is VL. Further, the transistor 106 is turned off at the time when a voltage of a node 110 between the other of the source and the drain of the transistor 106 and the gate of the transistor 107 becomes a value obtained by subtracting the threshold voltage (Vth106) of the transistor 106 from the high power supply voltage, that is, (Vdd−Vth106), and the node 110 enters into a floating state.

FIG. 8B illustrates the operation in the case where V1=VL. As illustrated in FIG. 8B, in the case where V1=VL, the transistor 102 is turned off. When the transistor 102 is off, R102 is higher than R107, and the voltage of the node 1111 is increased by the capacitor 109 and the voltage of the node 110 is also increased by capacitive coupling with the capacitor 108. Thus, it follows that V2=V110=V1111=VH. At this time, the value of VH is larger than VH, which is the voltage of the second signal in the logic circuit illustrated in FIG. 1, and expressed as VH=Vdd+Vth106. The above is the operation of the logic circuit illustrated in FIG. 7.

As described above, by using the logic circuit in FIG. 7 as the inverter 1123, the voltage of the second signal can be amplified.

Figure 9A:
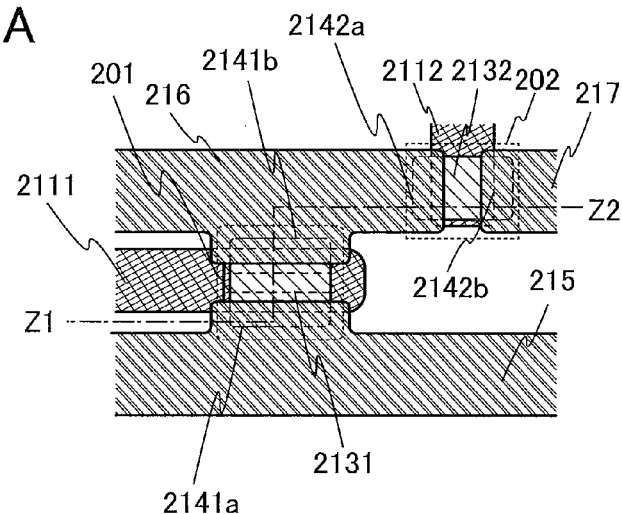
FIGS. 9A to 9C each illustrate a structure of a logic circuit in Embodiment 1.
Figure 9B:
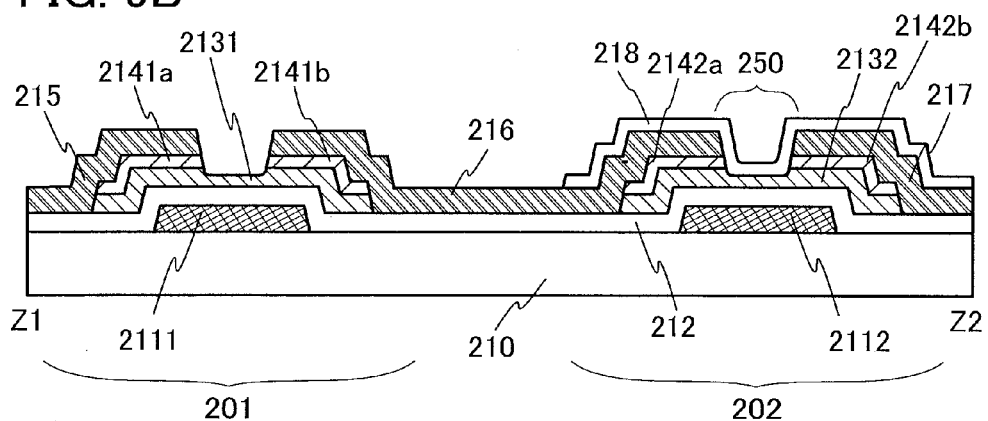
Figure 9C:
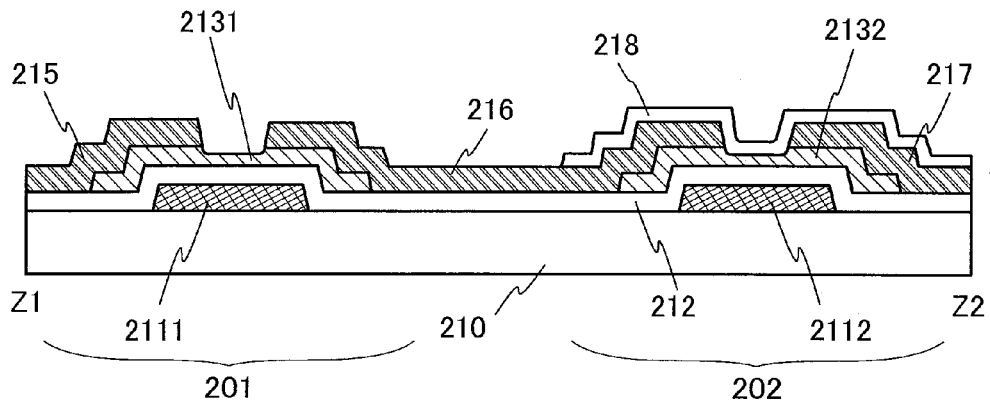

Next, a structure of the logic circuit in FIG. 1 will be described with reference to FIGS. 9A to 9C. FIGS. 9A to 9C each illustrate a structure of the logic circuit in FIG. 1. FIG. 9A is a top view. Each of FIGS. 9B and 9C is a cross-sectional view of the logic circuit along Z1-Z2 in FIG. 9A.

As illustrated in FIGS. 9A and 9B, the logic circuit in this embodiment includes a transistor 201 and a transistor 202. Specifically, the logic circuit includes a substrate 210; gate electrodes 2111 and 2112 over the substrate 210; a gate insulating layer 212 provided so as to cover the gate electrodes 2111 and 2112; an oxide semiconductor layer 2131 provided over the gate insulating layer 212 over the gate electrode 2111; an oxide semiconductor layer 2132 provided over the gate insulating layer 212 over the gate electrode 2112; oxide semiconductor layers 2141a, 2141b, 2142a, and 2142b; and a reduction prevention layer 218.

The transistor 201 corresponds to the transistor 101 in FIG. 1. The gate electrode 2111 is provided over the substrate 210. The gate insulating layer 212 is provided over the gate electrode 2111. The oxide semiconductor layer 2131 is provided over the gate insulating layer 212. The oxide semiconductor layers 2141a and 2141b, which are a pair of oxide semiconductor layers, are provided over the oxide semiconductor layer 2131. Electrodes 215 and 216, which are a pair of electrodes, are provided so as to be in contact with the oxide semiconductor layers 2141a and 2141b, respectively.

When it is explicitly described that B is formed on or over A, it does not necessarily mean that B is formed in direct contact with A. The description includes the case where A and B are not in direct contact with each other, that is, the case where another object is placed between A and B. Here, each of A and B corresponds to an object (e.g., a device, an element, a circuit, a wiring, an electrode, a terminal, a film, or a layer).

Therefore, for example, when it is explicitly described that a layer B is formed on or over a layer A, it includes both the case where the layer B is formed in direct contact with the layer A, and the case where another layer (e.g., a layer C or a layer D) is formed in direct contact with the layer A and the layer B is formed in direct contact with the layer C or the layer D. Note that another layer (e.g., the layer C or the layer D) may be a single layer or a plurality of layers.

The transistor 202 corresponds to the transistor 102 in FIG. 1. The gate electrode 2112 is provided over the substrate 210. The gate insulating layer 212 is provided over the gate electrode 2112. The oxide semiconductor layer 2132 is provided over the gate insulating layer 212. The oxide semiconductor layers 2142a and 2142b, which are a pair of oxide semiconductor layers, are provided over the oxide semiconductor layer 2132. The electrode 216 and an electrode 217, which are a pair of electrodes, are provided so as to be in contact with the oxide semiconductor layers 2142a and 2142b, respectively. The reduction prevention layer 218 is provided over the oxide semiconductor layer 2132.

For the substrate 210, an alkali-free glass substrate manufactured by a fusion method or a float method, such as a substrate of barium borosilicate glass, aluminoborosilicate glass, or aluminosilicate glass; a ceramic substrate; a plastic substrate which has high heat resistance enough to withstand a process temperature of this manufacturing process; or the like can be used. As the plastic substrate, a fiberglass-reinforced plastics (FRP) plate, a polyvinyl fluoride (PVF) film, a polyester film, or an acrylic resin film can be used, for example. Moreover, a sheet in which aluminum foil is placed between PVF films or polyester films can be used as the substrate.

The gate electrodes 2111 and 2112 can be formed with a single-layer structure or a layered structure using a metal material such as molybdenum, titanium, chromium, tantalum, tungsten, aluminum, copper, neodymium, or scandium or an alloy material containing any of these materials as a main component, for example. The edges of the gate electrodes 2111 and 2112 are preferably tapered.

For example, for a two-layer structure of the gate electrodes 2111 and 2112, it is preferable to employ any of the following two-layer structures: a structure where a molybdenum layer is stacked over an aluminum layer; a structure where a molybdenum layer is stacked over a copper layer; a structure where a titanium nitride layer or a tantalum nitride layer is stacked over a copper layer; a structure where a titanium nitride layer and a molybdenum layer are stacked. For a layered structure, a tungsten layer or a tungsten nitride layer, a layer of an alloy of aluminum and silicon or an alloy of aluminum and titanium, and a titanium nitride layer or a titanium layer are preferably stacked.

For the gate insulating layer 212, one of oxide, nitride, oxynitride, and nitride oxide of silicon, aluminum, yttrium, tantalum, or hafnium; or a compound containing at least two such materials can be used. Moreover, a halogen element such as chlorine or fluorine may be contained in the gate insulating layer 212.

The oxide semiconductor layers 2131 and 2132 are first oxide semiconductor layers. As the oxide semiconductor layers 2131 and 2132, an In—Ga—Zn—O-based non-single-crystal film can be used, for example.

The oxide semiconductor layers 2141a, 2141b, 2142a, and 2142b are second oxide semiconductor layers and function as source regions and drain regions. The oxide semiconductor layers 2141a, 2141b, 2142a, and 2142b are formed using, for example, an In—Ga—Zn—O-based non-single-crystal film formed under deposition conditions which are different from those of the oxide semiconductor layers 2131 and 2132. For example, when the oxide semiconductor layers 2141a, 2141b, 2142a, and 2142b are formed using an oxide semiconductor film obtained under a condition where the flow rate of an argon gas for sputtering is 40 sccm, they have n-type conductivity and have an activation energy ($\Delta E$) of 0.01 eV to 0.1 eV. Note that in this embodiment, the oxide semiconductor layers 2141a, 2141b, 2142a, and 2142b are In—Ga—Zn—O-based non-single-crystal films and include at least amorphous components. Moreover, the oxide semiconductor layers 2141a, 2141b, 2142a, and 2142b may include crystal grains (nanocrystals). The crystal grain (the nanocrystal) in the oxide semiconductor layers 2141a, 2141b, 2142a, and 2142b has a diameter of 1 nm to 10 nm, typically approximately 2 nm to 4 nm.

Note that the oxide semiconductor layers 2141a, 2141b, 2142a, and 2142b are not necessarily provided. As illustrated in FIG. 9C, a structure where the oxide semiconductor layers 2141a, 2141b, 2142a, and 2142b are not provided may be employed. However, by the provision of the oxide semiconductor layers 2141a, 2141b, 2142a, and 2142b, a junction between an upper electrode and the first oxide semiconductor layer can be satisfactory, and thermally stable operation can be performed as compared to a Schottky junction. Moreover, favorable mobility can be maintained at a high drain voltage.

The electrodes 215 to 217 function as a source electrode or a drain electrode. The electrodes 215 to 217 preferably have a single-layer structure or a layered structure using an element such as aluminum, copper, chromium, silicon, titanium, neodymium, scandium, or molybdenum or an aluminum alloy to which an element for preventing hillocks is added. Further, when heat treatment of 200° C. to 600° C. is performed, the conductive film preferably has heat resistance enough to withstand the heat treatment. For example, when a layered structure of a titanium film, an aluminum film, and a titanium film is employed for the electrodes 215 to 217, the electrodes 215 to 217 have low resistance and hillocks are not likely to occur in the aluminum film. The electrodes 215 to 217 can be formed by a sputtering method or a vacuum evaporation method. Alternatively, the electrodes 215 to 217 may be formed by discharging a conductive nanopaste of silver, gold, copper, or the like by a screen printing method, an ink jet method, or the like and baking the nanopaste.

The reduction prevention layer 218 is provided at least over a region (also referred to as a back channel region) in the oxide semiconductor layer 2132 between the electrodes 216 and 217, and has functions of preventing impurities such as moisture from entering the oxide semiconductor layer 2132 and preventing reduction of the back channel region. As the reduction prevention layer 218, a non-reducible film such as an oxide film made of silicon oxide, aluminum oxide, or the like can be used, for example. Note that the reduction prevention layer 218 should have a function of preventing reduction as one of its functions, and another function can be added to the reduction prevention layer 218.

Note that as the transistor 202 in the logic circuit shown in this embodiment, a thin film transistor can be used in which the threshold voltage is shifted by predetermined processing on a back channel region so that the thin film transistor is an enhancement transistor. Processing for controlling the density of oxygen vacancies (also referred to as oxide vacancy defects) is an example of the predetermined processing (such processing is also referred to as oxygen vacancy control processing). Examples of the oxygen vacancy control processing are oxygen plasma treatment, annealing treatment under an oxygen stream, and oxygen ion irradiation treatment. For example, the oxygen plasma treatment refers to treatment in which a surface of an oxide semiconductor layer is treated with radicals generated by glow discharge plasma of an oxygen gas, and instead of using only oxygen, a mixture gas of an oxygen gas and a rare gas may be employed as the gas used for generating plasma. By using the thin film transistor, a logic circuit using a plurality of transistors whose threshold voltages are different from each other can be formed more easily even when a transistor using an oxide semiconductor is used. The density of oxygen vacancies of the transistors 201 and 202 are made different from each other with the oxygen vacancy control processing, so that a logic circuit including both a depletion transistor and an enhancement transistor can be formed.

Figure 10A:
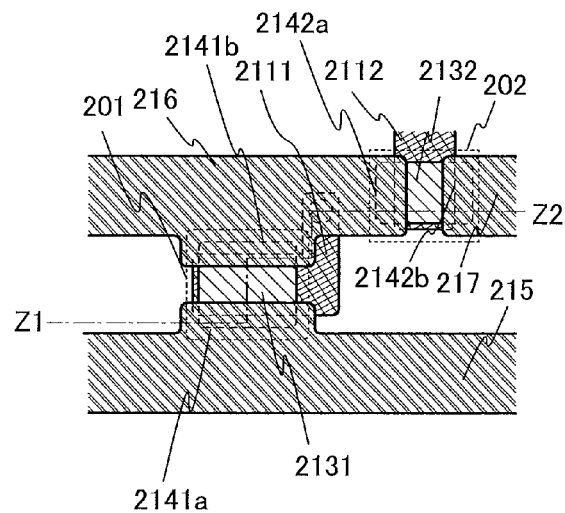
FIGS. 10A and 10B illustrate a structure of a logic circuit in Embodiment 1.
Figure 10B:
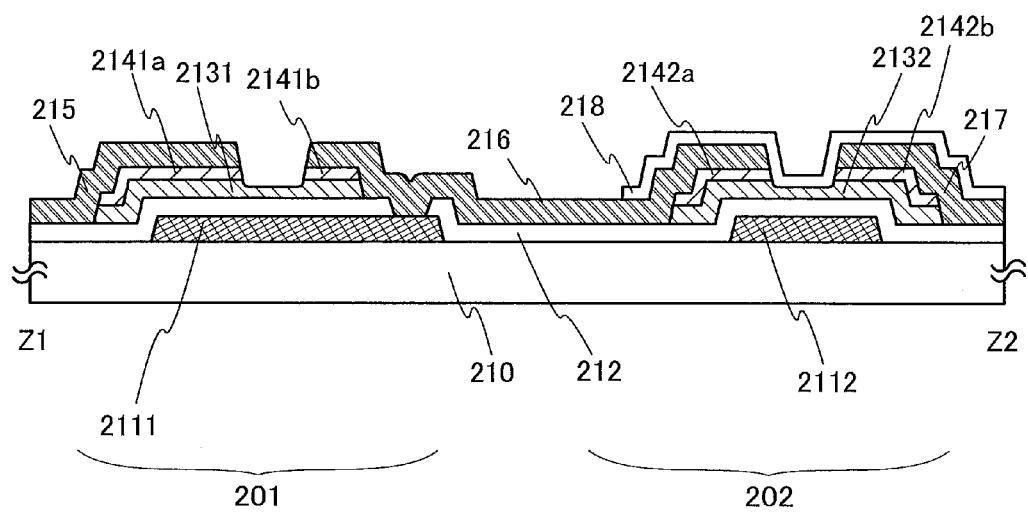

In addition, in the logic circuit in this embodiment, one of a source electrode and a drain electrode of one transistor may be directly connected to a gate electrode of another transistor. The logic circuit with such a structure will be described with reference to FIGS. 10A and 10B. FIGS. 10A and 10B illustrate a structure of the logic circuit in this embodiment. FIG. 10A is a top view of the logic circuit. FIG. 10B is a cross-sectional view of the logic circuit along Z1-Z2 in FIG. 10A. Note that in the logic circuit illustrated in FIGS. 10A and 10B, the description of the logic circuit illustrated in FIGS. 9A to 9C is employed as appropriate for the same portion as the logic circuit in FIGS. 9A to 9C.

Like the logic circuit in FIGS. 9A to 9C, the logic circuit in FIGS. 10A and 10B includes the transistors 201 and 202. Further, in the transistor 201 of the logic circuit in FIGS. 10A and 10B, the gate electrode 2111 is directly connected to the electrode 216 through an opening portion provided in the gate insulating layer 212.

In the logic circuit using the transistor in which the gate electrode 2112 and the electrode 216 are connected through the opening portion provided in the gate insulating layer 212 as described above, satisfactory contact can be obtained, and contact resistance can be reduced. Accordingly, the number of openings can be reduced, which results in reducing the area occupied by the logic circuit.

As described above, a logic circuit including transistors whose threshold voltages are different from each other can be provided by using thin film transistors including an oxide semiconductor. Moreover, by using the thin film transistors including the oxide semiconductor, the logic circuit can operate at high speed. Further, since the logic circuit can be formed using transistors of the same conductivity type, the process can be simplified as compared to that of a logic circuit using transistors of different conductivity types.

(Embodiment 2)

In this embodiment, a shift register using the logic circuit illustrated in FIG. 3 in Embodiment 1 as a unit sequential logic circuit will be described. Note that in this embodiment, the case where the logic circuit in FIG. 3 serves as the unit sequential logic circuit is described as an example.

Figure 11:
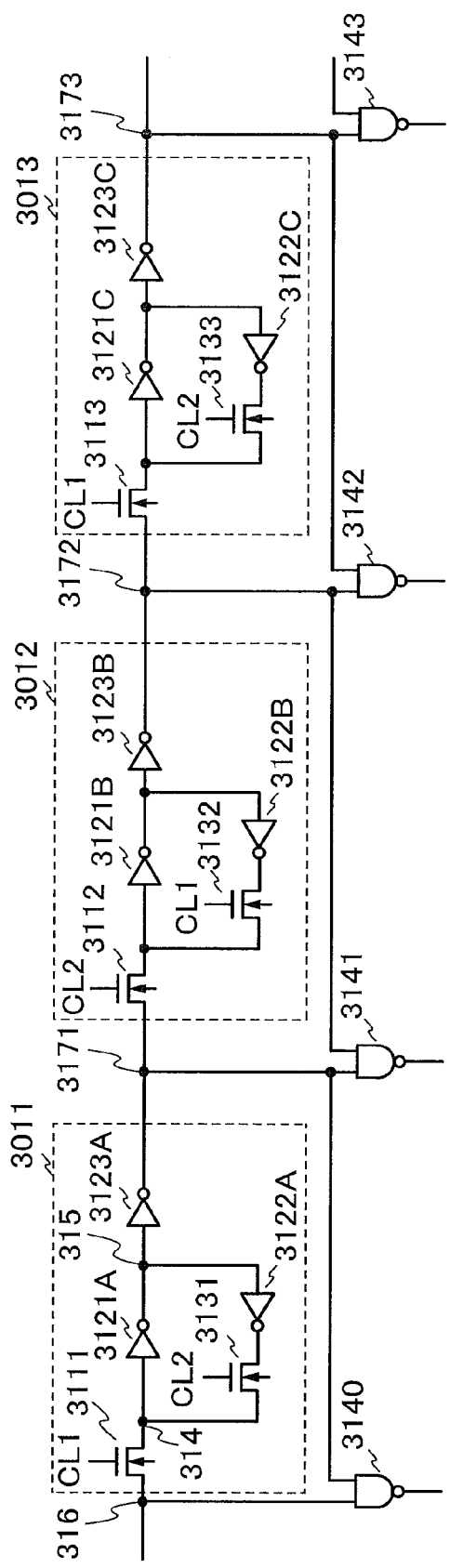
FIG. 11 is a circuit diagram illustrating a circuit configuration of a logic circuit in Embodiment 2.

The shift register in this embodiment includes a plurality of logic circuits in FIG. 3 in Embodiment 1 as unit sequential logic circuits, and a plurality of unit sequential logic circuits are electrically connected to each other in series. A specific structure will be described with reference to FIG. 11. FIG. 11 is a circuit diagram illustrating a structure of the shift register in this embodiment.

The shift register illustrated in FIG. 11 includes a logic circuit 3011, a logic circuit 3012, a logic circuit 3013, a NAND circuit 3140, a NAND circuit 3141, a NAND circuit 3142, and a NAND circuit 3143. Note that although FIG. 11 illustrates three (also referred to as three-stage) unit sequential logic circuits, one embodiment of the invention is not limited thereto and may include at least two-stage unit sequential logic circuits.

The logic circuit 3011 includes a transistor 3111, an inverter 3121A, an inverter 3122A, an inverter 3123A, and a transistor 3131. The logic circuit 3011 has the same circuit configuration as the logic circuit in FIG. 3. Specifically, the transistor 3111 corresponds to the transistor 111; the inverter 3121A, the inverter 1121; the inverter 3122A, the inverter 1122; the inverter 3123A, the inverter 1123; and the transistor 3131, the transistor 113. Therefore, the description of the logic circuit in FIG. 3 is employed as appropriate for each element. Moreover, in the logic circuit 3011, a first clock signal is input to a gate of the transistor 3111, and a second clock signal is input to a gate of the transistor 3131.

The logic circuit 3012 includes a transistor 3112, an inverter 3121B, an inverter 3122B, an inverter 3123B, and a transistor 3132. The logic circuit 3012 has the same configuration as the logic circuit in FIG. 3. Specifically, the transistor 3112 corresponds to the transistor 111; the inverter 3121B, the inverter 1121; the inverter 3122B, the inverter 1122; the inverter 3123B, the inverter 1123; and the transistor 3132, the transistor 113. Therefore, the description of the logic circuit in FIG. 3 is employed as appropriate for each element. Moreover, in the logic circuit 3012, the second clock signal is input to a gate of the transistor 3112, and the first clock signal is input to a gate of the transistor 3132.

The logic circuit 3013 includes a transistor 3113, an inverter 3121C, an inverter 3122C, an inverter 3123C, and a transistor 3133. The logic circuit 3013 has the same configuration as the logic circuit in FIG. 3. Specifically, the transistor 3113 corresponds to the transistor 111; the inverter 3121C, the inverter 1121; the inverter 3122C, the inverter 1122; the inverter 3123C, the inverter 1123; and the transistor 3133, the transistor 113. Therefore, the description of the logic circuit in FIG. 3 is employed as appropriate for each element. Moreover, in the logic circuit 3013, the first clock signal is input to a gate of the transistor 3113, and the second clock signal is input to a gate of the transistor 3133.

An output terminal of the inverter 3123A in the logic circuit 3011 is electrically connected to one of a source and a drain of the transistor 3112 in the logic circuit 3012. An output terminal of the inverter 3123B in the logic circuit 3012 is electrically connected to one of a source and a drain of the transistor 3113 in the logic circuit 3013.

Further, in the logic circuit 3011, one of a source and a drain of the transistor 3111 is electrically connected to a first input terminal of the NAND circuit 3140, and the output terminal of the inverter 3123A is electrically connected to a second input terminal of the NAND circuit 3140 and a first input terminal of the NAND circuit 3141. In the logic circuit 3012, one of the source and the drain of the transistor 3112 is electrically connected to the second input terminal of the NAND circuit 3140 and the first input terminal of the NAND circuit 3141, and the output terminal of the inverter 3123B is electrically connected to a second input terminal of the NAND circuit 3141 and a first input terminal of the NAND circuit 3142. In the logic circuit 3013, one of the source and the drain of the transistor 3113 is electrically connected to the second input terminal of the NAND circuit 3141 and the first input terminal of the NAND circuit 3142, and an output terminal of the inverter 3123C is electrically connected to a second input terminal of the NAND circuit 3142 and a first input terminal of the NAND circuit 3143.

Figure 12:
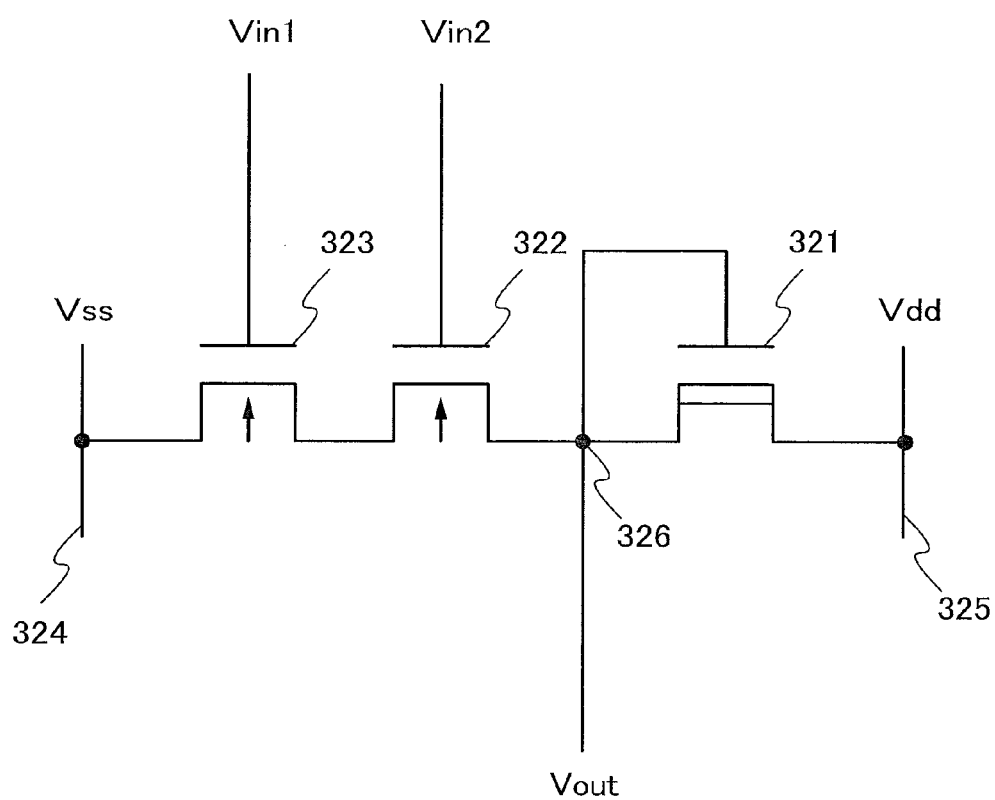
FIG. 12 is a circuit diagram illustrating a circuit configuration of a NAND circuit in Embodiment 2.

Each of the NAND circuits 3140 to 3143 can be constituted by transistors having the same conductivity type as the transistors included in the logic circuits. By using transistors of the same conductivity type, the NAND circuit can be formed in the same process as the logic circuit, and thus can be easily formed. A circuit configuration of a NAND circuit including transistors of the same conductivity type will be described with reference to FIG. 12. FIG. 12 is a circuit diagram illustrating a circuit configuration of a NAND circuit in this embodiment.

The NAND circuit illustrated in FIG. 12 includes a transistor 321, a transistor 322, and a transistor 323.

The transistor 321 is a depletion transistor. One of a source and a drain of the transistor 321 is electrically connected to a power supply line 325, and a high power supply voltage is applied to one of the source and the drain. A gate and the other of the source and the drain of the transistor 321 are electrically connected to each other The transistor 322 is an enhancement transistor. One of a source and a drain of the transistor 322 is electrically connected to the other of the source and the drain of the transistor 321.

The transistor 323 is an enhancement transistor. One of a source and a drain of the transistor 323 is electrically connected to the other of the source and the drain of the transistor 322. The other of the source and the drain of the transistor 323 is electrically connected to a power supply line 324, and a low power supply voltage is applied to the other of the source and the drain of the transistor 323.

In the logic circuit in this embodiment, a first input signal is input to a gate of the transistor 323, a second input signal is input to a gate of the transistor 322, and a voltage (V326) of a node 326 between the transistor 322 and the transistor 321 is output as an output signal.

Next, operation of the NAND circuit illustrated in FIG. 12 will be described.

Figure 13A:
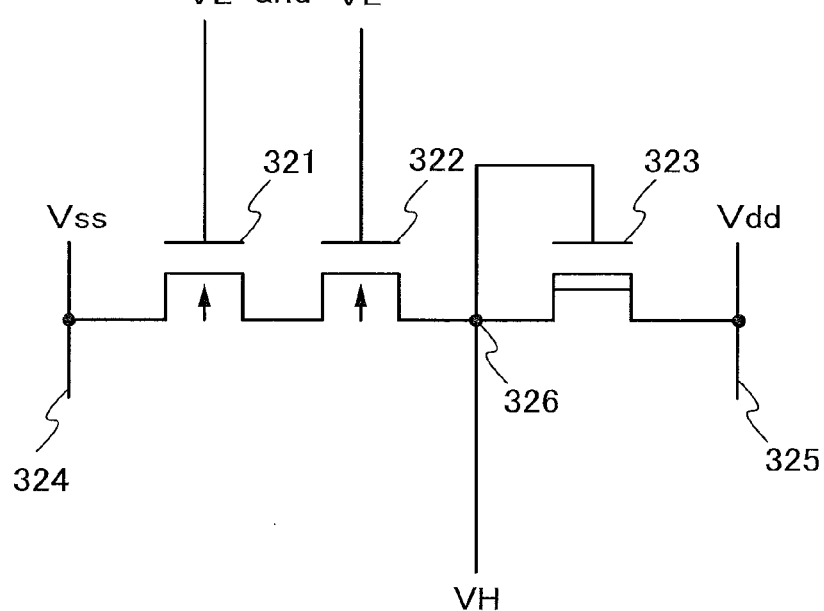
FIGS. 13A and 13B are circuit diagrams each illustrating operation of a NAND circuit in Embodiment 2.
Figure 13B:
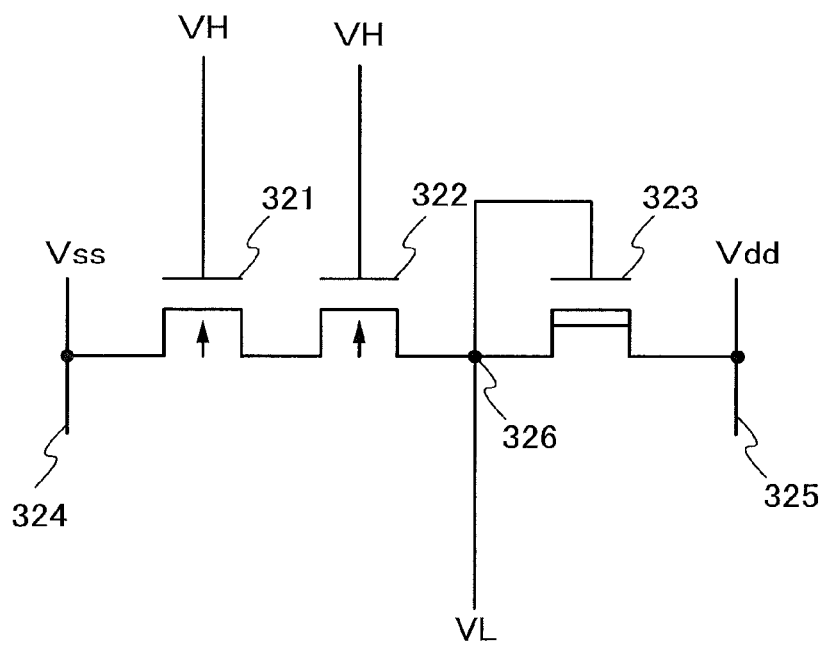

The operation of the NAND circuit in FIG. 12 can be classified into two categories depending on whether at least one of a voltage (Vin1) of the first input signal and a voltage (Vin2) of the second input signal is low or the voltages of the first and second input signals are high. Both cases will be described with reference to FIGS. 13A and 13B. FIGS. 13A and 13B illustrate operation of the NAND circuit in this embodiment. Note that in this embodiment, the case where data is 0 in a low state and data is 1 in a high state is described as an example; however, one embodiment of the invention is not limited thereto, and data can be 1 in a low state and can be 0 in a high state.

FIG. 13A illustrates the operation in the case where Vin1=VH and Vin2=VL, the case where Vin1=VL and Vin2=VH, and the case where Vin1=VL and Vin2=VL. At this time, one or both of the transistors 322 and 323 is/are turned off, and the resistance (R322+R323) of the transistors 322 and 323 is higher than the resistance (R321) of the transistor 321, that is, (R322+R323)>R321; accordingly, V326 is VH, and a voltage (Vout) of the output signal is VH.

FIG. 13B illustrates the operation in the case where Vin1=VH and Vin2=VH. At this time, the transistors 321 and 322 are turned on, and it follows that R322+R323<R321; accordingly, V326 is VL, and Vout is VL. The above is the operation of the NAND circuit illustrated in FIG. 12.

When the NAND circuit is formed using transistors of the same conductivity type as described above, it can be formed in the same process as another logic circuit. Moreover, one embodiment of the invention is not limited to the structure in FIG. 12, and the NAND circuit can have another structure if it can have the same function.

Figure 14:
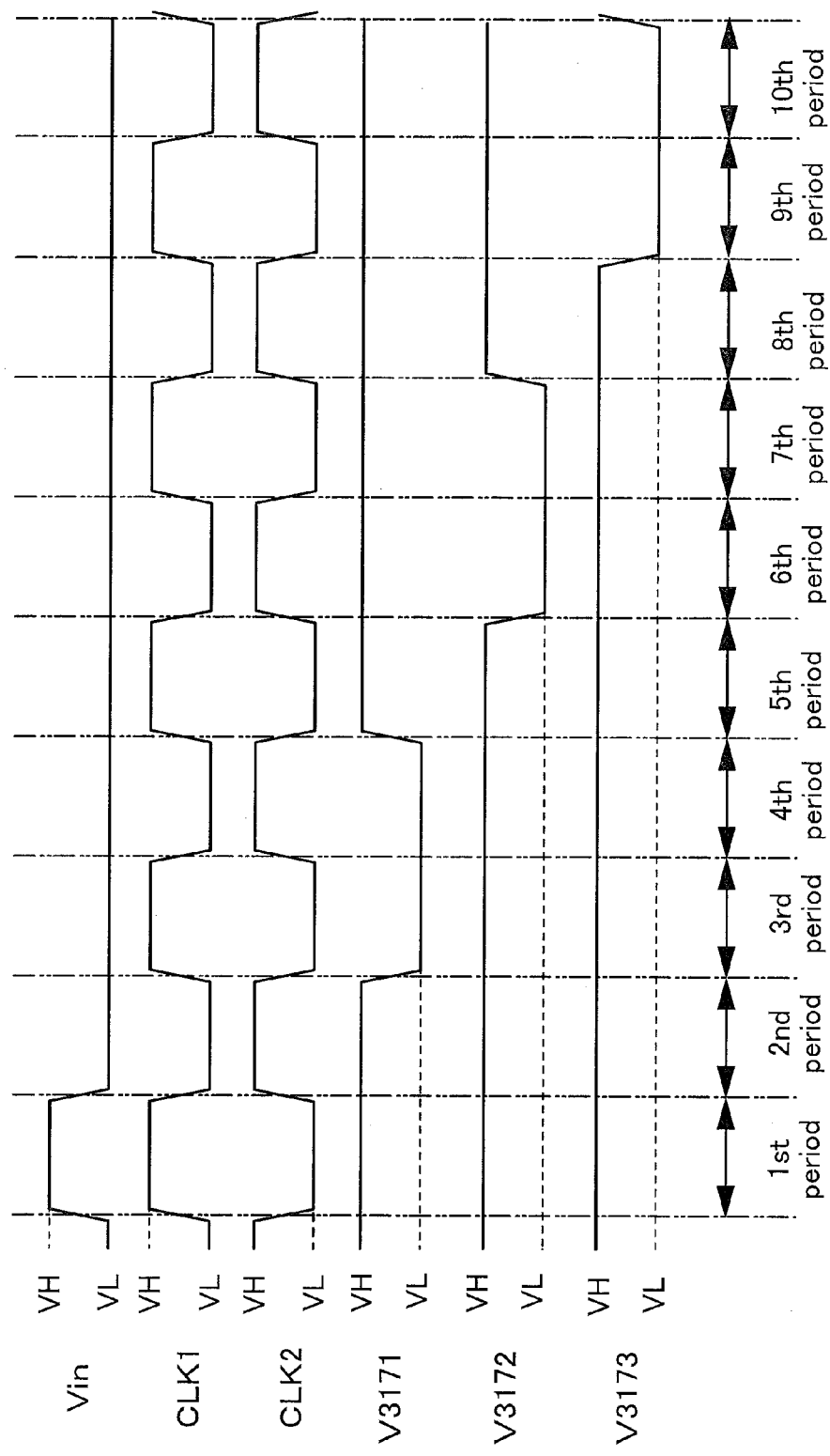
FIG. 14 is a timing chart illustrating operation of a logic circuit in Embodiment 2.

Next, operation of the shift register illustrated in FIG. 11 will be described with reference to FIG. 14. FIG. 14 is a timing chart illustrating the operation of the shift register in FIG. 11.

In the shift register in FIG. 11, the operations of the logic circuit, which are illustrated in FIGS. 4A and 4B, FIGS. 5C and 5D, and FIG. 6, are sequentially performed in each of the logic circuits 3011 to 3013. For the operation of each logic circuit, the description of the operation of the logic circuit illustrated in FIGS. 4A and 4B, FIGS. 5C and 5D, and FIG. 6 is employed as appropriate.

The operation of the shift register in this embodiment is classified into ten periods as illustrated in FIG. 14. In a first period, a voltage Vin of an input signal to the logic circuit 3011 is VH. In a second period and a third period, a voltage (V3171) of a node 3171 between the logic circuit 3011 and the logic circuit 3012 is changed from VH to VL. Further, in the third period and a fourth period, a voltage of an output signal from the NAND circuit 3140 is VH.

In the fourth period and a fifth period, a voltage of an input signal to the logic circuit 3012 (an output signal from the logic circuit 3011) is changed from VL to VH. In the fifth period and a sixth period, a voltage (V3172) of a node 3172 between the logic circuit 3012 and the logic circuit 3013 is changed from VH to VL. In the sixth period and a seventh period, a voltage of an output signal from the NAND circuit 3141 is VH.

In the seventh period and an eighth period, a voltage of an input signal to the logic circuit 3013 (an output signal from the logic circuit 3012) is changed from VL to VH. In the eighth period and a ninth period, a voltage (V3173) of a node 3173 between the logic circuit 3013 and a next-stage logic circuit is changed from VH to VL. In the ninth period and a tenth period, a voltage of an output signal from the NAND circuit 3142 is VH.

When another logic circuit is connected to an output terminal of the logic circuit 3013, a voltage of an input signal is changed from VL to VH in a given period and a voltage of an output signal is changed to VH in another given period as described above. Moreover, in a period where a voltage of the output signal from another logic circuit is VL, a voltage of an output signal from the NAND circuit 3143 is VH.

As described above, a shift register can be constituted by logic circuits including TFTs using an oxide semiconductor. The TFT using the oxide semiconductor has higher mobility than a conventional TFT using amorphous silicon; therefore, by applying the TFT using the oxide semiconductor to the shift register, the shift register can operate at high speed.

Note that this embodiment can be implemented in combination with other embodiments as appropriate.

(Embodiment 3)

In this embodiment, a logic circuit including a transistor having a structure different from that in the above embodiment will be described.

Figure 15A:
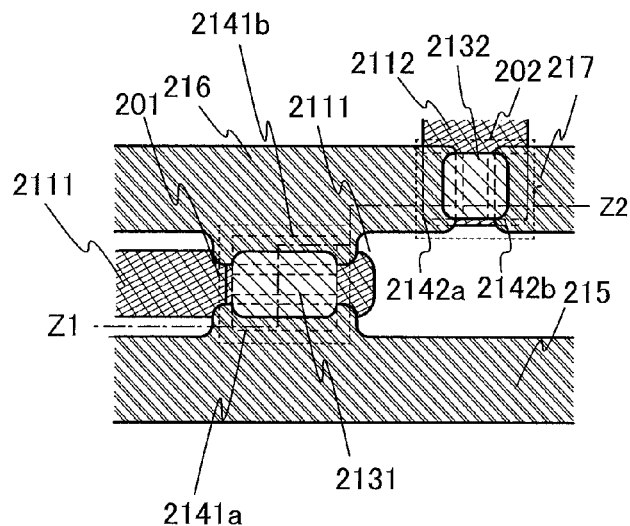
FIGS. 15A and 15B illustrate a structure of a logic circuit in Embodiment 3.
Figure 15B:
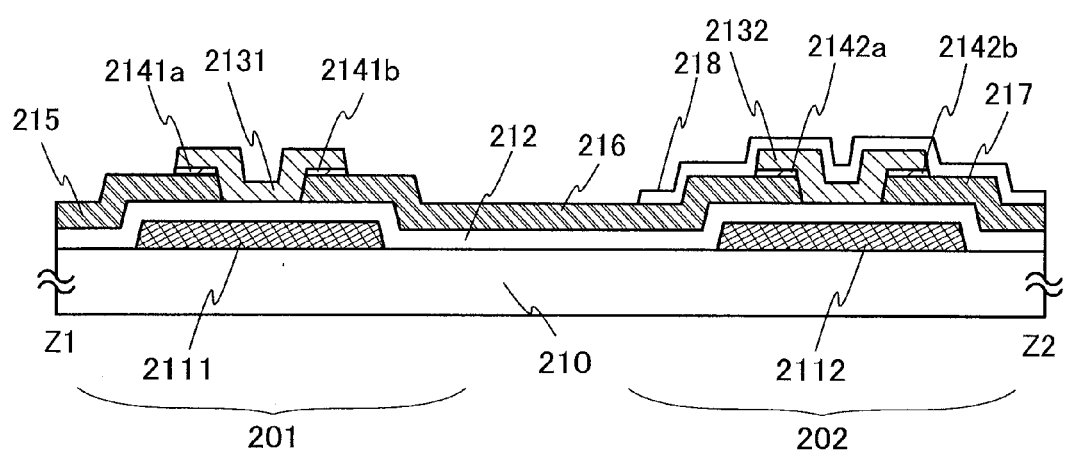

A logic circuit which is one embodiment of the invention disclosed in this specification can be formed using not only transistors with the structures illustrated in FIGS. 9A to 9C but also transistors with another structure. A logic circuit to which a transistor with another structure is applied will be described with reference to FIGS. 15A and 15B. FIGS. 15A and 15B illustrate a structure of the logic circuit in this embodiment. FIG. 15A is a top view, and FIG. 15B is a cross-sectional view of the logic circuit along Z1-Z2 in FIG. 15A. Note that in the logic circuit illustrated in FIGS. 15A and 15B, the description of the logic circuit illustrated in FIGS. 9A to 9C is employed as appropriate for the same portion as the logic circuit in FIGS. 9A to 9C.

Like the logic circuit in FIGS. 9A to 9C, the logic circuit in FIGS. 15A and 15B includes the transistor 201 and the transistor 202.

Moreover, in the transistor 201 of the logic circuit in FIGS. 15A and 15B, the gate electrode 2111 is provided over the substrate 210. The gate insulating layer 212 is provided over the gate electrode 2111. The electrodes 215 and 216, which are a pair of electrodes, are provided over the gate insulating layer 212. The oxide semiconductor layers 2141a and 2141b are provided over the electrodes 215 and 216. The oxide semiconductor layer 2131 is provided over the gate insulating layer 212 and the electrodes 215 and 216.

In the transistor 202, the gate electrode 2112 is provided over the substrate 210. The gate insulating layer 212 is provided over the gate electrode 2112. The electrodes 216 and 217, which are a pair of electrodes, are provided over the gate insulating layer 212. The oxide semiconductor layers 2142a and 2142b are provided over the electrodes 216 and 217. The oxide semiconductor layer 2132 is provided over the gate insulating layer 212, the oxide semiconductor layers 2142a and 2142b, and the electrodes 216 and 217. The reduction prevention layer 218 is provided over a region in the oxide semiconductor layer 2132 between the electrodes 216 and 217. Note that the oxide semiconductor layers 2141a and 2141b correspond to the oxide semiconductor layers 2141a and 2141b in the logic circuit illustrated in FIGS. 9A and 9B, and the oxide semiconductor layers 2142a and 2142b correspond to the oxide semiconductor layers 2142a and 2142b in the logic circuit illustrated in FIGS. 9A and 9B.

The logic circuit illustrated in FIGS. 15A and 15B includes a transistor in which the oxide semiconductor layers 2131 and 2132 are formed over the electrodes 215 to 217 and the oxide semiconductor layers 2141a, 2141b, 2142a, and 2142b (such a structure is also referred to as a bottom-contact type). When the logic circuit which is one embodiment of the invention disclosed in this specification is formed using a bottom-contact transistor, the area where the oxide semiconductor layer and the electrode are in contact with each other can be increased, so that peeling or the like can be prevented.

In addition, as the transistor 202 in the logic circuit in FIGS. 15A and 15B, a thin film transistor can be used in which the threshold voltage is shifted by predetermined processing on a back channel region so that the thin film transistor is an enhancement transistor, as in the logic circuit in FIGS. 9A to 9C. The processing shown in Embodiment 1 can be applied to the predetermined processing.

Note that the oxide semiconductor layers 2141a, 2141b, 2142a, and 2142b are provided in the logic circuit in FIGS. 15A and 15B as in the logic circuit in FIGS. 9A and 9B; however, one embodiment of the invention is not limited thereto, and a structure where the oxide semiconductor layers 2141a, 2141b, 2142a, and 2142b are not provided may be employed.

Further, in the logic circuit in FIGS. 15A and 15B, the gate electrode 2112 of the transistor 202 and the electrode 216 can be in contact with each other through an opening portion provided in the gate insulating layer 212, as in the logic circuit illustrated in FIGS. 10A and 10B.

Note that this embodiment can be implemented in combination with other embodiments as appropriate.

(Embodiment 4)

In this embodiment, a logic circuit including a transistor having a structure different from those in the above embodiments will be described.

Figure 16A:
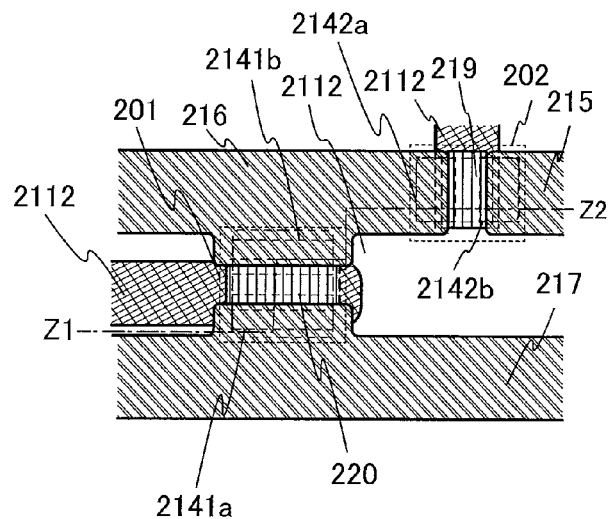
FIGS. 16A and 16B illustrate a structure of a logic circuit in Embodiment 4.
Figure 16B:
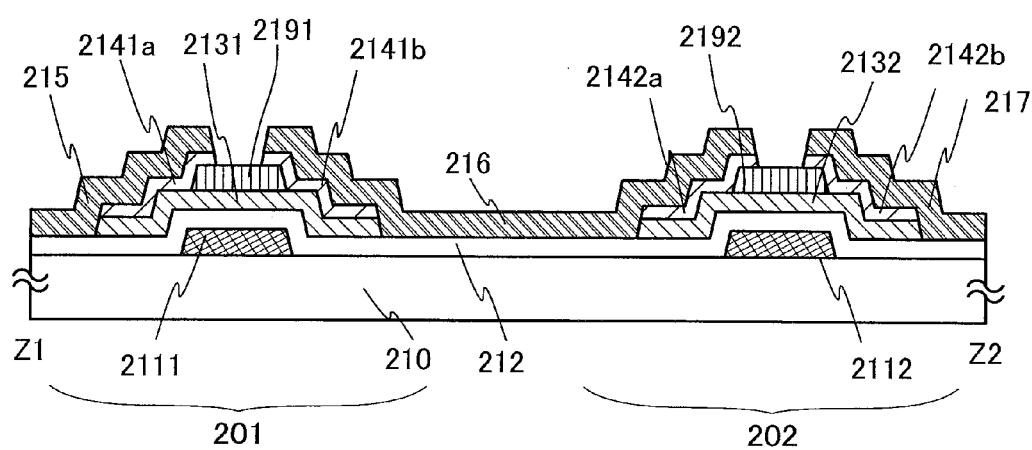

A logic circuit can be formed using not only transistors with the structures illustrated in FIGS. 9A to 9C and FIGS. 15A and 15B but also transistors with another structure. A logic circuit to which a transistor with a structure which is different from those in FIGS. 9A to 9C and FIGS. 15A and 15B is applied will be described with reference to FIGS. 16A and 16B. FIGS. 16A and 16B illustrate a structure of the logic circuit in this embodiment. FIG. 16A is a top view, and FIG. 16B is a cross-sectional view along Z1-Z2 in FIG. 16A. Note that in the logic circuit illustrated in FIGS. 16A and 16B, the description of the logic circuit illustrated in FIGS. 9A to 9C is employed as appropriate for the same portion as the logic circuit in FIGS. 9A to 9C.

Like the logic circuit in FIGS. 9A to 9C, the logic circuit in FIGS. 16A and 16B includes the transistor 201 and the transistor 202.

In the transistor 201 of the logic circuit in FIGS. 16A and 16B, the gate electrode 2111 is provided over the substrate 210. The gate insulating layer 212 is provided over the gate electrode 2111. The oxide semiconductor layer 2131 is provided over the gate insulating layer 212. A buffer layer 2191 is provided over part of the oxide semiconductor layer 2131. The oxide semiconductor layers 2141a and 2141b are provided over the oxide semiconductor layer 2131 and the buffer layer 2191. The electrodes 215 and 216, which are a pair of electrodes, are provided over the oxide semiconductor layers 2141a and 2141b, respectively.

In the transistor 202, the gate electrode 2112 is provided over the substrate 210. The gate insulating layer 212 is provided over the gate electrode 2112. The oxide semiconductor layer 2132 is provided over the gate insulating layer 212. A buffer layer 2192 is provided over a region in the oxide semiconductor layer 2132 between the electrodes 216 and 217. The oxide semiconductor layers 2142a and 2142b are provided over the oxide semiconductor layer 2132 and the buffer layer 2192. The electrodes 216 and 217, which are a pair of electrodes, are provided over the oxide semiconductor layers 2142a and 2142b, respectively.

For the buffer layers 2191 and 2192, an inorganic material (e.g., silicon oxide, silicon nitride, silicon oxynitride, or silicon nitride oxide) can be used. Alternatively, a photosensitive or non-photosensitive organic material (organic resin material, for example, polyimide, acrylic, polyamide, polyimide-amide, resist, or benzocyclobutene), a film made of plural kinds of these materials, or a layered film of such films can be used, or siloxane may be used. As a method for manufacturing the buffer layers 2191 and 2192, a vapor deposition method such as a plasma CVD method or a thermal CVD method, or a sputtering method can be used. Alternatively, a coating method such as a spin coating method, a droplet discharging method, or a printing method (such as screen printing or offset printing by which a pattern is formed), which is a wet process, may be used. The buffer layers 2191 and 2192 may be formed in such a manner that a film is deposited and then etched so that the shape is processed, or may be selectively formed by a droplet discharging method or the like.

The logic circuit illustrated in FIGS. 16A and 16B includes a transistor in which the buffer layer is provided (such a structure is also referred to as a channel-stop type). For example, when the buffer layer is formed using a non-reducible film (formed of silicon oxide or aluminum oxide, for example), the buffer layer can function as a reduction prevention later; accordingly, the logic circuit which is one embodiment of the invention disclosed in this specification can be formed using a transistor with the same structure as a conventional channel-stop transistor.

In addition, as the transistor 202 in the logic circuit in FIGS. 16A and 16B, a thin film transistor can be used in which the threshold voltage is shifted by predetermined processing on a back channel region so that the thin film transistor is an enhancement transistor. The processing shown in Embodiment 1 can be applied to the predetermined processing.

Note that the oxide semiconductor layers 2141a, 2141b, 2142a, and 2142b are provided in the logic circuit in FIGS. 16A and 16B as in the logic circuit in FIGS. 9A and 9B; however, one embodiment of the invention is not limited thereto, and a structure where the oxide semiconductor layers 2141a, 2141b, 2142a, and 2142b are not provided may be employed.

Further, in the logic circuit in FIGS. 16A and 16B, the gate electrode 2112 of the transistor 202 and the electrode 216 can be in contact with each other through an opening portion provided in the gate insulating layer 212, as in the logic circuit illustrated in FIGS. 10A and 10B.

Note that this embodiment can be implemented in combination with other embodiments as appropriate.

(Embodiment 5)

In this embodiment, a method for manufacturing a logic circuit will be described. Note that in this embodiment, a method for manufacturing the logic circuit illustrated in FIGS. 9A and 9B is described as an example.

A method for manufacturing a logic circuit in this embodiment will be described with reference to FIGS. 17A and 17B and FIGS. 18C and 18D. FIGS. 17A and 17B and FIGS. 18C and 18D are cross-sectional views illustrating a method for manufacturing the logic circuit in this embodiment.

Figure 17A:
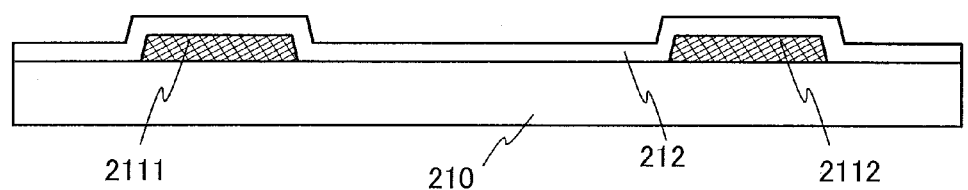
FIGS. 17A and 17B are cross-sectional views illustrating a method for manufacturing a logic circuit in Embodiment 5.

First, as illustrated in FIG. 17A, a first conductive film is formed over the substrate 210. The first conductive film is selectively etched using a first photomask so that the gate electrodes 2111 and 2112 are formed. Then, the gate insulating layer 212 is formed over the gate electrodes 2111 and 2112. The first conductive film can be formed by a sputtering method, for example. The gate insulating layer 212 can be formed by a plasma CVD method or a sputtering method. At this time, the gate electrodes 2111 and 2112 are preferably formed to be tapered.

Next, a first oxide semiconductor film is formed over the gate insulating layer 212, and a second oxide semiconductor film is formed thereover. The first oxide semiconductor film can be formed by a sputtering method, for example. Note that before the first oxide semiconductor film is formed, reverse sputtering in which plasma is generated by introduction of an argon gas is preferably performed to remove dust attached to a surface of the gate insulating layer 212 and a bottom surface of an opening portion. The reverse sputtering is a method in which voltage is applied to the substrate side, not to the target side, using an RF power supply in an argon atmosphere to generate plasma on the substrate so that a surface of the substrate is modified. Note that nitrogen, helium, or the like may be used instead of the argon atmosphere. Further, the reverse sputtering may be performed in an atmosphere where oxygen, hydrogen, $N_2O$, or the like is added to the argon atmosphere or in an atmosphere where $Cl_2$, $CF_4$, or the like is added to the argon atmosphere.

Figure 17B:
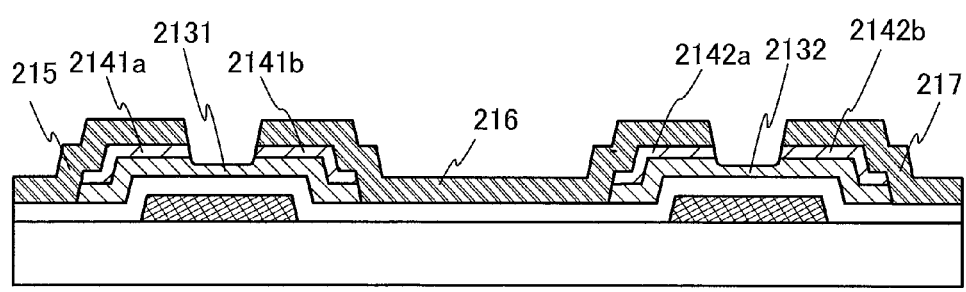

Next, the first and second oxide semiconductor films are etched using a second photomask, and then, a second conductive film is formed. The second conductive film can be formed by a sputtering method, for example. Moreover, the second conductive film is selectively etched using a third photomask, so that the electrodes 215, 216, and 217 are formed as illustrated in FIG. 17B. Note that before the second conductive film is formed, reverse sputtering in which plasma is generated by introduction of an argon gas is preferably performed to remove dust attached to the surface of the gate insulating layer 212 and the etched oxide semiconductor layers.

Note that when the second conductive film is etched, the first and second oxide semiconductor layers are partly etched. Accordingly, as illustrated in FIG. 15B, the oxide semiconductor layers 2131 and 2132 are formed over the gate insulating layer 212, the oxide semiconductor layers 2141a and 2141b are formed over the oxide semiconductor layer 2131, and the oxide semiconductor layers 2142a and 2142b are formed over the oxide semiconductor layer 2132. By this etching, portions of the oxide semiconductor layers 2131 and 2132, which overlap with the gate electrodes 2111 and 2112, are made thinner.

Wet etching or dry etching is used as an etching method at this time. For example, when an aluminum film or an aluminum alloy film is used as the second conductive film, wet etching can be performed using a solution in which phosphoric acid, acetic acid, and nitric acid are mixed. In this etching step, the oxide semiconductor layers 2131 and 2132 are also partly etched. Further, since the oxide semiconductor layers 2141a, 2141b, 2142a, and 2142b and the electrodes 215 to 217 are etched at one time, the edges of the oxide semiconductor layers 2141a, 2141b, 2142a, and 2142b and the electrodes 215 to 217 are aligned, so that a smooth side surface is formed. Moreover, in the case of using wet etching, etching is isotropically performed, and the edges of the electrodes 215 to 217 are recessed with respect to the edge of a resist mask.

Figure 18C:
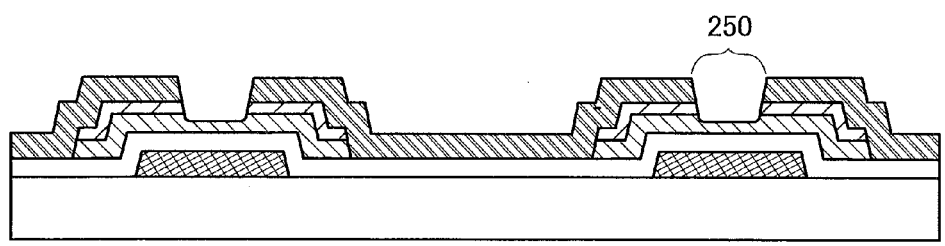
FIGS. 18C and 18D are cross-sectional views illustrating a method for manufacturing a logic circuit in Embodiment 5.

In addition, in the method for manufacturing the logic circuit in this embodiment, as an example, oxygen vacancy control processing is performed on an oxide semiconductor layer in a transistor functioning as an enhancement transistor (the oxide semiconductor layer 2132 in this embodiment). As illustrated in FIG. 18C, the oxygen vacancy control processing is performed, so that an oxygen vacancy control region 250 with a low oxygen vacancy density is formed between the electrodes 216 and 217 over a surface of the oxide semiconductor layer 2132, which is opposite to a surface in contact with the gate insulating layer 212. In this embodiment, oxygen plasma treatment is performed as an example of the oxygen vacancy control processing. The processing conditions are set as appropriate so that the threshold voltage of a transistor to be formed is positive.

Note that in FIG. 18C, the oxygen plasma treatment should be performed at least on the oxide semiconductor layer 2132 and not necessarily on the oxide semiconductor layer 2131. For example, when only the oxide semiconductor layer 2132 is to be subjected to the oxygen plasma treatment, the oxygen plasma treatment may be performed after a mask is formed over the oxide semiconductor layer 2131. Further, when the oxygen plasma treatment is performed on the oxide semiconductor layer 2131, the threshold voltage is shifted to a positive value; however, the threshold voltage is shifted due to the shift of the threshold voltage over time if a reduction prevention layer is not provided over the oxide semiconductor layer 2131. Thus, both a depletion transistor and an enhancement transistor can be manufactured. Moreover, when the oxygen plasma treatment is performed also on the oxide semiconductor layer 2131, an additional mask is not necessary, so that the process can be simplified.

Next, heat treatment is performed in the air or a nitrogen atmosphere. The heat treatment is preferably performed at 200° C. to 600° C., typically 300° C. to 500° C. With the heat treatment, atoms in the oxide semiconductor film are rearranged. Since distortion which prevents carrier transfer is eliminated by the heat treatment, the heat treatment (including light annealing) performed here is important. Note that there is no particular limitation on the timing when the heat treatment is performed as long as the heat treatment is performed after the oxide semiconductor film is formed, and the heat treatment can be performed any time after the semiconductor film is formed.

Figure 18D:
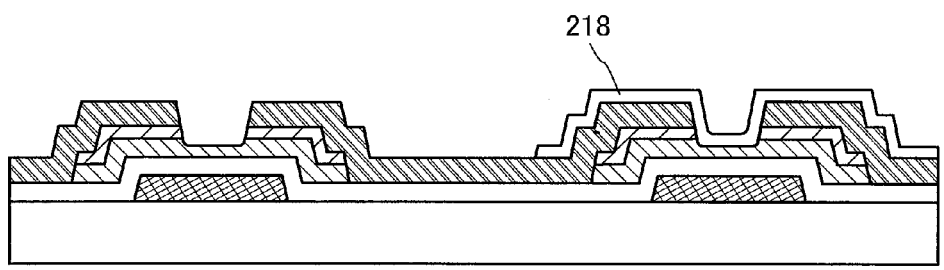

Then, as illustrated in FIG. 18D, the reduction prevention layer 218 is formed over a region between the electrodes 216 and 217, which includes the oxygen vacancy control region 250 in the oxide semiconductor layer (the oxide semiconductor layer 2132 in FIG. 18D) of the transistor which is to function as the enhancement transistor later. The reduction prevention layer 218 is formed only over the oxide semiconductor layer of the transistor functioning as the enhancement transistor, whereby a transistor including the semiconductor layer where the reduction prevention layer 218 is not provided serves as a depletion transistor; accordingly, transistors having different threshold voltages can be formed over one substrate. The reduction prevention layer 218 can be formed by a sputtering method, for example.

Note that the above-described order of steps is an example, and there is no particular limitation on the order of steps. For example, although one additional photomask needs to be used, etching may be performed in such a manner that the second conductive film is etched using one photomask and part of the oxide semiconductor layer and part of the oxide semiconductor film are etched using another photomask.

Alternatively, instead of performing the oxygen plasma treatment, the reduction prevention layer 218 may be formed by a sputtering method in FIG. 18D without the oxygen plasma treatment in FIG. 18C. This is because oxygen is used as a gas when the reduction prevention layer 218 is formed by a sputtering method, so that advantageous effect similar to those of the oxygen plasma treatment can be obtained.

By the above method, the logic circuit illustrated in FIGS. 9A and 9B can be formed. Moreover, by using the manufacturing method in this embodiment, a logic circuit using transistors which have different threshold voltages and are formed over one substrate can be formed.

Note that this embodiment can be implemented in combination with other embodiments as appropriate.

(Embodiment 6)

In this embodiment, a display device will be described as an example of a device to which the logic circuit shown in the above embodiments can be applied.

Figure 19:
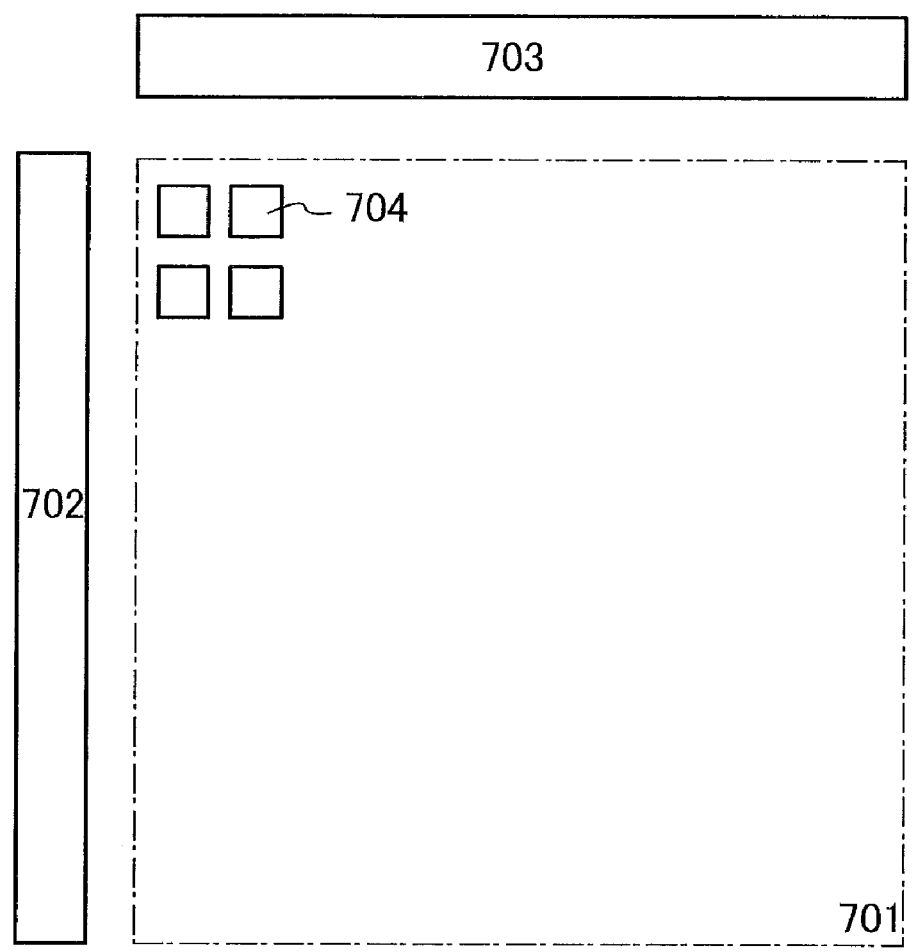
FIG. 19 is a block diagram illustrating a structure of a display device in Embodiment 6.

The logic circuits shown in the above embodiments can be applied to a variety of display devices such as a liquid crystal display device and an electroluminescent display device. A structure of a display device in this embodiment will be described with reference to FIG. 19. FIG. 19 is a block diagram illustrating a structure of the display device in this embodiment.

As illustrated in FIG. 19, the display device in this embodiment includes a pixel portion 701, a scan line driver circuit 702, and a signal line driver circuit 703.

The pixel portion 701 includes a plurality of pixels 704 and has a dot matrix structure. Specifically, the plurality of pixels 704 are arranged in the row and column directions. Each pixel 704 is electrically connected to the scan line driver circuit 702 through a scan line and electrically connected to the signal line driver circuit 703 through a signal line. Note that in FIG. 19, the scan line and the signal line are not illustrated for simplification.

The scan line driver circuit 702 is a circuit for selecting the pixel 704 to which a data signal is input, and outputs a selection signal to the pixel 704 through the scan line.

The signal line driver circuit 703 is a circuit for outputting data written to the pixel 704 as a signal, and outputs pixel data as a signal through the signal line to the pixel 704 selected by the scan line driver circuit 702.

The pixel 704 includes at least a display element and a switching element. A liquid crystal element or a light-emitting element such as an EL element can be applied to the display element, for example. A transistor can be applied to the switching element, for example.

Figure 20A:
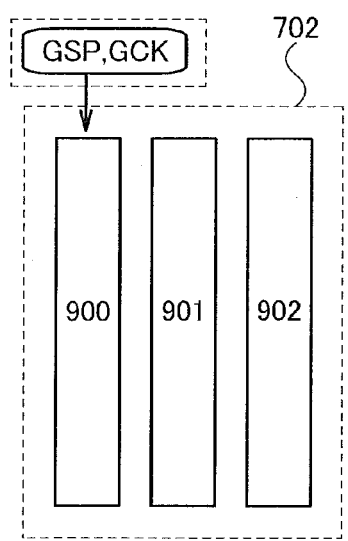
FIGS. 20A and 20B are block diagrams each illustrating a structure of a driver circuit in a display device shown in Embodiment 6.
Figure 20B:
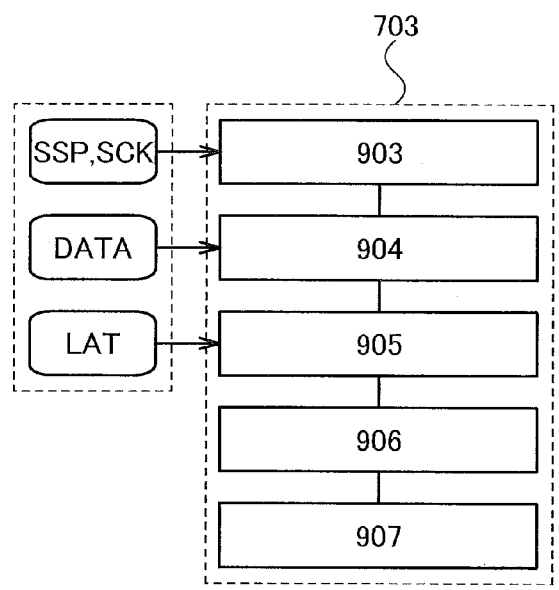

Next, an example of structures of the scan line driver circuit 702 and the signal line driver circuit 703 will be described with reference to FIGS. 20A and 20B. FIGS. 20A and 20B are block diagrams each illustrating a structure of the driver circuit. FIG. 20A is a block diagram illustrating a structure of the scan line driver circuit. FIG. 20B is a block diagram illustrating a structure of the signal line driver circuit.

As illustrated in FIG. 20A, the scan line driver circuit 702 includes a shift register 900, a level shifter 901, and a buffer 902.

Signals such as a gate start pulse (GSP) and a gate clock signal (GCK) are input to the shift register 900, and selection signals are sequentially output from sequential logic circuits. Moreover, the shift register shown in Embodiment 2 can be applied to the shift register 900.

Further, as illustrated in FIG. 20B, the signal line driver circuit 703 includes a shift register 903, a first latch circuit 904, a second latch circuit 905, a level shifter 906, and a buffer 907.

A signal such as a start pulse (SSP) is input to the shift register 903, and selection signals are sequentially output from the sequential logic circuits.

A data signal is input to the first latch circuit 904. The first latch circuit can be constituted by one or more of the logic circuits shown in the above embodiments, for example.

The buffer 907 has a function of amplifying a signal and includes an operational amplifier or the like. The buffer 907 can be constituted by one or more of the logic circuits shown in the above embodiments, for example.

The second latch circuit 905 can hold a latch (LAT) signal temporally and outputs the held latch signals all at once to the pixel portion 701 in FIG. 19. This is referred to as line sequential driving. Therefore, in the case of using a pixel in which not line sequential driving but dot sequential driving is performed, the second latch circuit 905 is not necessary. The second latch circuit 905 can be constituted by one or more of the logic circuits shown in the above embodiments, for example.

Next, operation of the display device illustrated in FIG. 19 will be described.

First, a scan line is selected by the scan line driver circuit 702. To the pixel 704 connected to the selected scan line, a data signal is output from the signal line driver circuit 703 through a signal line by a signal input from the scan line driver circuit 702. Accordingly, data is written to the pixel 704, and the pixel 704 enters into a display state. Scan lines are selected by the scan line driver circuit 702, and data is written to all the pixels 704. The above is the operation of the display device in this embodiment.

The circuits in the display device illustrated in FIG. 19 can all be provided over one substrate, or can be constituted by transistors of the same conductivity type. By providing the circuits over one substrate, the size of the display device can be reduced. By using transistors of the same conductivity type, the process can be simplified.

Note that this embodiment can be implemented in combination with other embodiments as appropriate.

(Embodiment 7)

In this embodiment, a liquid crystal display device will be described as an example of the display device shown in Embodiment 6.

Figure 21:
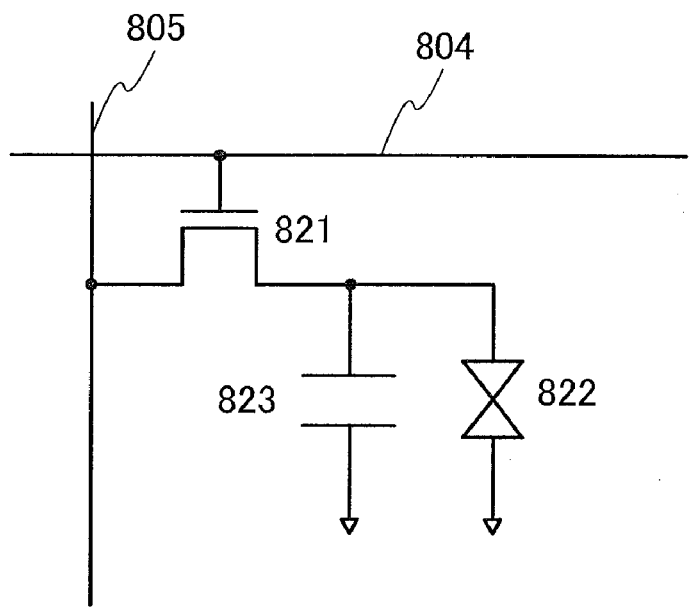
FIG. 21 is a circuit diagram illustrating a circuit configuration of a pixel in a display device in Embodiment 7.

An example of a circuit configuration of a pixel in a display device in this embodiment will be described with reference to FIG. 21. FIG. 21 is a circuit diagram illustrating a circuit configuration of a pixel in the display device in this embodiment.

As illustrated in FIG. 21, the pixel includes a transistor 821, a liquid crystal element 822, and a storage capacitor 823.

The transistor 821 functions as a selection switch. A gate of the transistor 821 is electrically connected to a scan line 804, and one of a source and a drain thereof is electrically connected to a signal line 805.

The liquid crystal element 822 has a first terminal and a second terminal. The first terminal is electrically connected to the other of the source and the drain of the transistor 821. A ground potential or a voltage with a given value is applied to the second terminal. The liquid crystal element 822 includes a first electrode which serves as part or all of the first terminal, a second electrode which serves as part or all of the second terminal, and a layer including liquid crystal molecules whose transmittance is changed by applying voltage between the first electrode and the second electrode (such a layer is referred to as a liquid crystal layer).

The storage capacitor 823 has a first terminal and a second terminal. The first terminal is electrically connected to the other of the source and the drain of the transistor 821. The ground potential or a voltage with a given value is applied to the second terminal. The storage capacitor 823 includes a first electrode which serves as part or all of the first terminal, a second electrode which serves as part or all of the second terminal, and a dielectric layer. Note that although the storage capacitor 823 is not necessarily provided, the provision of the storage capacitor 823 can reduce adverse effects due to leakage current of the transistor 821.

Note that for the display device in this embodiment, a TN (twisted nematic) mode, an IPS (in-plane-switching) mode, an FFS (fringe field switching) mode, an MVA (multi-domain vertical alignment) mode, a PVA (patterned vertical alignment) mode, an ASM (axially symmetric aligned micro-cell) mode, an OCB (optical compensated birefringence) mode, an FLC (ferroelectric liquid crystal) mode, an AFLC (antiferroelectric liquid crystal) mode, or the like can be used.

Alternatively, blue-phase liquid crystal for which an alignment film is not necessary may be used. The blue phase is a kind of liquid crystal phase and appears just before phase transition from a cholesteric phase to an isotropic phase when temperature of cholesteric liquid crystal rises. Since the blue phase appears only in a narrow temperature range, a liquid crystal composition in which 5 wt. % or more of a chiral material is mixed is used for the liquid crystal layer in order to improve the temperature range. As for the liquid crystal composition which contains blue-phase liquid crystal and the chiral material, the response speed is as high as 10 μs to 100 μs, alignment treatment is not necessary due to optical isotropy, and viewing angle dependence is low.

Next, operation of the pixel illustrated in FIG. 21 will be described.

First, a pixel to which data is written is selected, and the transistor 821 in the selected pixel is turned on by a signal input from the scan line 804.

At this time, a data signal from the signal line 805 is input through the transistor 821, so that the first terminal of the liquid crystal element 822 has the same voltage as the data signal, and the transmittance of the liquid crystal element 822 is set depending on voltage applied between the first terminal and the second terminal. After data writing, the transistor 821 is turned off by a signal input from the scan line 804, the transmittance of the liquid crystal element 822 is maintained during a display period, and the pixel enters into a display state. The above operation is sequentially performed per scan line 804, and the above operation is performed in all the pixels. The above is the operation of the pixel.

In displaying moving images in a liquid crystal display device, there is a problem in that an afterimage or motion blur occurs because of slow response of liquid crystal molecules themselves. In order to improve moving image characteristics of the liquid crystal display device, there is a driving technique called black insertion, in which the entire screen is displayed as black every other frame.

Moreover, there is a driving technique called double-frame rate driving, in which a vertical period is 1.5 times or 2 times or more as long as a normal vertical period in order to increase the response speed, and gray level to be written is selected for a plurality of divided fields in each frame.

Further, in order to improve moving image characteristics of the liquid crystal display device, there is a driving technique in which a plurality of LED (light-emitting diode) light sources, a plurality of EL light sources, or the like are used as backlights to form an area light source, and the light sources forming the area light source are independently lit intermittently in one frame period. For the area light source, LEDs of three kinds or more or an LED which emits white light may be used. Since a plurality of LEDs can be independently controlled, the timing when the LED emits light can be synchronized with the timing when optical modulation of the liquid crystal layer is changed. Part of the LEDs can be turned off in this driving technique, so that power consumption can be reduced particularly in the case of displaying an image in which a black display region occupies a large area in one screen.

By combining these driving techniques, display characteristics such as moving image characteristics of the liquid crystal display device can be improved as compared to those of a conventional liquid crystal display device.

Figure 22A:
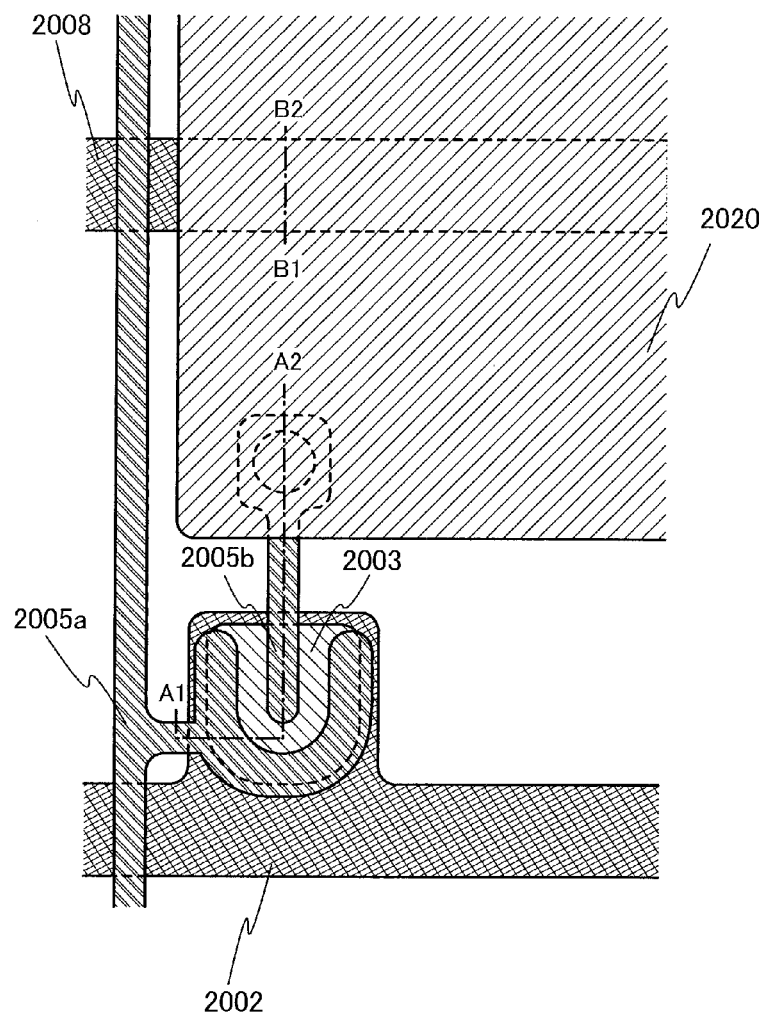
FIGS. 22A and 22B illustrate a structure of a pixel in a display device in Embodiment 7.
Figure 22B:
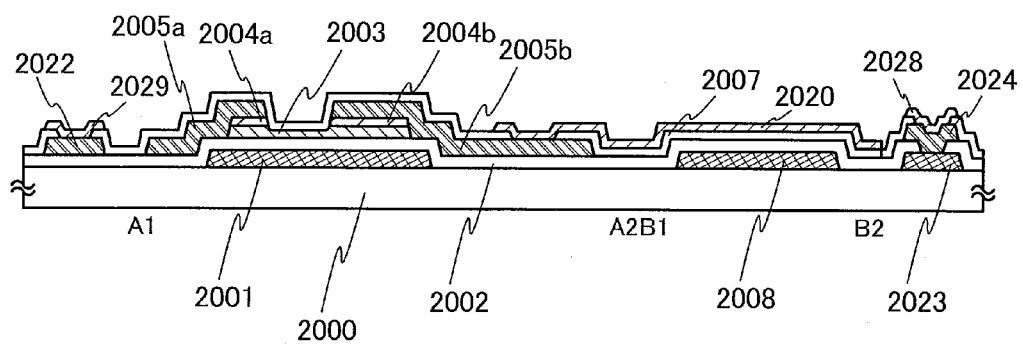

Next, a structure of a display device in this embodiment, which includes the above pixel, will be described with reference to FIGS. 22A and 22B. FIGS. 22A and 22B illustrate a structure of the pixel in the display device in this embodiment. FIG. 22A is a top view, and FIG. 22B is a cross-sectional view. Note that dotted lines A1-A2 and B1-B2 in FIG. 22A correspond to cross sections A1-A2 and B1-B2 in FIG. 22B, respectively.

As illustrated in FIGS. 22A and 22B, the display device in this embodiment includes, in the cross section A1-A2, a gate electrode 2001 over a substrate 2000; a gate insulating layer 2002 provided over the gate electrode 2001; an oxide semiconductor layer 2003 provided over the gate insulating layer 2002; a pair of oxide semiconductor layers 2004a and 2004b provided over the oxide semiconductor layer 2003; electrodes 2005a and 2005b provided so as to be in contact with the oxide semiconductor layers 2004a and 2004b; a protective insulating layer 2007 provided over the electrodes 2005a and 2005b and the oxide semiconductor layer 2003; and an electrode 2020 which is in contact with the electrode 2005b through an opening portion provided in the protective insulating layer 2007.

Moreover, the display device includes, in the cross section B1-B2, an electrode 2008 over the substrate 2000; the gate insulating layer 2002 over the electrode 2008; the protective insulating layer 2007 provided over the gate insulating layer 2002; and the electrode 2020 provided over the protective insulating layer 2007.

Electrodes 2022 and 2029 and electrodes 2023, 2024, and 2028 serve as a wiring or an electrode for connection with an FPC.

As the substrate 2000, a substrate which can be applied to the substrate 210 in Embodiment 1 can be used.

The gate electrode 2001 and the electrodes 2008, 2022, and 2023 can be formed using a material and a method which can be applied to those of the gate electrodes 2111 and 2112 in Embodiment 1.

The gate insulating layer 2002 can be formed using a material and a method which can be applied to those of the gate insulating layer 212 in Embodiment 1. In this embodiment, a 50-nm-thick silicon oxide film is formed as the gate insulating layer 2002.

The oxide semiconductor layer 2003 can be formed using a material and a method which can be applied to those of the oxide semiconductor layers 2131 and 2132 in the above embodiments, for example. Here, the oxide semiconductor layer 2003 is formed by depositing an In—Ga—Zn—O-based non-single-crystal film using an 8-inch diameter oxide semiconductor target containing In, Ga, and Zn ($In_2O_3$:$Ga_2O_3$:ZnO=1:1:1) in an argon atmosphere or an oxygen atmosphere under the following conditions: the distance between the substrate and the target is 170 mm, the pressure is 0.4 Pa, and the direct-current (DC) power supply is 0.5 kW. Note that it is preferable to use a pulsed direct-current (DC) power supply because dust can be reduced and film thickness distribution is uniform. The In—Ga—Zn—O-based non-single-crystal film preferably has a thickness of 5 nm to 200 nm. In this embodiment, the thickness of the In—Ga—Zn—O-based non-single-crystal film is 100 nm. Moreover, reverse sputtering can be performed before the oxide semiconductor film is formed.

The oxide semiconductor layers 2004a and 2004b can be formed using a material and a method which can be applied to those of the oxide semiconductor layers 2141a, 2141b, 2142a, and 2142b in the above embodiments, for example.

Here, the oxide semiconductor layers 2004a and 2004b are formed by depositing an In—Ga—Zn—O-based non-single-crystal film using a target in which the composition ratio is $In_2O_3$:$Ga_2O_3$:ZnO=1:1:1 by sputtering under the following deposition conditions: the pressure is 0.4 Pa, the power is 500 W, the deposition temperature is room temperature, and the flow rate of an argon gas is 40 sccm. Note that an In—Ga—Zn—O-based non-single-crystal film having a crystal grain of 1 nm to 10 nm just after deposition is sometimes formed in spite of intentionally using a target in which the composition ratio is $In_2O_3$:$Ga_2O_3$:ZnO=1:1:1. Further, by adjusting the ratio of components of the target, the pressure for deposition (0.1 Pa to 2.0 Pa), the power (250 W to 3000 W: 8 inches in diameter), the temperature (room temperature to 100° C.), a deposition condition for reactive sputtering, and the like as appropriate, the presence or existence of crystal grains and the density of crystal grains can be adjusted and the diameter of crystal grains can be adjusted in the range of 1 nm to 10 nm. The thickness of the In—Ga—Zn—O-based non-single-crystal film is preferably 5 nm to 20 nm. It is needless to say that when crystal grains are included in the film, the size of the crystal grains is not greater than the thickness of the film. In this embodiment, the thickness of the oxide semiconductor layers 2004a and 2004b is 5 nm.

Note that the deposition conditions of the In—Ga—Zn—O-based non-single-crystal film serving as the oxide semiconductor layer 2003 are made different from those of the In—Ga—Zn—O-based non-single-crystal film serving as the oxide semiconductor layers 2004a and 2004b. For example, the ratio of the flow rate of an oxygen gas to the flow rate of an argon gas in the deposition conditions of the In—Ga—Zn—O-based non-single-crystal film serving as the oxide semiconductor layer 2003 is higher than that in the deposition conditions of the In—Ga—Zn—O-based non-single-crystal film serving as the oxide semiconductor layers 2004a and 2004b. Specifically, the In—Ga—Zn—O-based non-single-crystal film serving as the oxide semiconductor layers 2004a and 2004b is deposited in a rare gas (e.g., argon or helium) atmosphere (or an atmosphere with oxygen gas of 10% or less and argon gas of 90% or more), and the In—Ga—Zn—O-based non-single-crystal film serving as the oxide semiconductor layer 2003 is deposited in an oxygen atmosphere (or an atmosphere in which the flow rate of an oxygen gas is equal to or more than that of an argon gas).

The In—Ga—Zn—O-based non-single-crystal film serving as the oxide semiconductor layers 2004a and 2004b may be deposited in a chamber which is the same as or different from that in which reverse sputtering has been performed.

Among sputtering methods, there are an RF sputtering method using a high-frequency power supply as a sputtering power supply, a DC sputtering method, and also a pulsed DC sputtering method in which pulsed bias is applied. The RF sputtering method is mainly used for depositing an insulating film, and the DC sputtering method is mainly used for depositing a metal film.

Moreover, there is a multi-source sputtering apparatus in which a plurality of targets of different materials can be arranged. With the multi-source sputtering apparatus, films of different materials can be stacked in one chamber, or plural kinds of materials can be deposited by electric discharge at a time in one chamber.

Further, there are a sputtering apparatus which includes a magnetic mechanism inside a chamber and employs a magnetron sputtering method; and a sputtering apparatus which employs an ECR sputtering method using plasma generated by using a microwave without glow discharge.

Furthermore, as a deposition method using a sputtering method, there are a reactive sputtering method in which a target substance and a sputtering gas component chemically react with each other during deposition to form a thin film of a compound of these materials; and a bias sputtering method in which voltage is also applied to a substrate during deposition.

The electrodes 2005a, 2005b, and 2024 can be formed using a material and a method which can be applied to those of the electrodes 215, 216, and 217 in the above embodiments, for example. Here, the electrodes 2005a, 2005b, and 2024 have a single-layer structure of a titanium film.

In addition, oxygen plasma treatment may be performed on a channel region of the oxide semiconductor layer 2003. By performing the oxygen plasma treatment, a TFT can be normally off. Moreover, by performing the plasma treatment, damage to the oxide semiconductor layer 2003 by etching can be repaired. The oxygen plasma treatment is preferably performed in an atmosphere of $O_2$ or $N_2O$, preferably an atmosphere of $N_2$, He, or Ar which contains oxygen. Alternatively, the oxygen plasma treatment may be performed in an atmosphere where $Cl_2$ or $CF_4$ is added to the above atmosphere.

As the protective insulating layer 2007, a silicon nitride film, a silicon oxide film, a silicon oxynitride film, an aluminum oxide film, a tantalum oxide film, or the like which is obtained by a sputtering method or the like can be used. Note that when a non-reducible film (such as a silicon oxide film) is used as the protective insulating layer 2007, a channel region of a TFT subjected to the above oxygen plasma treatment is protected, and shift of the threshold voltage over time can be suppressed.

The electrodes 2020, 2029, and 2028 are formed using indium oxide ($In_2O_3$), an alloy of indium oxide and tin oxide ($In_2O_3$—$SnO_2$, referred to as ITO), or the like by a sputtering method, a vacuum evaporation method, or the like. Such a material is etched with a hydrochloric acid-based solution. Note that since etching of ITO particularly tends to leave residue, an alloy of indium oxide and zinc oxide ($In_2O_3$—ZnO) may be used in order to improve the etching processability.

Figure 23A:
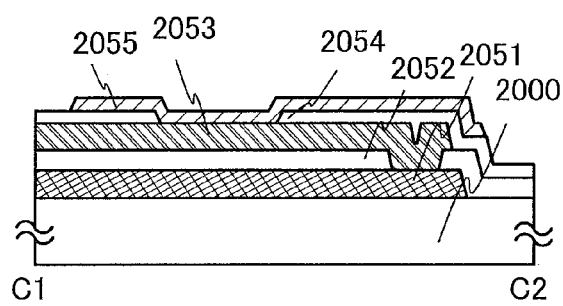
FIGS. 23A to 23D each illustrate a structure of a pixel in a display device in Embodiment 7.
Figure 23B:
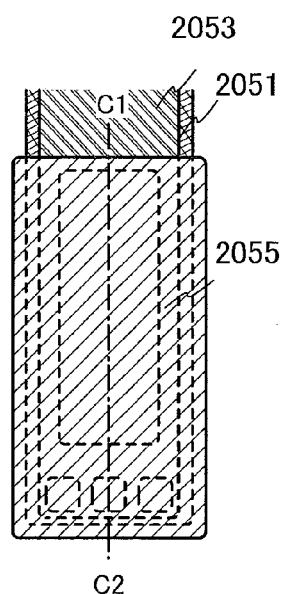

FIGS. 23A and 23B are a cross-sectional view and a top view of a gate wiring terminal portion at this stage, respectively. FIG. 23A is a cross-sectional view along C1-C2 in FIG. 23B. In FIG. 23A, a transparent conductive film 2055 formed over a protective insulating film 2054 is a terminal electrode for connection, which functions as an input terminal. Further, in FIG. 23A, in the terminal portion, a first terminal 2051 which is formed of the same material as a gate wiring and a connection electrode 2053 which is formed of the same material as a source wiring overlap with each other with a gate insulating layer 2052 therebetween and are in direct contact with each other to allow electrical continuity. Moreover, the connection electrode 2053 and the transparent conductive film 2055 are in direct contact with each other through a contact hole provided in the protective insulating film 2054 to allow electrical continuity.

Figure 23C:
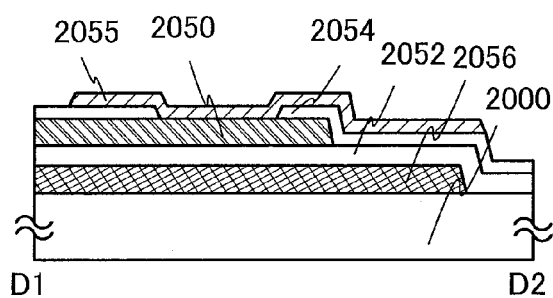
Figure 23D:
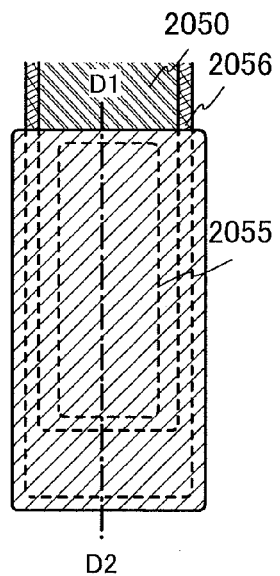

FIGS. 23C and 23D are a cross-sectional view and a top view of a source wiring terminal portion, respectively. FIG. 23C is a cross-sectional view along D1-D2 in FIG. 23D. In FIG. 23C, the transparent conductive film 2055 formed over the protective insulating film 2054 is a terminal electrode for connection, which functions as an input terminal. Moreover, in FIG. 23C, in the terminal portion, an electrode 2056 which is formed of the same material as the gate wiring is placed below a second terminal 2050 which is electrically connected to the source wiring, so as to overlap with the second terminal 2050 with the gate insulating layer 2052 therebetween. The electrode 2056 is not electrically connected to the second terminal 2050. When the electrode 2056 is set to have a potential different from that of the second terminal 2050, for example, a floating potential, GND, or 0 V, capacitance for preventing noise or static electricity can be formed. Further, the second terminal 2050 is electrically connected to the transparent conductive film 2055 through the protective insulating film 2054.

A plurality of gate wirings, source wirings, and capacitor wirings are provided based on the pixel density. Moreover, a plurality of first terminals at the same potential as the gate wiring, second terminals at the same potential as the source wiring, third terminals at the same potential as the capacitor wiring, and the like are arranged in the terminal portion. The number of each of the terminals can be a given number and is determined as appropriate.

Accordingly, a pixel TFT portion including the TFT, which is a bottom-gate n-channel TFT, and a storage capacitor can be completed. Then, they are arranged in matrix corresponding to pixels so that a pixel portion is formed; thus, a substrate for manufacturing an active matrix display device can be formed. In this specification, such a substrate is referred to as an active matrix substrate for convenience.

When an active matrix liquid crystal display device is formed, a liquid crystal layer is provided between an active matrix substrate and a counter substrate provided with a counter electrode, and the active matrix substrate and the counter substrate are fixed. A common electrode which is electrically connected to the counter electrode provided on the counter substrate is provided over the active matrix substrate, and a fourth electrode which is electrically connected to the common electrode is provided in a terminal portion. The fourth terminal is a terminal for making the common electrode have a fixed potential, for example, GND or 0 V.

The n-channel transistor obtained in this embodiment uses the In—Ga—Zn—O-based non-single-crystal film for a channel formation region and thus has favorable dynamic characteristics, whereby the above driving techniques can be used in combination.

Further, when a light-emitting display device is formed, in order to set one electrode (also referred to as a cathode) of an organic light-emitting element to have a low power supply voltage, for example, GND or 0 V, a fourth terminal for making the cathode have the low power supply voltage such as GND or 0 V is provided in a terminal portion. Moreover, when the light-emitting display device is formed, a power supply line is provided in addition to a source wiring and a gate wiring. Accordingly, a fifth terminal electrically connected to the power supply line is provided in the terminal portion.

A gate line driver circuit or a source line driver circuit is constituted by TFTs using an oxide semiconductor, whereby manufacturing costs are reduced. Moreover, a gate electrode of the TFT included in the driver circuit is directly connected to a source wiring or a drain wiring so that the number of contact holes is reduced, whereby a display device can be provided in which the area occupied by the driver circuit is reduced.

Therefore, according to this embodiment, a highly reliable display device with high electric characteristics can be provided at low cost.

Note that this embodiment can be implemented in combination with other embodiments as appropriate.

(Embodiment 8)

In this embodiment, a light-emitting display device will be described as an example of the display device shown in Embodiment 6. As an example, a light-emitting display device in which electroluminescence is used for a light-emitting element will be described in this embodiment.

Light-emitting elements utilizing electroluminescence are classified according to whether a light-emitting material is an organic compound or an inorganic compound. In general, the former is referred to as an organic EL element, and the latter as an inorganic EL element.

In an organic EL element, by application of voltage to the light-emitting element, electrons and holes are separately injected from a pair of electrodes into a layer containing a light-emitting organic compound, and there flows a current. Then, these carriers (the electrons and the holes) are recombined, so that the light-emitting organic compound is set in an excited state. The light-emitting emits light when it returns from the excited state to a ground state. Based on such a mechanism, such a light-emitting element is referred to as a current-excitation light-emitting element.

Inorganic EL elements are classified according to the element structures into a dispersion inorganic EL elements and thin-film inorganic EL elements. A dispersion inorganic EL element includes a light-emitting layer where particles of a light-emitting material are dispersed in a binder, and its light emission mechanism is donor-acceptor recombination light emission utilizing a donor level and an acceptor level. A thin-film inorganic EL element has a structure in which a light-emitting layer is sandwiched between dielectric layers, which are further sandwiched between electrodes, and its light emission mechanism is localized light emission utilizing inner-shell electron transition of metal ions. Note that here, an organic EL element is described as a light-emitting element.

Figure 24:
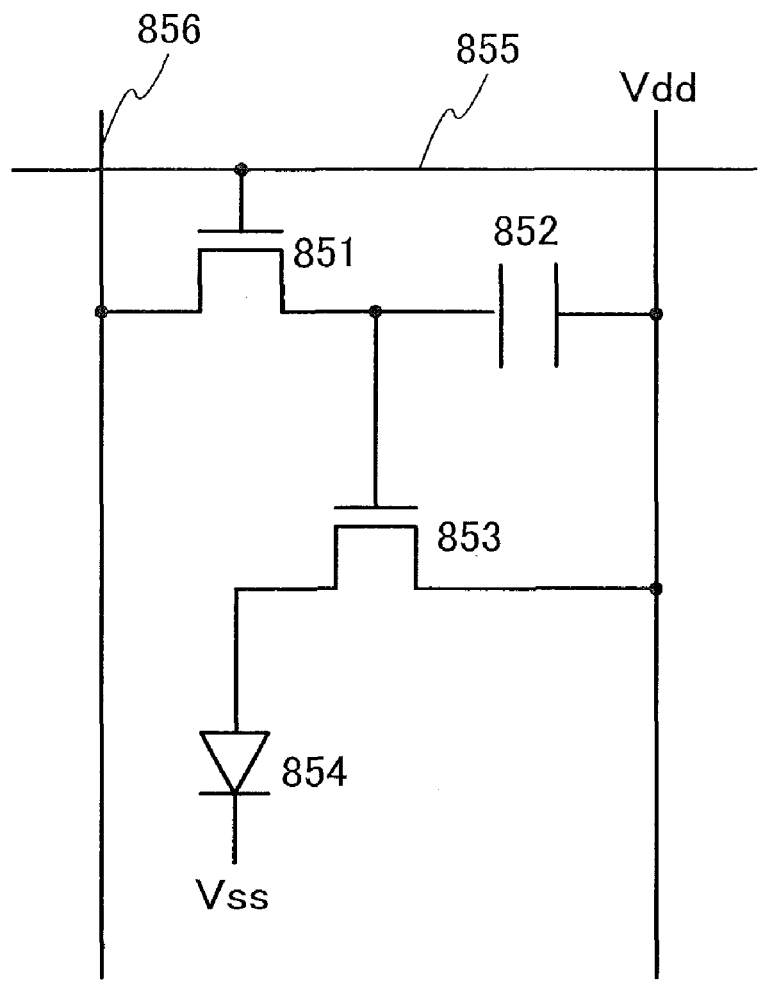
FIG. 24 is a circuit diagram illustrating a circuit configuration of a pixel in a display device in Embodiment 8.

A circuit configuration of a pixel in a display device in this embodiment will be described with reference to FIG. 24. FIG. 24 is a circuit diagram illustrating a circuit configuration of a pixel of the display device in this embodiment.

As illustrated in FIG. 24, the pixel of the display device in this embodiment includes a transistor 851, a storage capacitor 852, a transistor 853, and a light-emitting element 854.

A gate of the transistor 851 is electrically connected to a scan line 855, and one of a source and a drain thereof is electrically connected to a signal line 856. A high power supply voltage is applied to the other of the source and the drain of the transistor 851 through the storage capacitor 852.

A gate of the transistor 853 is electrically connected to the other of the source and the drain of the transistor 851. The high power supply voltage is applied to one of a source and a drain of the transistor 853.

The light-emitting element 854 has a first terminal and a second terminal. The first terminal is electrically connected to the other of the source and the drain of the transistor 853. A low power supply voltage is applied to the second terminal.

Next, operation of the pixel illustrated in FIG. 24 will be described.

An example of display operation of the pixel in the display device in this embodiment is described.

First, a pixel to which data is written is selected. In the selected pixel, the transistor 851 is turned on by a scan signal input from the scan line 855, and a video signal (also referred to as a data signal), which is a fixed voltage, is input from the signal line 856 to the gate of the transistor 853.

The transistor 853 is turned on or off by a voltage in response to the data signal input to the gate. When the transistor 853 is on, a voltage applied between the first terminal and the second terminal of the light-emitting element 854 depends on a gate voltage of the transistor 853 and the high power supply voltage. At this time, current flows through the light-emitting element 854 depending on the voltage applied between the first terminal and the second terminal, and the light-emitting element 854 emits light with illuminance in response to the amount of current flowing therethrough. Further, since the gate voltage of the transistor 853 is held for a certain period by the storage capacitor 852, the light-emitting element 854 maintains a light-emitting state for a certain period.

When the data signal input from the signal line 856 to the pixel is digital, the pixel enters into a light-emitting state or a non-light-emitting state by switching on and off of the transistor 851. Accordingly, gradation can be expressed by an area ratio grayscale method or a time ratio grayscale method. An area ratio grayscale method refers to a driving method by which one pixel is divided into a plurality of subpixels and each of the subpixels with the structure illustrated in FIG. 24 is independently driven based on a data signal so that gradation is expressed. Further, a time ratio grayscale method refers to a driving method by which a period during which a pixel is in a light-emitting state is controlled so that gradation is expressed.

Since the response speed of light-emitting elements is higher than that of liquid crystal elements or the like, the light-emitting elements are suitable for a time ratio grayscale method as compared to the liquid crystal elements. Specifically, when display is performed by a time gray scale method, one frame period is divided into a plurality of subframe periods. Then, in accordance with video signals, the light-emitting element in the pixel is set in a light-emitting state or a non-light-emitting state in each subframe period. By dividing one frame period into a plurality of subframe periods, the total length of a period in which pixels actually emit light in one frame period can be controlled with video signals, and gradation can be expressed.

Among driver circuits in the light-emitting display device, part of a driver circuit which can be constituted by n-channel TFTs can be formed over a substrate where TFTs in a pixel portion are formed. Moreover, a signal line driver circuit and a scan line driver circuit can be constituted only by n-channel TFTs.

Next, a structure of a light-emitting element will be described with reference to FIGS. 25A to 25C. Here, a cross-sectional structure of a pixel in the case of an n-channel driving TFT is described as an example. TFTs 7001, 7011, and 7021, which are driving TFTs used in a display device in FIGS. 25A, 25B, and 25C respectively, can be formed in a similar manner to the TFTs shown in the above embodiments, include an oxide semiconductor layer as a semiconductor layer, and have high reliability.

In order to extract light emitted from a light-emitting element, at least one of an anode and a cathode needs to be transparent. A TFT and a light-emitting element are formed over a substrate. There are light-emitting elements having a top emission structure in which light is extracted through the surface opposite to the substrate, having a bottom emission structure in which light is extracted through the surface on the substrate side, and having a dual emission structure in which light is extracted through the surface on the substrate side and the surface opposite to the substrate. The pixel structure of the present invention can be applied to a light-emitting element having any of these emission structures.

A light-emitting element having a top emission structure will be described with reference to FIG. 25A.

Figure 25A:
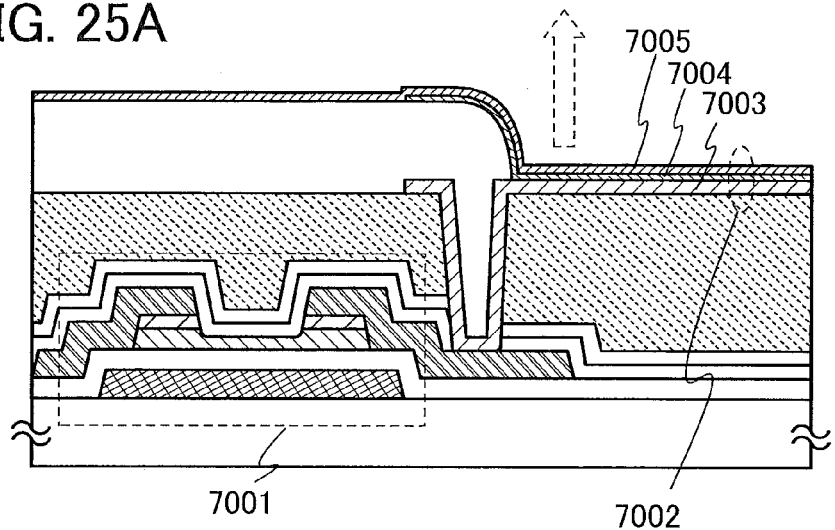
FIGS. 25A to 25C are cross-sectional views each illustrating a structure of a pixel in a display device in Embodiment 8.
Figure 25B:
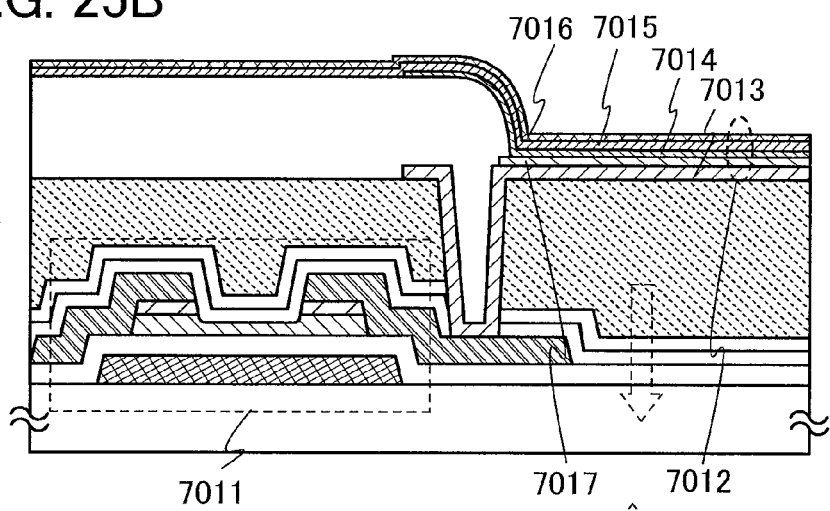
Figure 25C:
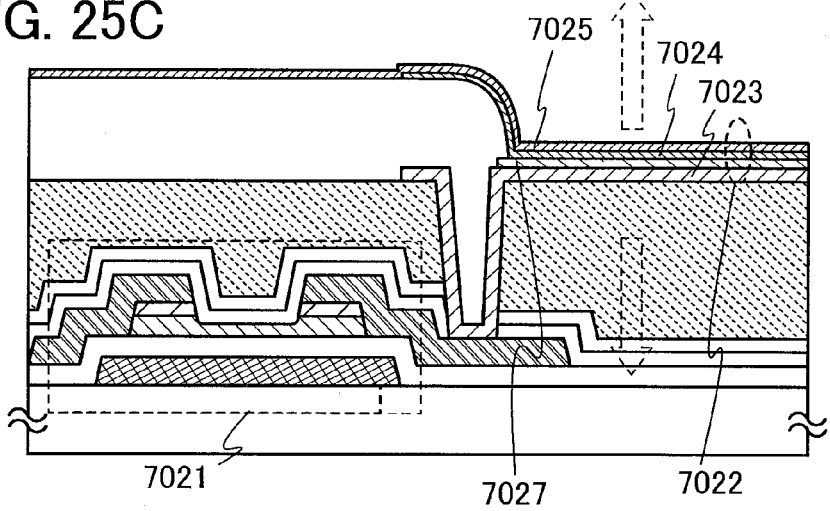

FIG. 25A is a cross-sectional view of a pixel in the case where the TFT 7001, which is the driving TFT, is an n-channel TFT and light emitted from a light-emitting element 7002 passes through an anode 7005. In FIG. 25A, a cathode 7003 of the light-emitting element 7002 and the TFT 7001, which is the driving TFT, are electrically connected to each other, and a light-emitting layer 7004 and the anode 7005 are sequentially stacked over the cathode 7003. As the cathode 7003, any conductive film can be used as long as it has a low work function and reflects light. For example, Ca, Al, CaF, MgAg, AlLi, or the like is preferably used. The light-emitting layer 7004 may be formed using a single layer or by stacking a plurality of layers. When the light-emitting layer 7004 is formed using a plurality of layers, the light-emitting layer 7004 is formed by stacking an electron-injecting layer, an electron-transporting layer, a light-emitting layer, a hole-transporting layer, and a hole-injecting layer in order over the cathode 7003. Note that it is not necessary to form all of these layers. The anode 7005 is formed using a light-transmitting conductive film such as a film of indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

The light-emitting element 7002 corresponds to a region where the cathode 7003 and the anode 7005 sandwich the light-emitting layer 7004. In the pixel illustrated in FIG. 25A, light is emitted from the light-emitting element 7002 to the anode 7005 side as shown by an arrow.

Next, a light-emitting element having a bottom emission structure will be described with reference to FIG. 25B. FIG. 25B is a cross-sectional view of a pixel in the case where the driving TFT 7011 is an n-channel TFT and light emitted from a light-emitting element 7012 passes through a cathode 7017. In FIG. 25B, the cathode 7017 of the light-emitting element 7012 is formed over a light-transmitting conductive film 7013 which is electrically connected to the driving TFT 7011, and a light-emitting layer 7014 and an anode 7015 are sequentially stacked over the cathode 7017. Note that when the anode 7015 has a light-transmitting property, a light-blocking film 7016 for reflecting or blocking light may be formed so as to cover the anode 7015. As in the case of FIG. 25A, a variety of materials can be used for the cathode 7017 as long as a material is a conductive material having a low work function. Note that the cathode 7017 has a thickness that can transmit light (preferably has approximately 5 nm to 30 nm). For example, a 20-nm-thick aluminum film can be used as the cathode 7017. The light-emitting layer 7014 may be formed of a single layer or by stacking a plurality of layers as in FIG. 25A. The anode 7015 is not necessary to transmit light, but can be formed using a light-transmitting conductive film as in FIG. 25A. The light-blocking film 7016 can be formed using, for example, a metal which reflects light; however, one embodiment of the invention is not limited to a metal film. For example, a resin to which a black pigment is added can be used.

The light-emitting element 7012 corresponds to a region where the cathode 7017 and the anode 7015 sandwich the light-emitting layer 7014. In the pixel illustrated in FIG. 25B, light is emitted from the light-emitting element 7012 to the cathode 7017 side as shown by an arrow.

Next, a light-emitting element having a dual emission structure will be described with reference to FIG. 25C. In FIG. 25C, a cathode 7027 of a light-emitting element 7022 is formed over a light-transmitting conductive film 7023 which is electrically connected to the driving TFT 7021, and a light-emitting layer 7024 and an anode 7025 are sequentially stacked over the cathode 7027. As in the case of FIG. 25A, a variety of materials can be used for the cathode 7027 as long as a material is a conductive material with a low work function. Note that the cathode 7027 has a thickness that can transmit light. For example, Al having a thickness of 20 nm can be used as the cathode 7027. As in FIG. 25A, the light-emitting layer 7024 may be formed using a single layer or a stack of a plurality of layers. The anode 7025 can be formed using a light-transmitting conductive film as in FIG. 25A.

The light-emitting element 7022 corresponds to a region where the cathode 7027, the light-emitting layer 7024, and the anode 7025 overlap with each other. In the pixel illustrated in FIG. 25C, light is emitted from the light-emitting element 7022 to both the anode 7025 side and the cathode 7027 side as shown by arrows.

Note that although an organic EL element is described here as a light-emitting element, an inorganic EL element can also be provided as a light-emitting element.

Note that in this embodiment, the example is described in which a TFT (also referred to as a driving TFT) which controls driving of a light-emitting element is electrically connected to the light-emitting element; alternatively, a structure may be employed in which a TFT for current control is connected between the driving TFT and the light-emitting element.

Figure 26A:
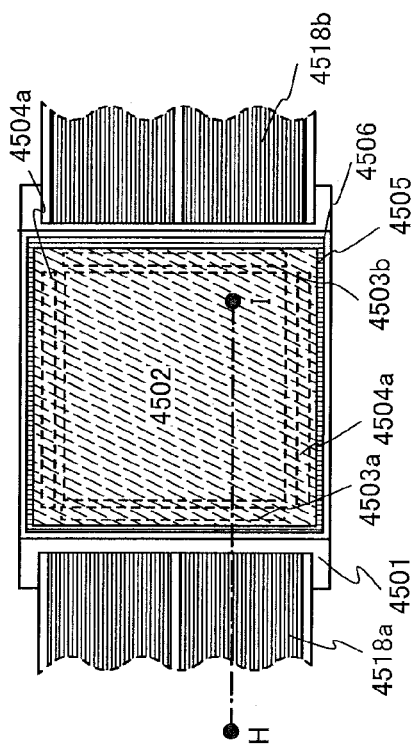
FIGS. 26A and 26B illustrate a structure of a display device in Embodiment 8.
Figure 26B:
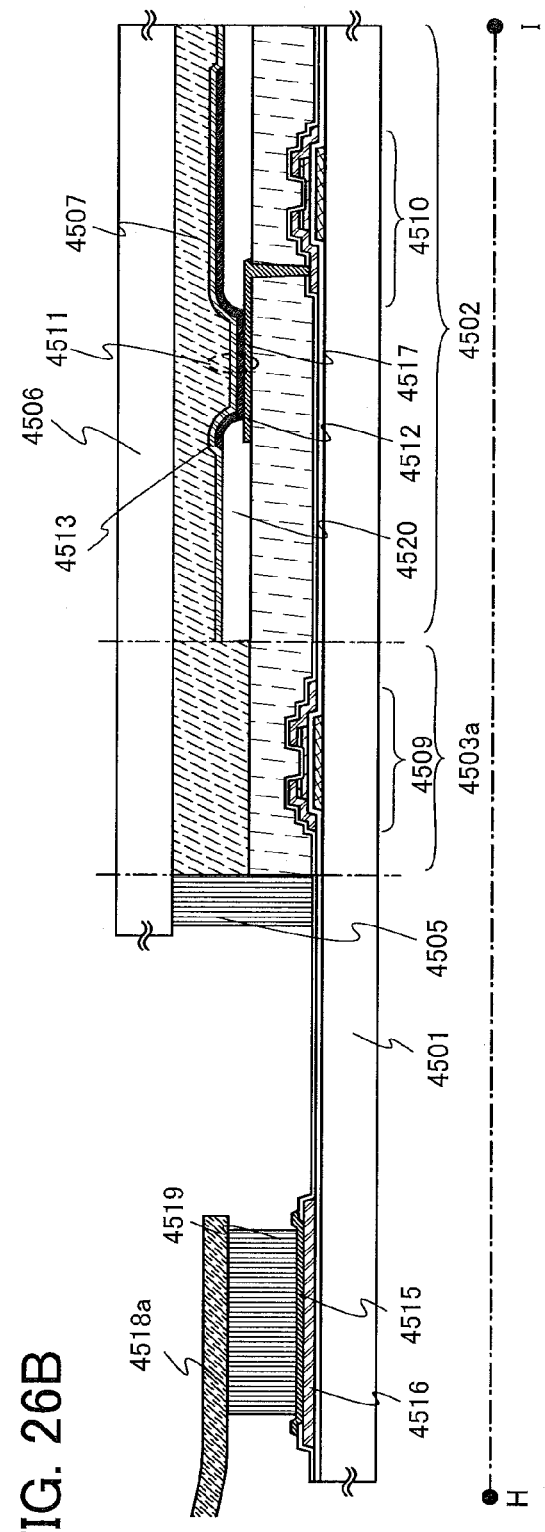

Next, the appearance and cross section of the display device (also referred to as a light-emitting panel) in this embodiment will be described with reference to FIGS. 26A and 26B. FIG. 26A is a top view of the display device in this embodiment, in which a TFT and a light-emitting element formed over a first substrate are sealed between the first substrate and a second substrate by a sealing material. FIG. 26B is a cross-sectional view along H—I in FIG. 26A.

A sealing material 4505 is provided so as to surround a pixel portion 4502, a signal line driver circuits 4503a and 4503b, and scan line driver circuits 4504a and 4504b which are provided over a first substrate 4501. Moreover, a second substrate 4506 is provided over the pixel portion 4502, the signal line driver circuits 4503a and 4503b, and the scan line driver circuits 4504a and 4504b. Accordingly, the pixel portion 4502, the signal line driver circuits 4503a and 4503b, and the scan line driver circuits 4504a and 4504b are sealed, together with a filler 4507, with the first substrate 4501, the sealing material 4505, and the second substrate 4506. In such a manner, it is preferable to pack (seal) the pixel portion 4502, the signal line driver circuits 4503a and 4503b, and the scan line driver circuits 4504a and 4504b with a protective film (such as an attachment film or an ultraviolet curable resin film) or a cover material with high air-tightness and little degasification so that the pixel portion 4502, the signal line driver circuits 4503a and 4503b, and the scan line driver circuits 4504a and 4504b are not exposed to the air.

The pixel portion 4502, the signal line driver circuits 4503a and 4503b, and the scan line driver circuits 4504a and 4504b, which are formed over the first substrate 4501, each include a plurality of TFTs. In FIG. 26B, a TFT 4510 included in the pixel portion 4502 and a TFT 4509 included in the signal line driver circuit 4503a are illustrated as an example.

As the TFTs 4509 and 4510, the highly reliable TFT shown in Embodiment 4, which includes the oxide semiconductor layer as a semiconductor layer, can be used. Alternatively, the TFT shown in Embodiment 5 may be used. In this embodiment, the TFTs 4509 and 4510 are n-channel TFTs.

Moreover, reference numeral 4511 denotes a light-emitting element. A first electrode 4517 which is a pixel electrode included in the light-emitting element 4511 is electrically connected to a source electrode or a drain electrode of the TFT 4510. Note that the light-emitting element 4511 has a layered structure of the first electrode 4517, an electroluminescent layer 4512, and a second electrode 4513; however, the structure of the light-emitting element is not limited to that shown in this embodiment. The structure of the light-emitting element 4511 can be changed as appropriate depending on the direction in which light is extracted from the light-emitting element 4511, or the like.

A bank 4520 is formed using an organic resin film, an inorganic insulating film, or organic polysiloxane. In particular, it is preferable that the bank 4520 be formed using a photosensitive material to have an opening portion over the first electrode 4517, and a sidewall of the opening portion be formed as an inclined surface with a continuous curvature.

The electroluminescent layer 4512 may be formed using a single layer or a stack of a plurality of layers.

In order to prevent oxygen, hydrogen, moisture, carbon dioxide, or the like from entering the light-emitting element 4511, a protective layer may be formed over the second electrode 4513 and the bank 4520. As the protective layer, a silicon nitride film, a silicon nitride oxide film, a DLC (diamond like carbon) film, or the like can be formed.

Further, a variety of signals and potentials are supplied to the signal line driver circuits 4503*a* and 4503*b*, the scan line driver circuits 4504*a* and 4504*b*, or the pixel portion 4502 from FPCs 4518*a* and 4518*b*.

In this embodiment, a connection terminal electrode 4515 is formed using the same conductive film as the first electrode 4517 included in the light-emitting element 4511. A terminal electrode 4516 is formed using the same conductive film as the source electrodes and the drain electrodes of the TFTs 4509 and 4510.

The connection terminal electrode 4515 is electrically connected to a terminal of the FPC 4518*a* through an anisotropic conductive film 4519.

The second substrate located in the direction in which light is extracted from the light-emitting element 4511 needs to have a light-transmitting property. In that case, a light-transmitting material such as a glass plate, a plastic plate, a polyester film, or an acrylic film is used.

As the filler 4507, an ultraviolet curable resin or a thermosetting resin can be used other than an inert gas such as nitrogen or argon. For example, polyvinyl chloride (PVC), acrylic, polyimide, an epoxy resin, a silicone resin, polyvinyl butyral (PVB), or ethylene vinyl acetate (EVA) can be used. In this embodiment, nitrogen is used for the filler 4507.

If necessary, an optical film such as a polarizing plate, a circularly polarizing plate (including an elliptically polarizing plate), a retardation plate (a quarter-wave plate or a half-wave plate), or a color filter may be provided as appropriate on a light-emitting surface of the light-emitting element. Further, a polarizing plate or a circularly polarizing plate may be provided with an anti-reflection film. For example, anti-glare treatment by which reflected light can be dispersed on an uneven surface to reduce glare can be performed As the signal line driver circuits 4503*a* and 4503*b* and the scan line driver circuits 4504*a* and 4504*b*, a driver circuit formed using a single crystal semiconductor film or a polycrystalline semiconductor film may be mounted on a substrate separately prepared. Alternatively, only the signal line driver circuit or part thereof, or the scan line driver circuit or part thereof may be separately formed to be mounted. This embodiment is not limited to the structure in FIGS. 26A and 26B.

Through the above steps, a highly reliable light-emitting display device (display panel) can be manufactured.

Note that this embodiment can be combined with the structures disclosed in other embodiments as appropriate.

(Embodiment 9)

In this embodiment, electronic paper will be described as an example of the display device shown in Embodiment 6.

The logic circuit shown in the above embodiments can be used in electronic paper. Electronic paper is also referred to as an electrophoretic display device (an electrophoretic display) and has advantages of having high readability which is equivalent to normal paper and lower power consumption than other display devices, and being thin and lightweight.

A variety of modes of electrophoretic displays can be considered. An electrophoresis display includes a plurality of microcapsules which include first particles having a positive charge and second particles having a negative charge, and are dispersed in a solvent or a solute. By applying an electrical field to the microcapsules, the particles in the microcapsules move in opposite directions to each other, and only a color of the particles gathered on one side is displayed. Note that the first particles or the second particles contain a dye and do not move when there is no electric field. Moreover, colors (including colorless) of the first particles and the second particles are different from each other.

Accordingly, the electrophoretic display utilizes a so-called dielectrophoretic effect, in which a substance with a high dielectric constant moves to a region with high electric fields. The electrophoretic display does not require a polarizing plate and a counter substrate, which are necessary for a liquid crystal display device, so that the thickness and weight of the electrophoretic display are reduced by half.

A substance in which the microcapsules are dispersed in a solvent is called electronic ink, and the electronic ink can be printed on a surface of glass, plastic, fabric, paper, or the like. Moreover, color display is possible with the use of a color filter or particles including a coloring matter.

Further, when a plurality of the above microcapsules are arranged over an active matrix substrate so as to be placed between two electrodes, an active matrix display device can be completed, and display can be performed by application of electric fields to the microcapsules. For example, the active matrix substrate obtained with the TFT in Embodiment 4 or Embodiment 5 can be used.

Note that for the first particles and the second particles in the microcapsule, one or a composite material of a conductive material, an insulating material, a semiconductor material, a magnetic material, a liquid crystal material, a ferroelectric material, an electroluminescent material, an electrochromic material, or a magnetophoretic material may be used.

Figure 27:
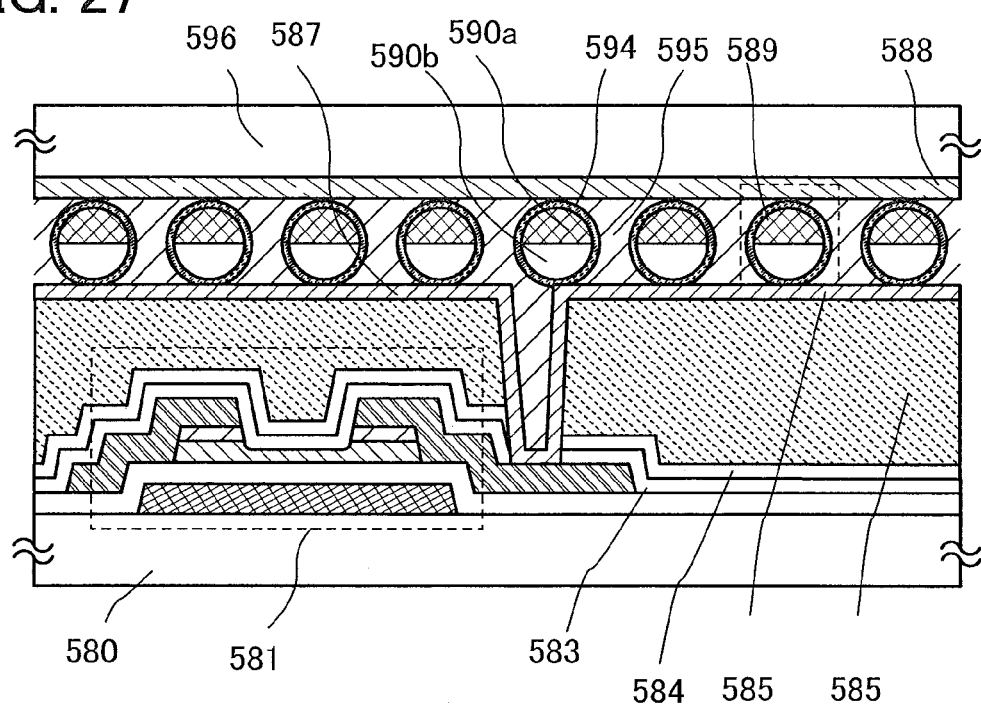
FIG. 27 is a cross-sectional view illustrating a structure of electronic paper in Embodiment 9.

Next, an example of a structure of electronic paper in this embodiment will be described with reference to FIG. 27. FIG. 27 is a cross-sectional view illustrating a structure of the electronic paper in this embodiment.

The electronic paper illustrated in FIG. 27 includes a TFT 581 over a substrate 580; insulating layers 583, 584, and 585 which are stacked over the TFT 581; an electrode 587 which is in contact with a source electrode or a drain electrode of the TFT 581 through an opening portion provided in the insulating layers 583 to 585; and includes between the electrode 587 and an electrode 588 provided on a substrate 596, spherical particles 589, each of which includes a black region 590*a*, a white region 590*b*, and a cavity 594 which surrounds the black region 590*a* and the white region 590*b* and is filled with a liquid; and a filler 595 provided around the spherical particles 589.

The TFT 581 can be formed in a similar manner to the TFT shown in Embodiment 4 and is a highly reliable TFT including an oxide semiconductor layer as a semiconductor layer. Alternatively, the TFT shown in Embodiment 5 can be applied to the TFT 581 in this embodiment.

A method of using the spherical particles 589 is called a twisting ball display method. In the twisting ball display system, spherical particles each colored in black and white are arranged between a first electrode and a second electrode, which are electrodes used for a display element, and potential difference is generated between the first electrode and the second electrode to control orientation of the spherical particles; accordingly, display is performed.

Further, instead of the spherical element, an electrophoretic element can also be used. A microcapsule having a diameter of approximately 10 μm to 200 μM, in which a transparent liquid, positively charged white microparticles, and negatively charged black microparticles are encapsulated, is used. In the microcapsule provided between the first electrode and the second electrode, when an electric field is applied by the first electrode and the second electrode, the white microparticles and the black microparticles move to opposite directions to each other, so that white or black can be displayed. An electrophoretic display element is a display element to which this principle is applied. The electrophoretic display element has higher reflectivity than a liquid crystal display element, and thus, an assistant light is unnecessary. Moreover, power consumption is low, and a display portion can be recognized in a dusky place. Further, even when power is not supplied to the display portion, an image which has been displayed once can be maintained. Accordingly, a displayed image can be stored even if a semiconductor device having a display function (which may simply be referred to as a display device or a semiconductor device provided with a display device) is distanced from an electric wave source.

The logic circuit which is one embodiment of the invention disclosed in the specification can be used, for example, as a driver circuit for the electronic paper in this embodiment. Further, since a thin film transistor using an oxide semiconductor layer can be applied to a transistor in the display portion, the driver circuit and the display portion can be provided over one substrate, for example.

Figure 28:
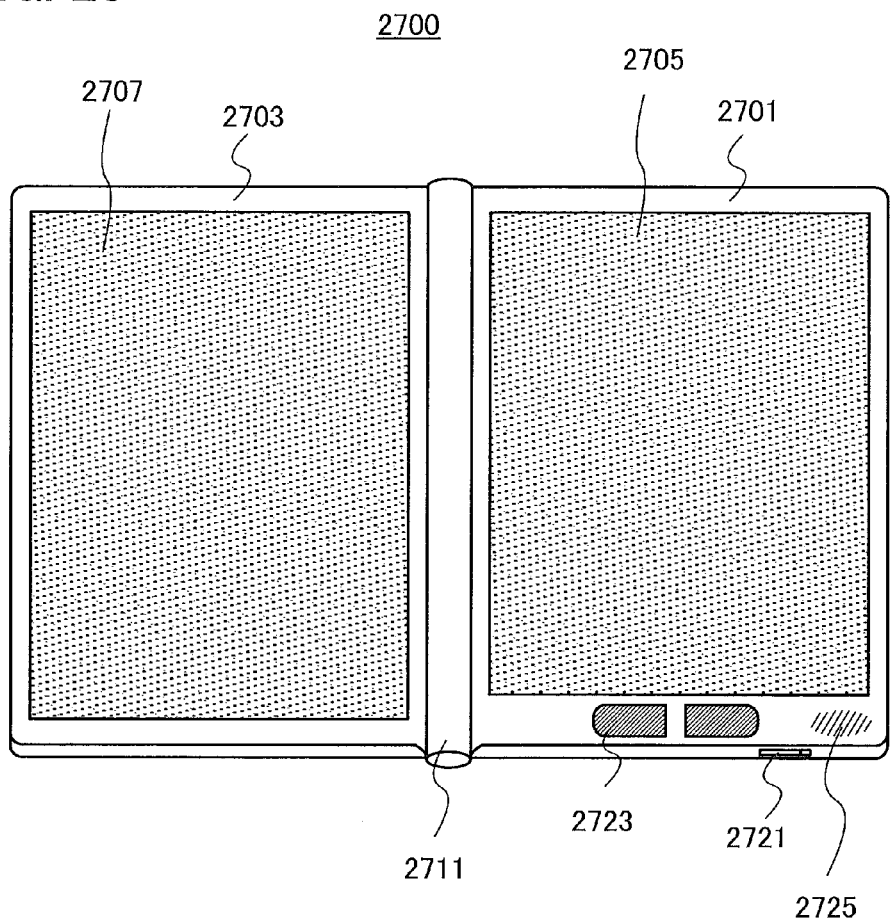
FIG. 28 illustrates an electronic device to which electronic paper in Embodiment 9 is applied.

The electronic paper can be used in electronic devices of various fields, which display information. For example, the electronic paper can be applied to e-book readers (electronic books), posters, advertisements on vehicles such as trains, or displays on a variety of cards such as credit cards. An example of such an electronic device will be illustrated in FIG. 28. FIG. 28 illustrates an example of an e-book reader 2700.

As illustrated in FIG. 28, the e-book reader 2700 has two housings 2701 and 2703. The housings 2701 and 2703 are united with an axis portion 2711, and the e-book reader 2700 can be opened and closed with the axis portion 2711 as an axis. With such a structure, the e-book reader 2700 can be operated like a paper book.

A display portion 2705 is incorporated into the housing 2701. A display portion 2707 is incorporated into the housing 2703. The display portions 2705 and 2707 may display one image or different images. When the display portions display different images, text can be displayed on the right display portion (the display portion 2705 in FIG. 28) and an image can be displayed on the left display portion (the display portion 2707 in FIG. 28), for example.

Further, FIG. 28 illustrates an example where the housing 2701 is provided with an operation portion and the like. For example, the housing 2701 is provided with a power supply switch 2721, operation keys 2723, a speaker 2725, and the like. Pages can be turned by the operation key 2723. Note that a keyboard, a pointing device, or the like may be provided on the same side as the display portion in the housing. Moreover, a terminal for external connection (e.g., an earphone terminal, a USB terminal, and a terminal capable of connecting a variety of cables such as an AC adapter and a USB cable), a portion for inserting recording media, or the like may be provided on a rear surface or a side surface of the housing. Furthermore, the e-book reader 2700 may functions as an electronic dictionary.

In addition, the e-book reader 2700 may wirelessly transmit and receive information. The e-book reader 2700 can have a structure where desired book data or the like is wirelessly purchased and downloaded from an e-book server.

(Embodiment 10)

In this embodiment, a system-on-panel display device will be described as one embodiment of the display device in Embodiment 6.

The logic circuit which is one embodiment of the invention disclosed in this specification can be applied to a system-on-panel display device in which a display portion and a driver circuit are provided over one substrate. A specific structure of the display device will be described below.

The display device in this embodiment includes a display element. As the display element, a liquid crystal element (also referred to as a liquid crystal display element) or a light-emitting element (also referred to as a light-emitting display element) can be used. A light-emitting element includes, in its category, an element whose luminance is controlled by current or voltage, and specifically an inorganic electroluminescent (EL) element, an organic EL element, and the like. Further, a display medium whose contrast is changed by an electric effect, such as electronic ink, can be used.

In addition, the display device in this embodiment includes, in its category, a panel in which a display element is sealed, and a module in which an IC and the like including a controller are mounted on the panel. Moreover, this embodiment relates to an element substrate before a display element is completed in a process of manufacturing the display device. The element substrate is provided with a means for supplying current to the display element in each of a plurality of pixels. Specifically, the element substrate may be in a state where only a pixel electrode of the display element is provided, a state after a conductive film to serve as a pixel electrode is formed and before the conductive film is etched to form the pixel electrode, or other states.

Note that a display device in this specification refers to an image display device, a display device, or a light source (including a lighting device). Further, the display device includes any of the following modules in its category: a module including a connector such as a flexible printed circuit (FPC), tape automated bonding (TAB) tape, or tape carrier package (TCP); a module including TAB tape or TCP which is provided with a printed wiring board at the end thereof; and a module including an integrated circuit (IC) which is directly mounted on a display element by a chip on glass (COG) method.

Next, the appearance and cross section of a liquid crystal display panel which is one embodiment of the display device in this embodiment will be described with reference to FIGS. 29A to 29C.

Figure 29A:
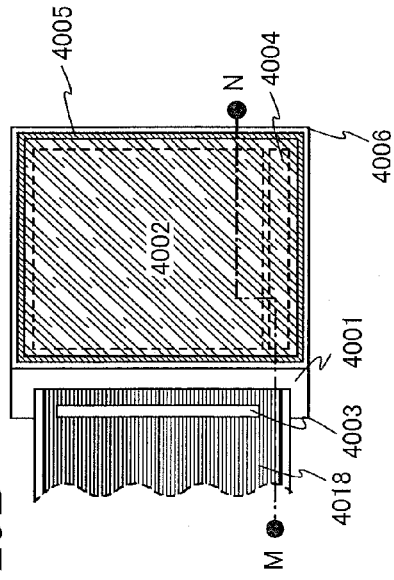
FIGS. 29A to 29C each illustrate a structure of a display device in Embodiment 10.
Figure 29B:
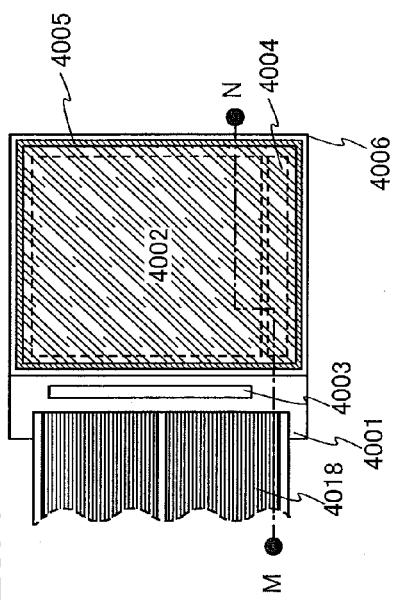

Each of FIGS. 29A and 29B is a top view of the display device in this embodiment, in which a liquid crystal element 4013 and TFTs 4010 and 4011 including the In—Ga—Zn—O-based non-single-crystal film shown in Embodiment 4, which is formed over a first substrate 4001, as a semiconductor layer are sealed between the first substrate 4001 and a second substrate 4006 with a sealing material 4005. FIG. 29C is a cross-sectional view along M-N in FIGS. 29A and 29B.

In the display panel in this embodiment, the sealing material 4005 is provided so as to surround a pixel portion 4002 and a scan line driver circuit 4004 which are provided over the first substrate 4001. The second substrate 4006 is provided over the pixel portion 4002 and the scan line driver circuit 4004. Accordingly, the pixel portion 4002 and the scan line driver circuit 4004 as well as a liquid crystal layer 4008 are sealed with the first substrate 4001, the sealing material 4005, and the second substrate 4006. Moreover, a signal line driver circuit 4003, which is formed using a single crystal semiconductor film or a polycrystalline semiconductor film over a substrate prepared separately, is provided in a region different from the region surrounded by the sealing material 4005 over the first substrate 4001.

Note that there is no particular limitation on a connection method of the driver circuit which is separately formed, and a COG method, a wire bonding method, a TAB method, or the like can be used. FIG. 29A illustrates an example where the signal line driver circuit 4003 is mounted by a COG method. FIG. 29B illustrates an example where the signal line driver circuit 4003 is mounted by a TAB method.

The pixel portion 4002 and the scan line driver circuit 4004, which are provided over the first substrate 4001, each include a plurality of TFTs. FIG. 29C illustrates the TFT 4010 included in the pixel portion 4002 and the TFT 4011 included in the scan line driver circuit 4004. Insulating layers 4020 and 4021 are provided over the TFTs 4010 and 4011.

As the TFTs 4010 and 4011, the highly reliable TFT shown in Embodiment 4, which includes the oxide semiconductor layer as a semiconductor layer, can be used. Alternatively, the TFT shown in Embodiment 5 may be used. In this embodiment, the TFTs 4010 and 4011 are n-channel TFTs.

A pixel electrode 4030 included in the liquid crystal element 4013 is electrically connected to the TFT 4010. A counter electrode 4031 of the liquid crystal element 4013 is formed on the second substrate 4006. The liquid crystal element 4013 corresponds to a region where the pixel electrode 4030, the counter electrode 4031, and the liquid crystal layer 4008 overlap with each other. The pixel electrode 4030 and the counter electrode 4031 are provided with insulating layers 4032 and 4033 functioning as alignment films, respectively, and sandwich the liquid crystal layer 4008 with the insulating layers 4032 and 4033 therebetween.

To the first substrate 4001 and the second substrate 4006, a material and a manufacturing method which can be applied to those of the substrate 210 in the above embodiments can be applied.

A spacer 4035 is a columnar partition obtained by selective etching of an insulating film, and is provided in order to control a distance (a cell gap) between the pixel electrode 4030 and the counter electrode 4031. Note that a spherical spacer may be used. Further, the counter electrode 4031 is electrically connected to a common potential line provided over the same substrate as the TFT 4010. The counter electrode 4031 and the common potential line can be electrically connected to each other through conductive particles arranged between the pair of substrates. Note that the conductive particles are included in the sealing material 4005.

Note that although this embodiment shows an example of a transmissive liquid crystal display device, the present invention can also be applied to a reflective liquid crystal display device or a transflective liquid crystal display device.

As the liquid crystal display device in this embodiment, an example is shown in which a polarizing plate is provided on the outer side of the substrate (on the viewer side) and a color layer and the electrode used for the display element are sequentially provided on the inner side; alternatively, a polarizing plate may be provided on the inner side of the substrate. Moreover, a layered structure of the polarizing plate and the color layer is not limited to that in this embodiment, and may be determined as appropriate depending on materials of the polarizing plate and the color layer or the conditions of the manufacturing process. Further, a light-blocking film functioning as a black matrix may be provided.

In this embodiment, in order to reduce surface unevenness of the TFT and improve the reliability of the TFT, the TFT is covered with an insulating layer (the insulating layers 4020 and 4021) functioning as a protective layer or a planarization insulating film. Note that the protective layer prevents penetration of contaminating impurities such as an organic matter, metal, or moisture included in the air, and thus is preferably dense. The protective layer may be formed by a sputtering method with a single layer or a stack of a silicon oxide film, a silicon nitride film, a silicon oxynitride film, a silicon nitride oxide film, an aluminum oxide film, an aluminum nitride film, an aluminum oxynitride film, or an aluminum nitride oxide film. The example where the protective layer is formed by a sputtering method is shown in this embodiment; however, one embodiment of the invention is not particularly limited thereto, and the protective layer may be formed by a variety of methods. Further, by using the non-reducible film, the protective layer can also function as a reduction prevention layer.

Here, the insulating layer 4020 with a layered structure is formed as the protective layer. In this case, as a first layer of the insulating layer 4020, a silicon oxide film is formed by a sputtering method. The use of the silicon oxide film as the protective layer is effective in preventing hillocks in an aluminum film used as a source electrode and a drain electrode.

Moreover, an insulating layer is formed as a second layer of the protective layer. Here, as the second layer of the insulating layer 4020, a silicon nitride film is formed by a sputtering method. The use of the silicon nitride film as the protective layer can prevent mobile ions such as sodium from entering the semiconductor region and changing electric characteristics of the TFT.

Further, after the protective layer is formed, annealing (250° C. to 400° C.) may be performed on the semiconductor layer.

Then, the insulating layer 4021 is formed as a planarization insulating film. An organic material having heat resistance, such as polyimide, acrylic, polyimideamide, benzocyclobutene, polyamide, or epoxy can be used for the insulating layer 4021. Other than such organic materials, it is also possible to use a low-dielectric constant material (a low-k material), a siloxane-based resin, phosphosilicate glass (PSG), borophosphosilicate glass (BPSG), or the like. Note that the insulating layer 4021 may be formed by stacking a plurality of insulating films formed of such materials.

Note that a siloxane-based resin is a resin formed from a siloxane-based material as a starting material and having a Si—O—Si bond. The siloxane-based resin may include an organic group (e.g., an alkyl group or an aryl group) or a fluoro group as a substituent. The organic group may include a fluoro group.

There is no particular limitation on the method of forming the insulating layer 4021, and the insulating layer 4021 can be formed by any of the following methods and means depending on its material: a sputtering method, an SOG method, spin coating, dip coating, spray coating, a droplet discharging method (e.g., an ink jet method, screen printing, or offset printing), a doctor knife, a roll coater, a curtain coater, a knife coater, and the like. When the insulating layer 4021 is formed using a material liquid, the semiconductor layer may be annealed (300° C. to 400° C.) in a step of baking the insulating layer 4021. The step of baking the insulating layer 4021 serves to anneal the semiconductor layer, whereby the display device can be efficiently manufactured.

The pixel electrode 4030 and the counter electrode 4031 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

Alternatively, the pixel electrode 4030 and the counter electrode 4031 can be formed using a conductive composition containing a conductive macromolecule (also referred to as a conductive polymer). The electrode formed using a conductive composition preferably has a sheet resistance of 10000 ohms/square or less and a light transmittance of 70% or more at a wavelength of 550 nm. Moreover, the resistivity of the conductive polymer contained in the conductive composition is preferably equal to or less than 0.1 Ω·cm.

As the conductive polymer, a so-called π-electron conjugated conductive polymer can be used. For example, polyaniline or a derivative thereof, polypyrrole or a derivative thereof, polythiophene or a derivative thereof, a copolymer of more than two kinds of these materials, and the like can be given.

Further, a variety of signals and potentials are supplied to the signal line driver circuit 4003, which is formed separately, the scan line driver circuit 4004, and the pixel portion 4002 from an FPC 4018.

In this embodiment, a connection terminal electrode 4015 is formed using the same conductive film as the pixel electrode 4030 included in the liquid crystal element 4013. A terminal electrode 4016 is formed using the same conductive film as the source electrodes and the drain electrodes of the TFTs 4010 and 4011.

The connection terminal electrode 4015 is electrically connected to a terminal of the FPC 4018 through an anisotropic conductive film 4019.

Figure 29C:
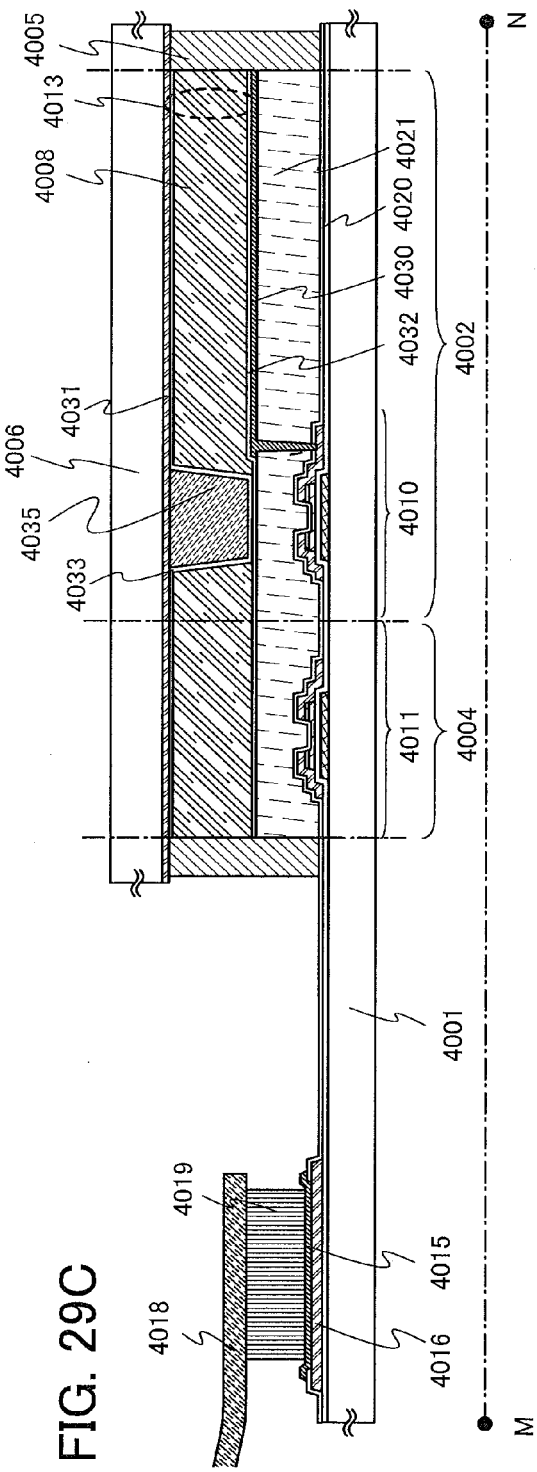

Note that FIGS. 29A to 29C illustrate the example in which the signal line driver circuit 4003 is separately formed and mounted on the first substrate 4001; however, this embodiment is not limited to this structure. The scan line driver circuit may be separately formed and then mounted, or only part of the signal line driver circuit or part of the scan line driver circuit may be separately formed and then mounted.

As described above, a system-on-panel display device can be formed. For the display device in this embodiment, the logic circuit in the above embodiments can be used in the driver circuit, for example, and the logic circuit can be formed in the same process as the TFT in the display portion.

Note that this embodiment can be combined with the structures disclosed in other embodiments as appropriate.
(Embodiment 11)

The display devices shown in Embodiments 6 to 10 can be applied to a variety of electronic devices (including amusement machines). Examples of electronic devices are television devices (also referred to as televisions or television receivers), monitors for computers and the like, cameras such as digital cameras and digital video cameras, digital photo frames, mobile phone devices (also referred to as mobile phones or cellular phones), portable game machines, portable information terminals, sound reproducing devices, and large game machines such as pachinko machines.

Figure 30A:
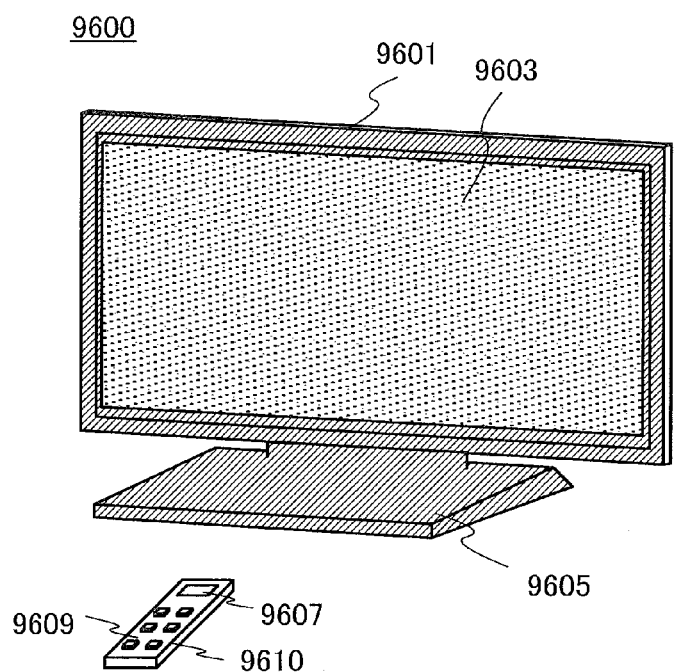
FIGS. 30A and 30B each illustrate an electronic device in Embodiment 11.

FIG. 30A illustrates an example of a television device 9600. In the television device 9600, a display portion 9603 is incorporated into a housing 9601. The display portion 9603 can display an image. Further, the housing 9601 is supported by a stand 9605 here.

The television device 9600 can be operated with an operation switch of the housing 9601 or a separate remote controller 9610. Channels and volume can be controlled with an operation key 9609 of the remote controller 9610 so that an image displayed on the display portion 9603 can be controlled. Further, the remote controller 9610 may be provided with a display portion 9607 for displaying data output from the remote controller 9610.

Note that the television device 9600 is provided with a receiver, a modem, and the like. With the receiver, general television broadcast can be received. Further, when the television device 9600 is connected to a communication network by wired or wireless connection via the modem, one-way (from a transmitter to a receiver) or two-way (between a transmitter and a receiver or between receivers) data communication can be performed.

Figure 30B:
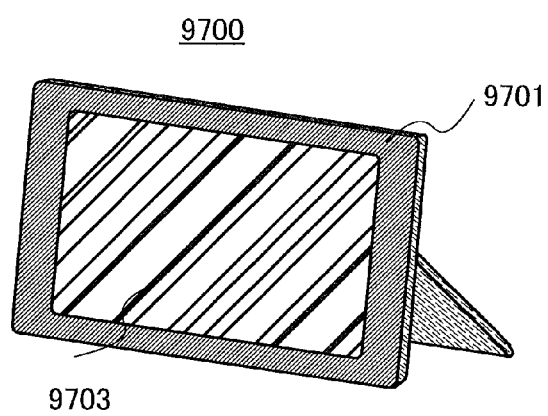

FIG. 30B illustrates an example of a digital photo frame 9700. For example, in the digital photo frame 9700, a display portion 9703 is incorporated into a housing 9701. The display portion 9703 can display a variety of images. For example, the display portion 9703 can display data of an image taken with a digital camera or the like and function as a normal photo frame.

Note that the digital photo frame 9700 is provided with an operation portion, an external connection portion (e.g., a USB terminal, or a terminal which can be connected to various cables such as a USB cable), a recording medium insertion portion, and the like. Although these components may be provided on the surface on which the display portion is provided, it is preferable to provide them on the side surface or the rear surface for the design of the digital photo frame 9700. For example, a memory storing data of an image taken with a digital camera is inserted in the recording medium insertion portion of the digital photo frame, and the image data can be transferred and then displayed on the display portion 9703.

Further, the digital photo frame 9700 may be configured to transmit and receive data wirelessly. The structure may be employed in which desired image data is transferred wirelessly to be displayed.

Figure 31A:
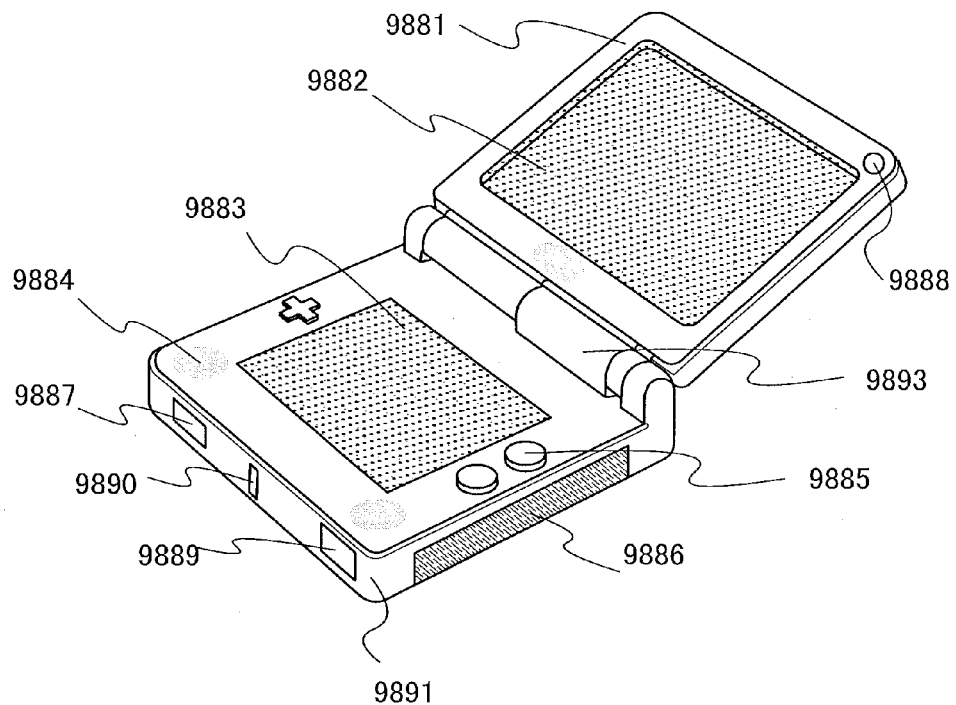
FIGS. 31A and 31B each illustrate an electronic device in Embodiment 11.

FIG. 31A is a portable game machine and includes two housings of a housing 9881 and a housing 9891, which are connected with a joint portion 9893 so that the portable game machine can be opened and folded. A display portion 9882 is incorporated into the housing 9881, and a display portion 9883 is incorporated into the housing 9891. Moreover, the portable game machine illustrated in FIG. 31A is provided with a speaker portion 9884, a recording medium insertion portion 9886, an LED lamp 9890, input means (operation keys 9885, a connection terminal 9887, a sensor 9888 (having a function of measuring force, displacement, position, speed, acceleration, angular velocity, rotation number, distance, light, liquid, magnetism, temperature, chemical substance, sound, time, hardness, electric field, current, voltage, electric power, radial ray, flow rate, humidity, gradient, vibration, odor, or infrared ray), and a microphone 9889), and the like. It is needless to say that the structure of the portable game machine is not limited to that described above. The portable game machine may have a structure in which additional accessory equipment is provided as appropriate as long as at least a display device is provided. The portable game machine in FIG. 31A has a function of reading a program or data stored in a recording medium to display it on the display portion, and a function of sharing information with another portable game machine by wireless communication. Note that a function of the portable game machine in FIG. 31A is not limited to those described above, and the portable game machine can have a variety of functions.

Figure 31B:
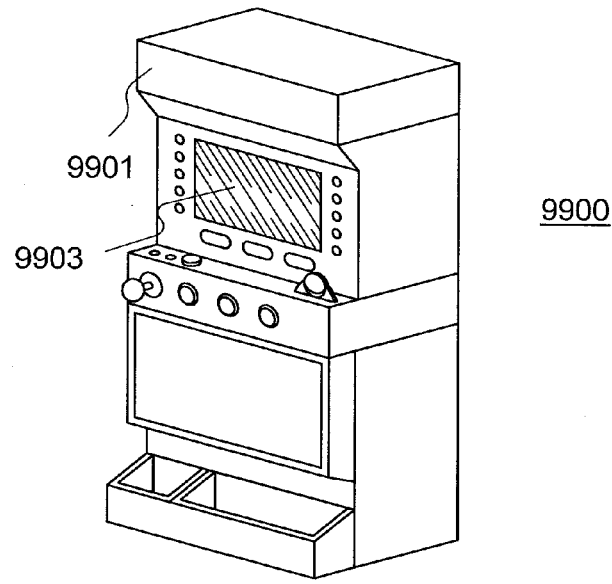

FIG. 31B illustrates an example of a slot machine 9900, which is a large amusement machine. In the slot machine 9900, a display portion 9903 is incorporated into a housing 9901. Moreover, the slot machine 9900 is provided with operation means such as a start lever and a stop switch, a coin slot, a speaker, and the like. Needless to say, the structure of the slot machine 9900 is not limited to the above structure. The slot machine may have a structure in which additional accessory equipment is provided as appropriate as long as at least the display device according to the present invention is provided.

Figure 32A:
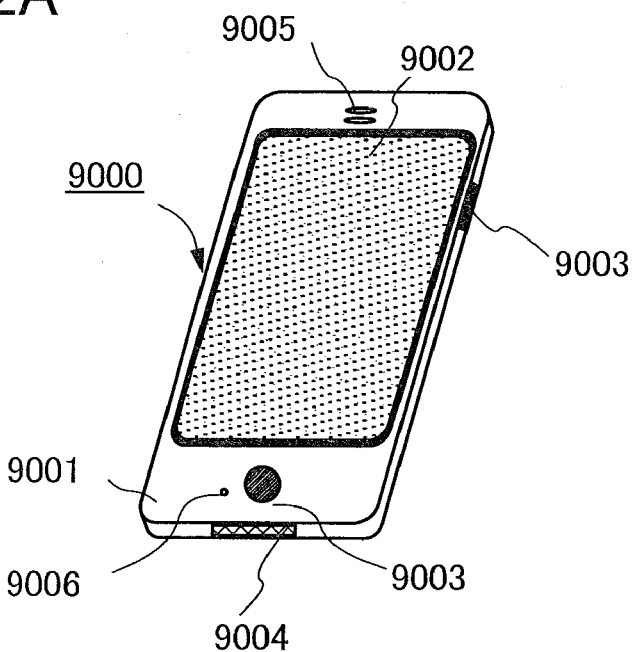
FIGS. 32A and 32B each illustrate an electronic device in Embodiment 11.

FIG. 32A illustrates an example of a mobile phone 9000. The mobile phone 9000 is provided with a display portion 9002 incorporated into a housing 9001, an operation button 9003, an external connection port 9004, a speaker 9005, a microphone 9006, and the like.

When the display portion 9002 of the mobile phone 9000 illustrated in FIG. 32A is touched with a finger or the like, data can be input into the mobile phone 9000. Further, operation such as making calls and texting can be performed by touching the display portion 9002 with a finger or the like.

There are mainly three screen modes of the display portion 9002. The first mode is a display mode mainly for displaying an image. The second mode is an input mode mainly for inputting data such as text. The third mode is a display-and-input mode, which is a combination of the two modes, that is, a combination of the display mode and the input mode.

For example, in the case of making a call or texting, a text input mode mainly for inputting text is selected for the display portion 9002 so that characters displayed on a screen can be input. In that case, it is preferable to display a keyboard or number buttons on almost all area of the screen of the display portion 9002.

When a detection device including a sensor for detecting inclination, such as a gyroscope or an acceleration sensor, is provided inside the mobile phone 9000, display on the screen of the display portion 9002 can be automatically changed by determining the orientation of the mobile phone 9000 (whether the mobile phone 9000 stands upright or is laid down on its side).

The screen modes are changed by touching the display portion 9002 or using the operation buttons 9003 of the housing 9001. Alternatively, the screen modes may be changed depending on the kind of the image displayed on the display portion 9002. For example, when a signal of an image displayed on the display portion is data of moving images, the screen mode is changed to the display mode. When the signal is text data, the screen mode is changed to the input mode.

Further, in the input mode, when input by touching the display portion 9002 is not performed for a certain period while a signal detected by an optical sensor in the display portion 9002 is detected, the screen mode may be controlled so as to be changed from the input mode to the display mode.

The display portion 9002 can also function as an image sensor. For example, an image of a palm print, a fingerprint, or the like is taken when the display portion 9002 is touched with a palm or a finger, whereby personal identification can be performed. Further, when a backlight or a sensing light source which emits near-infrared light is provided in the display portion, an image of a finger vein, a palm vein, or the like can be taken.

Figure 32B:
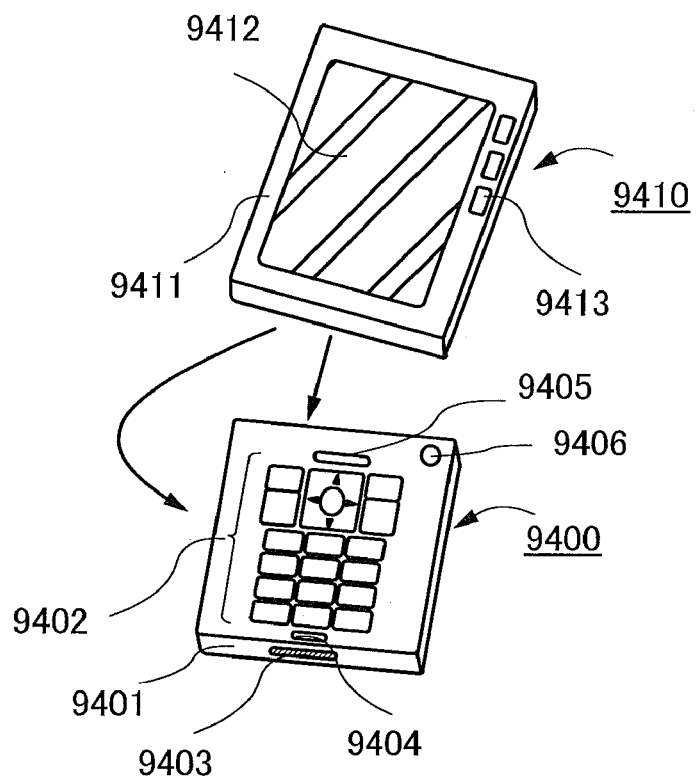

FIG. 32B illustrates another example of a mobile phone. The mobile phone in FIG. 32B includes a display device 9410 in a housing 9411, which includes a display portion 9412 and operation buttons 9413; and a communication device 9400 in a housing 9401, which includes scan buttons 9402, an external input terminal 9403, a microphone 9404, a speaker 9405, and a light-emitting portion 9406 that emits light when receiving a call. The display device 9410 having a display function can be detached from and attached to the communication device 9400 having a telephone function in two directions shown by arrows. Accordingly, short axes of the display device 9410 and the communication device 9400 can be attached to each other, or long axes of the display device 9410 and the communication device 9400 can be attached to each other. Further, when only a display function is necessary, the display device 9410 may be detached from the communication device 9400 so that the semiconductor device 9410 can be used by itself. The communication device 9400 and the display device 9410 can transmit and receive images or input information to/from each other by wireless communication or wired communication, and each of the communication device 9400 and the display device 9410 has a rechargeable battery.

Note that this embodiment can be combined with the structures disclosed in other embodiments as appropriate.

EXAMPLE 1

In this example, an enhancement thin film transistor using an oxide semiconductor will be described, in which oxygen plasma treatment is performed as an example of oxygen vacancy control processing in order to shift the threshold voltage.

Figure 33A:
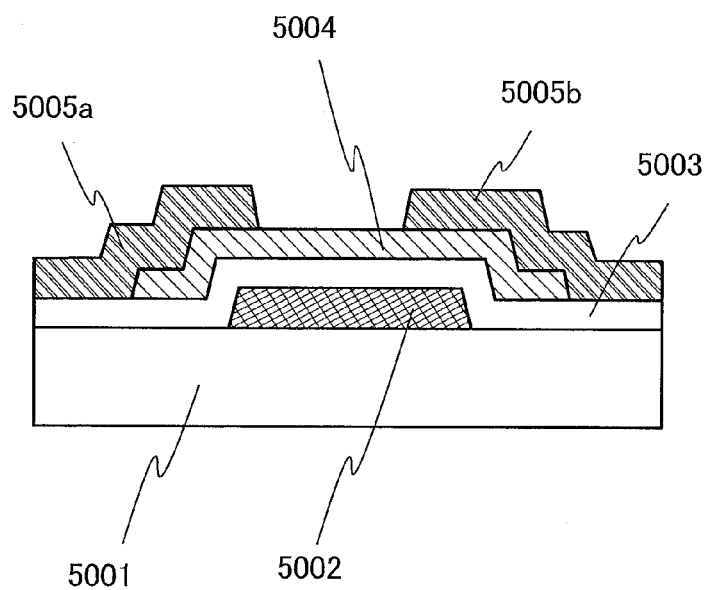
FIGS. 33A and 33B each illustrate a thin film transistor in Example 1.

FIG. 33A illustrates a structure of a thin film transistor in this example.

The thin film transistor illustrated in FIG. 33A includes a gate electrode 5002 over a substrate 5001, a gate insulating layer 5003 over the gate electrode 5002, an oxide semiconductor layer 5004 over the gate insulating layer 5003, and electrodes 5005a and 5005b to serve as a source electrode and a drain electrode.

In this example, a 100-nm-thick tungsten film was formed as the gate electrode 5002; a 100-nm-thick SiON film as the gate insulating layer 5003; a 50-nm-thick In—Ga—Zn—O-based non-single-crystal film as the oxide semiconductor layer 5004; and a 100-nm-thick titanium film as the electrodes 5005a and 5005b.

Further, in this example, the threshold voltage of the thin film transistor is shifted by performing oxygen plasma treatment on a surface of a channel portion. The oxygen plasma treatment at this time was performed under the following conditions: the pressure in the chamber was 0.4 P, the flow rate of an argon gas and oxygen was 10 sccm and 15 sccm respectively, and the RF power was 500 W so that oxygen was made into plasma. In this example, the plasma treatment was performed for 5 minutes.

Figure 33B:
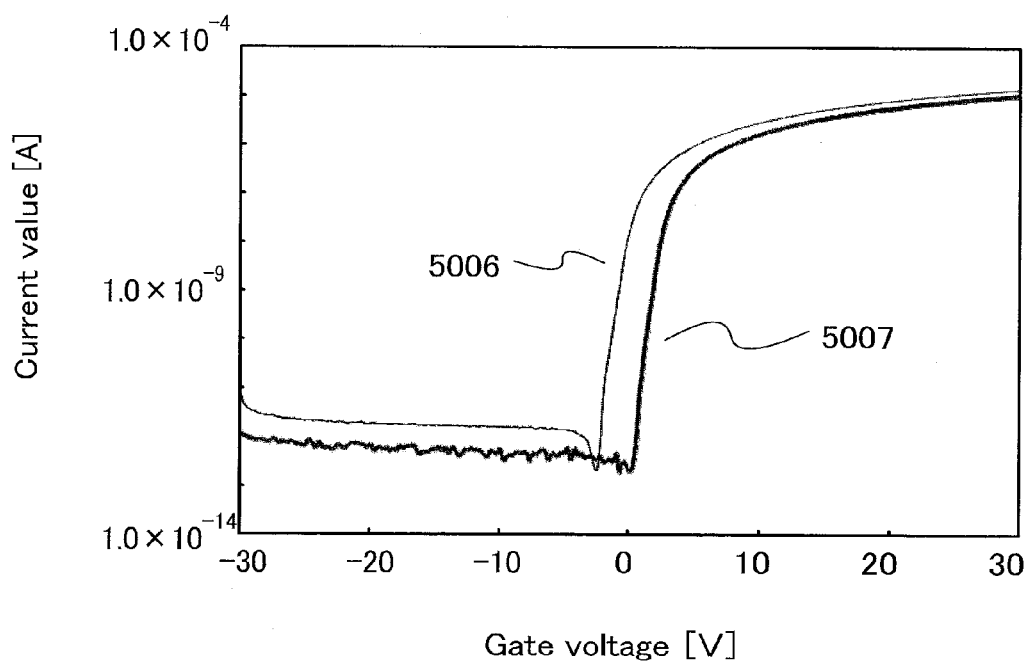

FIG. 33B shows the result of measuring ID-VG of the transistor in this example before and after the oxygen plasma treatment.

As illustrated in FIG. 33B, the transistor before the oxygen plasma treatment has a negative threshold voltage and is normally on as shown by a curve 5006, whereas the transistor after the oxygen plasma treatment has a positive threshold voltage and is normally off as shown by a curve 5007. Accordingly, when oxygen plasma treatment is performed on a thin film transistor including an oxide semiconductor, the threshold voltage of the transistor is shifted to a positive value and the transistor serves as an enhancement transistor.

This application is based on Japanese Patent Application serial no. 2008-281647 filed with Japan Patent Office on Oct. 31, 2008, the entire contents of which are hereby incorporated by reference.

What is claimed is:

1. A logic circuit comprising:
   a first transistor comprising a first gate electrode, a first source electrode, and a first drain electrode;

a second transistor comprising a second gate electrode, a second source electrode, and a second drain electrode;
a first terminal electrically connected to the second gate electrode of the second transistor; and
a second terminal electrically connected to a portion where the second transistor is connected to the first transistor,
wherein a high power supply voltage terminal is electrically connected to one of the first source electrode and the first drain electrode of the first transistor, and the first gate electrode of the first transistor is electrically connected to the other of the first source electrode and the first drain electrode of the first transistor;
wherein one of the second source electrode and the second drain electrode of the second transistor is electrically connected to the other of the first source electrode and the first drain electrode of the first transistor, and a low power supply voltage terminal is electrically connected to the other of the second source electrode and the second drain electrode of the second transistor,
wherein the first transistor comprises:
the first gate electrode;
a gate insulating layer provided over the first gate electrode;
a first oxide semiconductor layer provided over the gate insulating layer;
the first source electrode which is electrically connected to the first oxide semiconductor layer; and
the first drain electrode which is electrically connected to the first oxide semiconductor layer,
wherein a reduction prevention layer does not overlap the first oxide semiconductor layer, the first source electrode, and the first drain electrode,
wherein the second transistor comprises:
the second gate electrode;
the gate insulating layer provided over the second gate electrode;
a second oxide semiconductor layer provided over the gate insulating layer;
the second source electrode which is electrically connected to the second oxide semiconductor layer; and
the second drain electrode which is electrically connected to the second oxide semiconductor layer,
wherein the reduction prevention layer overlaps the second oxide semiconductor layer, the second source electrode, and the second drain electrode.

2. The logic circuit according to claim 1, wherein the second transistor includes an oxygen vacancy control region between the second source electrode and the second drain electrode over a surface of the first oxide semiconductor layer, which is opposite to a surface in contact with the gate insulating layer.

3. The logic circuit according to claim 1, wherein the first transistor and the second transistor have the same conductivity type.

4. The logic circuit according to claim 1, wherein one of the second source electrode and the second drain electrode of the second transistor is in contact with the first gate electrode of the first transistor through an opening portion provided in the gate insulating layer.

5. The logic circuit according to claim 1,
wherein the first transistor does not include the reduction prevention layer over the first oxide semiconductor layer, the first source electrode, and the first drain electrode.

6. The logic circuit according to claim 1,
wherein the reduction prevention layer comprises one selected from the group of silicon oxide and aluminum oxide.

7. The logic circuit according to claim 1,
wherein the first transistor is a depletion transistor and the second transistor is an enhancement transistor.

8. The logic circuit according to claim 1,
wherein each of the first transistor and the second transistor further comprises a source region and a drain region in contact with part of the first oxide semiconductor layer, wherein the source region and the drain region are third oxide semiconductor layers.

9. The logic circuit according to claim 8,
wherein the third oxide semiconductor layers contain indium, gallium, and zinc.

10. A logic circuit comprising:
a first transistor comprising a first gate electrode, a first source electrode, and a first drain electrode;
a second transistor comprising a second gate electrode, a second source electrode, and a second drain electrode;
a first terminal electrically connected to the second gate electrode of the second transistor; and
a second terminal electrically connected to a portion where the second transistor is connected to the first transistor,
wherein a high power supply voltage terminal is electrically connected to one of the first source electrode and the first drain electrode of the first transistor, and the first gate electrode of the first transistor is electrically connected to the other of the first source electrode and the first drain electrode of the first transistor;
wherein one of the second source electrode and the second drain electrode of the second transistor is electrically connected to the other of the first source electrode and the first drain electrode of the first transistor, and a low power supply voltage terminal is electrically connected to the other of the second source electrode and the second drain electrode of the second transistor,
wherein the first transistor comprises:
the first gate electrode
a gate insulating layer provided over the first gate electrode;
a first oxide semiconductor layer provided over the gate insulating layer;
the first source electrode which is electrically connected to the first oxide semiconductor layer; and
the first drain electrode which is electrically connected to the first oxide semiconductor layer,
wherein a reduction prevention layer does not overlap the first oxide semiconductor layer, the first source electrode, and the first drain electrode,
wherein the second transistor comprises:
the second gate electrode;
the gate insulating layer provided over the second gate electrode;
a second oxide semiconductor layer provided over the gate insulating layer;
the second source electrode which is electrically connected to the second oxide semiconductor layer; and
the second drain electrode which is electrically connected to the second oxide semiconductor layer,
wherein the reduction prevention layer overlaps the second oxide semiconductor layer, the second source electrode, and the second drain electrode,
wherein at least one of the first oxide semiconductor layer and the second oxide semiconductor layer contains indium, gallium, and zinc.

11. A logic circuit comprising:
a first transistor comprising a first gate electrode, a first source electrode, and a first drain electrode, wherein a first clock signal is input to the first gate electrode of the first transistor, and an input signal is input to the one of the first source electrode and the first drain electrode of the first transistor;
a first inverter comprising an input terminal and an output terminal, the input terminal of the first inverter electrically connected to the other of the first source electrode and the first drain electrode of the first transistor;
a second inverter comprising an input terminal and an output terminal, the input terminal of the second inverter electrically connected to the output terminal of the first inverter;
a third inverter comprising an input terminal electrically connected to the output terminal of the first inverter, and an output terminal outputting an output signal; and
a second transistor comprising a second gate electrode, a second source electrode, and a second drain electrode, wherein a second clock signal is input to the second gate electrode of the second transistor, one of the second source electrode and the second drain electrode of the second transistor is electrically connected to the other of the first source electrode and the first drain electrode of the first transistor, and the other of the second source electrode and the second drain electrode of the second transistor is electrically connected to the output terminal of the second inverter,
wherein each of the first inverter and the second inverter comprises:
  a third transistor comprising a third gate electrode, a third source electrode, and a third drain electrode,
  a fourth transistor comprising a fourth gate electrode, a fourth source electrode, and a fourth drain electrode,
  a first terminal electrically connected to the fourth gate electrode of the fourth transistor; and
  a second terminal electrically connected to a portion where the fourth transistor is connected to the third transistor,
wherein a high power supply voltage terminal is electrically connected to one of the third source electrode and the third drain electrode of the third transistor, and the third gate electrode of the third transistor is electrically connected to the other of the third source electrode and the third drain electrode of the third transistor;
wherein one of the fourth source electrode and the fourth drain electrode of the fourth transistor is electrically connected to the other of the third source electrode and the third drain electrode of the third transistor, and a low power supply voltage terminal is electrically connected to the other of the fourth source electrode and the fourth drain electrode of the fourth transistor,
wherein the third transistor comprises:
  the third gate electrode;
  a gate insulating layer provided over the third gate electrode;
  a first oxide semiconductor layer provided over the gate insulating layer;
  the third source electrode which is electrically connected to the first oxide semiconductor layer; and
  the third drain electrode which is electrically connected to the first oxide semiconductor layer,
wherein a reduction prevention layer does not overlap the first oxide semiconductor layer, the third source electrode, and the third drain electrode, wherein the fourth transistor comprises:
  the fourth gate electrode;
  the gate insulating layer provided over the fourth gate electrode;
  a second oxide semiconductor layer provided over the gate insulating layer;
  the fourth source electrode which is electrically connected to the first oxide semiconductor layer; and
  the fourth drain electrode which is electrically connected to the first oxide semiconductor layer,
wherein the reduction prevention layer overlaps the second oxide semiconductor layer, the fourth source electrode, and the fourth drain electrode.

12. The logic circuit according to claim 11, wherein the fourth transistor comprises an oxygen vacancy control region between the fourth source electrode and the fourth drain electrode over a surface of the first oxide semiconductor layer, which is opposite to a surface in contact with the gate insulating layer.

13. The logic circuit according to claim 11, wherein at least one of the first oxide semiconductor layer and the second oxide semiconductor layer contains indium, gallium, and zinc.

14. The logic circuit according to claim 11, wherein the third transistor and the fourth transistor have the same conductivity type.

15. The logic circuit according to claim 11, wherein one of the fourth source electrode and the fourth drain electrode of the fourth transistor is in contact with the third gate electrode of the third transistor through an opening portion provided in the gate insulating layer.

16. The logic circuit according to claim 11,
wherein the third transistor does not include the reduction prevention layer over the first oxide semiconductor layer, the third source electrode, and the third drain electrode.

17. The logic circuit according to claim 11,
wherein the reduction prevention layer comprises one selected from the group of silicon oxide and aluminum oxide.

18. The logic circuit according to claim 11,
wherein the third transistor is a depletion transistor and the fourth transistor is an enhancement transistor.

19. The logic circuit according to claim 11,
wherein each of the third transistor and the fourth transistor further comprises a source region and a drain region in contact with part of the first oxide semiconductor layer, wherein the source region and the drain region are third oxide semiconductor layers.

20. The logic circuit according to claim 19,
wherein the third oxide semiconductor layers contain indium, gallium, and zinc.

21. A logic circuit comprising:
a first transistor comprising a first gate electrode, a first source electrode, and a first drain electrode,
a second transistor comprising a second gate electrode, a second source electrode, and a second drain electrode,
a first terminal electrically connected to the first gate electrode of the second transistor;
a second terminal electrically connected to a portion where the second transistor is connected to the first transistor,
wherein a high power supply voltage terminal is electrically connected to one of the first source electrode and the first drain electrode of the first transistor, and the first gate electrode of the first transistor is electrically connected to the other of the first source electrode and the first drain electrode of the first transistor;

wherein one of the second source electrode and the second drain electrode of the second transistor is electrically connected to the other of the first source electrode and the first drain electrode of the first transistor, and a low power supply voltage terminal is electrically connected to the other of the second source electrode and the second drain electrode of the second transistor, wherein the first transistor comprises:
   the first gate electrode;
   a gate insulating layer provided over the first gate electrode;
   a first oxide semiconductor layer provided over the gate insulating layer; and
   the first source electrode and the first drain electrode in contact with part of the first oxide semiconductor layer, wherein a reduction prevention layer does not overlap the first oxide semiconductor layer, the first source electrode, and the first drain electrode, wherein the second transistor comprises:
   the second gate electrode;
   the gate insulating layer provided over the second gate electrode;
   a second oxide semiconductor layer provided over the gate insulating layer; and
   the second source electrode and the second drain electrode in contact with part of the second oxide semiconductor layer, wherein the reduction prevention layer overlaps the second oxide semiconductor layer, the second source electrode, and the second drain electrode.

22. The logic circuit according to claim 21, wherein the second transistor comprises an oxygen vacancy control region between the second source electrode and the second drain electrode over a surface of the second oxide semiconductor layer, which is opposite to a surface in contact with the gate insulating layer.

23. The logic circuit according to claim 21, wherein the first transistor and the second transistor have the same conductivity type.

24. The logic circuit according to claim 21, wherein one of the second source electrode and the second drain electrode of the second transistor is in contact with the first gate electrode of the first transistor through an opening portion provided in the gate insulating layer.

25. The logic circuit according to claim 21,
wherein the first transistor does not include a reduction prevention layer over the first oxide semiconductor layer, the first source electrode, and the first drain electrode.

26. The logic circuit according to claim 21,
wherein the reduction prevention layer comprises one selected from the group of silicon oxide and aluminum oxide.

27. The logic circuit according to claim 21,
wherein the first transistor is a depletion transistor and the second transistor is an enhancement transistor.

28. A logic circuit comprising:
a first transistor comprising a first gate electrode, a first source electrode, and a first drain electrode, wherein a first clock signal is input to the first gate electrode of the first transistor, and an input signal is input to the one of the first source electrode and the first drain electrode of the first transistor;
a first inverter comprising an input terminal and an output terminal, the input terminal of the first inverter electrically connected to the other of the first source electrode and the first drain electrode of the first transistor;
a second inverter comprising an input terminal and an output terminal, the input terminal of the second inverter electrically connected to the output terminal of the first inverter;
a third inverter comprising an input terminal electrically connected to the output terminal of the first inverter, and an output terminal outputting an output signal; and
a second transistor comprising a second gate electrode, a second source electrode, and a second drain electrode, wherein a second clock signal is input to the second gate electrode of the second transistor, one of the second source electrode and the second drain electrode of the second transistor is electrically connected to the other of the first source electrode and the first drain electrode of the first transistor, and the other of the second source electrode and the second drain electrode of the second transistor is electrically connected to the output terminal of the second inverter, wherein each of the first inverter and the second inverter comprises:
   a third transistor comprising a third gate electrode, a third source electrode, and a third drain electrode,
   a fourth transistor comprising a fourth gate electrode, a fourth source electrode, and a fourth drain electrode,
   a first terminal electrically connected to the fourth gate electrode of the fourth transistor; and
   a second terminal electrically connected to a portion where the fourth transistor is connected to the third transistor, wherein a high power supply voltage terminal is electrically connected to one of the third source electrode and the third drain electrode of the third transistor, and the third gate electrode of the third transistor is electrically connected to the other of the third source electrode and the third drain electrode of the third transistor;

wherein one of the fourth source electrode and the fourth drain electrode of the fourth transistor is electrically connected to the other of the third source electrode and the third drain electrode of the third transistor, and a low power supply voltage terminal is electrically connected to the other of the fourth source electrode and the fourth drain electrode of the fourth transistor;

wherein the third transistor comprises:
   the third gate electrode;
   a gate insulating layer provided over the third gate electrode;
   a first oxide semiconductor layer provided over the gate insulating layer; and
   the third source electrode and the third drain electrode in contact with part of the first oxide semiconductor layer, wherein a reduction prevention layer does not overlap the first oxide semiconductor layer, the third source electrode, and the third drain electrode, wherein the fourth transistor comprises:
   the fourth gate electrode;
   the gate insulating layer provided over the fourth gate electrode;
   a second oxide semiconductor layer provided over the gate insulating layer;
   the fourth source electrode and the fourth drain electrode in contact with part of the second oxide semiconductor layer, wherein the reduction prevention layer overlaps the second oxide semiconductor layer, the fourth source electrode, and the fourth drain electrode.

29. The logic circuit according to claim 28, wherein the reduction prevention layer comprises one selected from the group of silicon oxide and aluminum oxide.

30. The logic circuit according to claim 28, wherein the third transistor is a depletion transistor and the fourth transistor is an enhancement transistor.

31. A logic circuit comprising:
a first transistor comprising a first gate electrode, a first source electrode, and a first drain electrode,
a second transistor comprising a second gate electrode, a second source electrode, and a second drain electrode,
a first terminal electrically connected to the second gate electrode of the second transistor;
a second terminal electrically connected to a portion where the second transistor is connected to the first transistor,
wherein a high power supply voltage terminal is electrically connected to one of the first source electrode and the first drain electrode of the first transistor, and the first gate electrode of the first transistor is electrically connected to the other of the first source electrode and the first drain electrode of the first transistor;
wherein one of the second source electrode and the second drain electrode of the second transistor is electrically connected to the other of the first source electrode and the first drain electrode of the first transistor, and a low power supply voltage terminal is electrically connected to the other of the second source electrode and the second drain electrode of the second transistor,
wherein the first transistor comprises:
the first gate electrode;
a gate insulating layer provided over the first gate electrode;
a first oxide semiconductor layer provided over the gate insulating layer; and
the first source electrode and the first drain electrode in contact with part of the first oxide semiconductor layer,
wherein a reduction prevention layer does not overlap the first oxide semiconductor layer, the first source electrode, and the first drain electrode,
wherein the second transistor comprises:
the second gate electrode;
the gate insulating layer provided over the second gate electrode;
a second oxide semiconductor layer provided over the gate insulating layer; and
the second source electrode and the second drain electrode in contact with part of the second oxide semiconductor layer,
wherein the reduction prevention layer overlaps the second oxide semiconductor layer, the second source electrode, and the second drain electrode,
wherein at least one of the first oxide semiconductor layer and the second oxide semiconductor layer contains indium, gallium, and zinc.

32. The logic circuit according to claim 28, wherein the third transistor does not include the reduction prevention layer over the first oxide semiconductor layer, the third source electrode, and the third drain electrode.

33. The logic circuit according to claim 28, wherein the fourth transistor comprises an oxygen vacancy control region between the fourth source electrode and the fourth drain electrode over a surface of the second oxide semiconductor layer, which is opposite to a surface in contact with the gate insulating layer.

34. The logic circuit according to claim 28, wherein at least one of the first oxide semiconductor layer and the second oxide semiconductor layer contains indium, gallium, and zinc.

35. The logic circuit according to claim 28, wherein the third transistor and the fourth transistor have the same conductivity type.

36. The logic circuit according to claim 28, wherein one of the fourth source electrode and the fourth drain electrode of the fourth transistor is in contact with the third gate electrode of the third transistor through an opening portion provided in the gate insulating layer.

* * * * *

UNITED STATES PATENT AND TRADEMARK OFFICE
CERTIFICATE OF CORRECTION

PATENT NO. : 8,373,443 B2
APPLICATION NO. : 13/116372
DATED : February 12, 2013
INVENTOR(S) : Jun Koyama et al.

It is certified that error appears in the above-identified patent and that said Letters Patent is hereby corrected as shown below:

In the Specification

At column 4, line 13, "$InMO_3(ZnO)$," should be -- $InMO_3(ZnO)_m$ --;

At column 35, line 8, "μM," should be -- μm, --.

Signed and Sealed this
Twenty-ninth Day of October, 2013

Teresa Stanek Rea
*Deputy Director of the United States Patent and Trademark Office*